United States Patent
Ishikawa et al.

(10) Patent No.: US 8,492,230 B2
(45) Date of Patent: Jul. 23, 2013

(54) SEMICONDUCTOR DEVICE AND METHOD OF MANUFACTURING THE SAME

(75) Inventors: Kozo Ishikawa, Itami (JP); Masaaki Shinohara, Kanagawa (JP); Toshiaki Iwamatsu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 392 days.

(21) Appl. No.: 12/872,900

(22) Filed: Aug. 31, 2010

(65) Prior Publication Data
US 2011/0049629 A1 Mar. 3, 2011

(30) Foreign Application Priority Data
Sep. 1, 2009 (JP) .................. 2009-201594

(51) Int. Cl.
*H01L 21/84* (2006.01)
*H01L 29/78* (2006.01)

(52) U.S. Cl.
USPC ........... 438/283; 438/157; 438/595; 257/365; 257/E29.264

(58) Field of Classification Search
USPC .................. 257/401, 365; 438/164, 157, 595
See application file for complete search history.

(56) References Cited

U.S. PATENT DOCUMENTS

| | | | |
|---|---|---|---|
| 7,214,576 B1 * | 5/2007 | Kaneko et al. ................ | 438/197 |
| 7,456,055 B2 * | 11/2008 | Orlowski et al. ............. | 438/157 |
| 2005/0199948 A1 * | 9/2005 | Lee et al. ...................... | 257/327 |
| 2005/0202618 A1 * | 9/2005 | Yagishita ...................... | 438/197 |
| 2007/0057325 A1 * | 3/2007 | Hsu et al. ...................... | 257/347 |
| 2007/0111454 A1 * | 5/2007 | Yeo et al. ...................... | 438/283 |
| 2008/0001171 A1 | 1/2008 | Tezuka et al. | |

FOREIGN PATENT DOCUMENTS
JP 63-182866 7/1988
JP 2008-010790 1/2008

* cited by examiner

*Primary Examiner* — Calvin Lee
*Assistant Examiner* — Scott Stowe
(74) *Attorney, Agent, or Firm* — McDermott Will & Emery LLP

(57) ABSTRACT

To provide a technique capable of achieving improvement of the parasitic resistance in FINFETs. In the FINFET in the present invention, a sidewall is formed of a laminated film. Specifically, the sidewall is composed of a first silicon oxide film, a silicon nitride film formed over the first silicon oxide film, and a second silicon oxide film formed over the silicon nitride film. The sidewall is not formed on the side wall of a fin. Thus, in the present invention, the sidewall is formed on the side wall of a gate electrode and the sidewall is not formed on the side wall of the fin.

21 Claims, 35 Drawing Sheets

SEMICONDUCTOR DEVICE AND METHOD OF MANUFACTURING THE SAME

CROSS-REFERENCE TO RELATED APPLICATION

The disclosure of Japanese Patent Application No. 2009-201594 filed on Sep. 1, 2009 including the specification, drawings and abstract is incorporated herein by reference in its entirety.

BACKGROUND OF THE INVENTION

The present invention relates to a semiconductor device and a technique of manufacturing the same, particularly to a technique that is effective when applied to a semiconductor device including a FINFET (FIN Field Effect Transistor) and a technique of manufacturing the same.

Japanese Patent Laid-Open No. 2008-10790 (Patent Document 1) describes a technique that relates to FINFETs. In particular, a sidewall is formed on the side wall of a gate electrode constituting the FINFET, and the sidewall is also formed on the side wall of the fin. The document explains that the sidewall is formed of a laminated film of silicon oxide film/silicon nitride film/silicon oxide film.

Japanese Patent Laid-Open No. 1988-182866 (Patent Document 2) describes a technique for forming a sidewall formed of silicon oxide film/silicon nitride film/silicon oxide film on the side wall of a gate electrode.

SUMMARY OF THE INVENTION

In these years, in LSI (Large Scale Integration) using silicon, the dimension of a MISFET (Metal Insulator Semiconductor Field Effect Transistor) being a constituent element thereof, particularly the gate length of a gate electrode decreases steadily. The miniaturization of the MISFET has been advanced in a style conforming to the scaling law, but, with respective progresses of the device generation, various problems have appeared, and it becomes difficult to satisfy both the suppression of the short channel effect and the securement of a high-current driving capability of the MISFET. Consequently, research and development for new structure devices, which may replace the conventional planar type MISFET, are actively carried out.

The FINFET is one of the aforementioned new structure devices, and is a three dimensional structure MISFET differing from the planar type MISFET. Recently, the FINFET attracts attention as an important candidate of devices.

The FINFET has a fin formed by processing a semiconductor layer. The fin is a region in a thin strip shape (a rectangular parallelepiped shape), and both side surface portions of the fin are used as the channel of the FINFET. In addition, the gate electrode of the FINFET is formed over both side surface portions of the fin so as to cross over the fin, which has a so-called double gate structure. The FINFET having such a structure gives better potential controllability for the channel region by the gate electrode as compared with conventional MISFETs having a single gate structure. Accordingly, the FINFET has such advantages as high punch-through resistance and the capability of suppressing the short channel effect up to a smaller gate length. Moreover, since the FINFET uses both side surface portions of the fin as the channel, it is possible to set the area of a channel region for flowing a current to be large, and to obtain a high-current driving capability. That is, the FINFET is expected to be capable of satisfying both the suppression of the short channel effect and the securement of the high-current driving capability.

For example, in the FINFET described in Patent Document 1, a sidewall is formed on the side wall of the gate electrode, and, in the process of forming the sidewall on the side wall of the gate electrode, the sidewall is also formed on the side wall of the fin. On this occasion, since the sidewall is formed on the side wall of the fin, it becomes difficult to perform a uniform and high concentration implantation of impurities into the side surface of the fin. Furthermore, the sidewall becomes a hindrance factor when siliciding the surface of the fin. This makes it difficult to achieve the improvement of parasitic resistance at the side surface of the fin.

The present invention has been made in view of the above circumstances and provides a technique capable of achieving the improvement of the parasitic resistance in FINFETs.

The aforementioned and other purposes and novel features of the present invention will be made clear from the description of the present specification and the attached drawings.

The following explains briefly the outline of a typical invention among the inventions disclosed in the present application.

A semiconductor device according to a representative Example comprises a first MISFET formed in a first region of a semiconductor chip. The first MISFET includes (a) an SOI substrate including a substrate layer, a buried insulating layer formed over the substrate layer, and a semiconductor layer formed over the buried insulating layer, and (b) a fin that is formed by processing the semiconductor layer and has a rectangular parallelepiped shape with the long side in a first direction. Further, it includes (c) a first source region formed by processing the semiconductor layer so as to be connected to one end of the fin, and (d) a first drain region formed by processing the semiconductor layer so as to be connected to the other end of the fin. Furthermore, it includes (e) a first gate insulating film formed over the surface of the fin, and (f) a first gate electrode formed so as to cross over the surface of the fin via the first gate insulating film in a region that extends in a second direction intersecting the first direction and intersects the fin. Here, it is characteristic that the sidewall is formed on the side wall of the first gate electrode, but that the sidewall is not formed on the side wall of the fin.

A method of manufacturing a semiconductor device according to a representative Example comprises the steps of (a) preparing an SOI substrate including a substrate layer, a buried insulating layer formed over the substrate layer, and a semiconductor layer formed over the buried insulating layer, and (b) forming a first MISFET in a first region of the SOI substrate. The step (b) includes the step of (b1) forming a fin in a rectangular parallelepiped shape with the long side in a first direction, a first source region connected to one end of the fin, and a first drain region connected to the other end of the fin, by processing the semiconductor layer of the SOI substrate. Further, it includes the steps of (b2) forming a first gate insulating film over the surface of the fin, (b3) forming a first conductor film covering the fin over the SOI substrate in which the fin is formed, and (b4) forming a hard mask film over the first conductor film. Further, it includes the steps of (b5) patterning the hard mask film, and (b6) forming a first gate electrode disposed so as to cross over the surface of the fin via the first gate insulating film in a region that extends in a second direction intersecting the first direction and intersects the fin, by processing the first conductor film using the patterned hard mask film as a mask. Next, it includes the steps of (b7) introducing conductive impurities into the fin exposed from the first gate electrode, the first source region and the second drain region, (b8) after the step (b7), forming a first insulating film over the SOI substrate, (b9) forming a second insulating film over the first insulating film, and (b10) forming a third insulating film over the second insulating film. Subsequently, it includes the step of (b11) removing the third insulating film formed on the side wall of the fin while leaving the third insulating film on the side wall of the first gate electrode, by subjecting the third insulating film to anisotropic etching up to the removal of the third insulating film formed on the side wall of the fin. After that, it includes the step of (b12) removing the second insulating film formed on the side wall of the fin while leaving the third insulating film and the second insulating film on the side wall of the first gate electrode, by etching the second insulating film using the remaining third insulating film as a mask. Next, it includes the step of (b13) removing the first insulating film formed on the side wall of the fin while leaving the first insulating film, the second insulating film and the third insulating film on the side wall of the first gate electrode to form a sidewall including the first insulating film, the second insulating film and the third insulating film, by etching the first insulating film using the remaining third insulating film and second insulating film as a mask. Subsequently, it includes the step of (b14) introducing conductive impurities into the fin exposed from the sidewall, the first source region and the first drain region. The method is characterized by having these steps.

The following explains briefly the effect acquired by the typical invention among the inventions disclosed in the present application.

In FINFETs, it is possible to achieve the improvement of the parasitic resistance.

DETAILED DESCRIPTION OF THE PREFERRED EMBODIMENTS

The following Examples will be described, divided into plural sections or Examples, if necessary for convenience. Except for the case where it shows clearly in particular, they are not mutually unrelated and one has relationships such as a modification, details, and supplementary explanation of some or entire of another.

In the following Examples, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following Examples, it is needless to say that an element (including an element step etc.) is not necessarily indispensable, except for the case where it is clearly specified in particular and where it is considered to be clearly indispensable from a theoretical point of view, etc.

Similarly, in the following Examples, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

In all the drawings for explaining embodiments, the same symbol is attached to the same member, as a principle, and the repeated explanation thereof is omitted. In order to make a drawing intelligible, hatching may be attached even if it is a plan view.

Example 1

Figure 1:
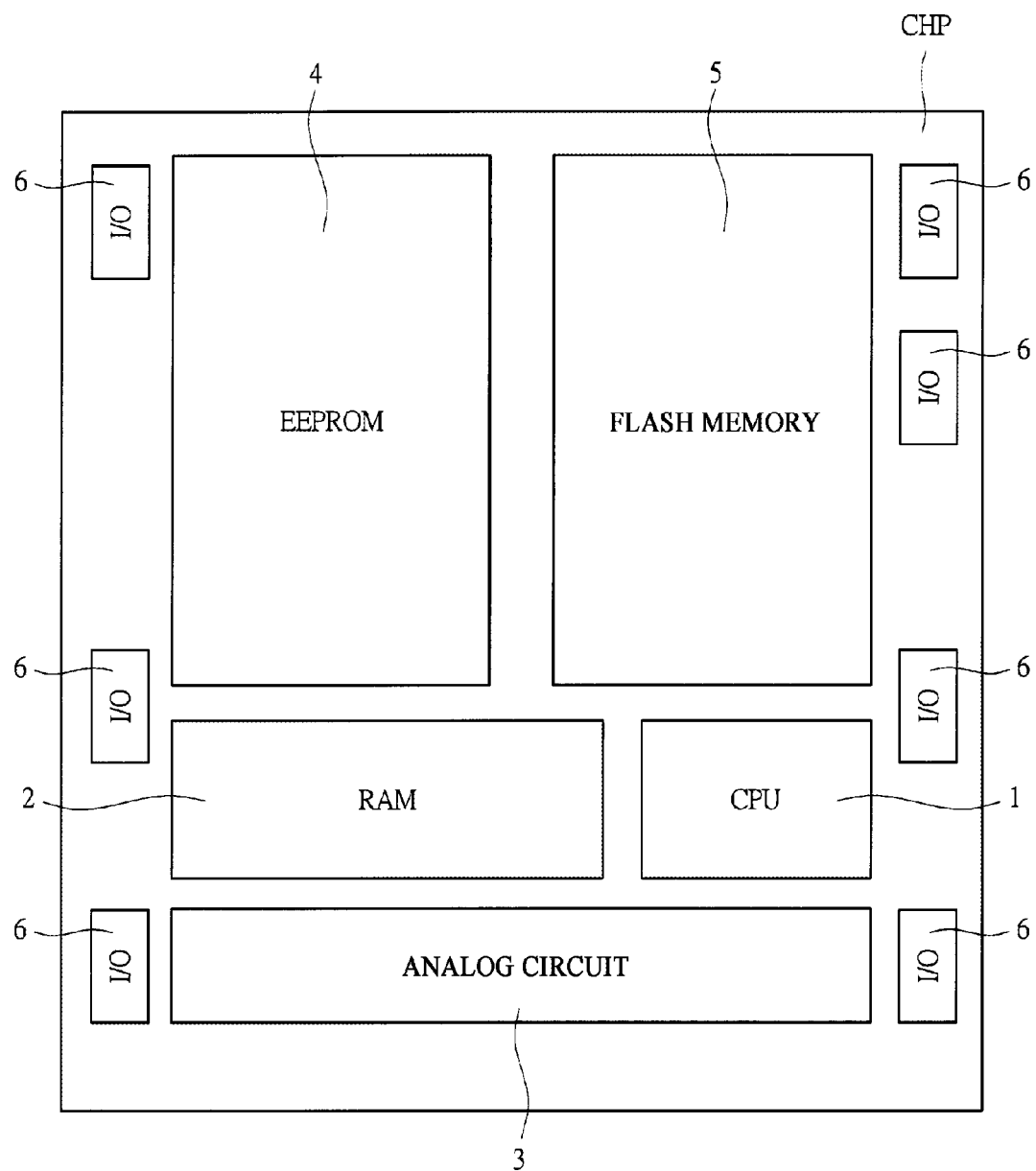
FIG. 1 is a drawing showing the layout configuration of a semiconductor chip in Example 1 of the present invention.

A semiconductor device in the present Example 1 will be described with reference to the drawing. Firstly, the layout configuration of a semiconductor chip, in which a system including a microcomputer is formed, is described. FIG. 1 is a drawing showing the layout configuration of a semiconductor chip CHP in Example 1. In FIG. 1, the semiconductor chip CHP has a CPU (Central Processing Unit) 1, a RAM (Random Access Memory) 2, an analog circuit 3, an EEPROM (Electrically Erasable Programmable Read Only Memory) 4, a flash memory 5 and an I/O (Input/Output) circuit 6.

The CPU (the circuit) 1 is also referred to as a central processing unit, which corresponds to the heart portion of computers and the like. The CPU 1 reads out an instruction from a memory device and decodes it, and, on the basis of it, performs various calculation or control.

The RAM (the circuit) 2 is a memory capable of randomly reading out memory information, that is, reading out stored memory information, and newly writing memory information at any time, which is also referred to as a memory capable of random writing and reading. The RAM as an IC memory is divided into two kinds, that is, a DRAM (Dynamic RAM) using a dynamic circuit, and an SRAM (Static RAM) using a static circuit. The DRAM is a memory for random writing and reading that requires a memory holding operation, and the SRAM is a memory for random writing and reading that does not require the memory holding operation. In Example 1, the SRAM constitutes the RAM 2.

The analog circuit 3 is a circuit that deals with the signal of voltage or current that temporally continuously changes, that is, an analog signal, and is constituted, for example, from an amplification circuit, a conversion circuit, a modulation circuit, an oscillation circuit, a supply circuit, and the like.

The EEPROM 4 and the flash memory 5 are a kind of nonvolatile memories that may be electrically rewritable in both the write operation and erase operation, and are also referred to as an electrically erasable programmable read-only memory. The memory cell of the EEPROM 4 and the flash memory 5 is constituted, for example, from a MONOS (Metal Oxide Nitride Oxide Semiconductor) type transistor or a MNOS (Metal Nitride Oxide Semiconductor) type transistor for memory. For the write operation and erase operation of the EEPROM 4 and the flash memory 5, for example, Fowler-Nordheim type tunneling is utilized. Meanwhile, it is also possible to make them perform write operation or erase operation using hot electrons or hot holes. The difference between the EEPROM 4 and the flash memory 5 is lies in a point that the EEPROM 4 is a nonvolatile memory, for example, capable of the erasing in a unit of bite, and, in contrast, the flash memory 5 is a nonvolatile memory, for example, capable of the erasing in a unit of a word line. Generally, the flash memory 5 stores a program for causing the CPU 1 to execute various processings and the like. In contrast, the EEPROM 4 stores various data that are frequently rewritten.

The I/O circuit 6 is an input/output circuit, and is a circuit for performing the output of data from the inside of the semiconductor chip CHP to a device connected to the outside of the semiconductor chip CHP, and the input of data from a device connected to the outside of the semiconductor chip CHP into the semiconductor chip.

The semiconductor chip CHP in Example 1 is constituted as described above, and, hereinafter, the structure of semiconductor elements formed in the semiconductor chip CHP will be described. In Example 1, the RAM 2 is constituted by the FINFET, and the CPU 1 is constituted by the partial-depletion type MISFET. Further, the I/O circuit 6 is constituted by the bulk type MISFET. That is, in the semiconductor chip CHP in Example 1, the FINFET, the partial-depletion type MISFET and the bulk type MISFET are mixedly mounted. Hereinafter, the constitution of each of the FINFET, partial-depletion type MISFET and bulk type MISFET formed in the semiconductor chip CHP will be described.

Figure 2:
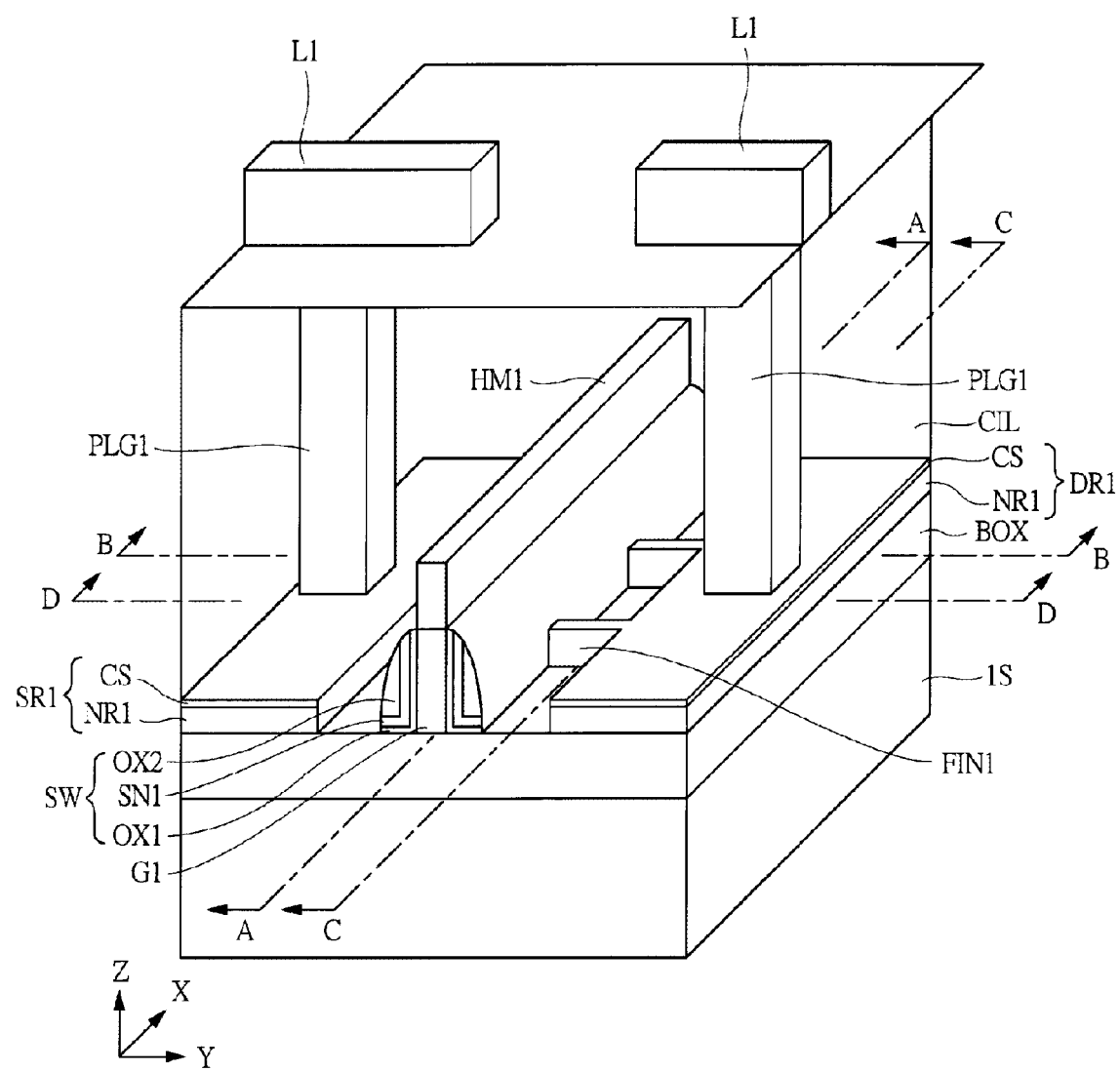
FIG. 2 is a perspective view showing the structure of a FINFET in Example 1.

Firstly, the structure of the FINFET constituting the RAM 2 (SRAM) is described. For the purpose of easily understanding the structure of the FINFET, the structure of the FINFET is described with a perspective view. FIG. 2 is a perspective view that shows, for example, the constitution of an n-channel type FINFET. In FIG. 2, a buried insulating layer BOX is formed over a substrate layer 1S. In addition, over the buried insulating layer BOX, a source region SR1, a fin FIN1 and a drain region DR1 are formed. That is, in the SOI substrate, a silicon layer is formed over the buried insulating layer BOX, and, by processing the silicon layer, the source region SR1, the fin FIN1 and the drain region DR1 are formed. Specifically, the fin FIN1 in a rectangular parallelepiped shape with the long side in the Y direction is formed between the source region SR1 and the drain region DR1, wherein one end of the fin FIN1 is connected to the source region SR1, and the other end of the fin FIN1 is connected to the drain region DR1. At this time, the source region SR1 includes a high concentration n-type impurity diffusion region NR1 and a cobalt silicide film CS, and the drain region DR1 also includes the high concentration n-type impurity diffusion region NR1 and the cobalt silicide film CS.

Further, for the n-channel type FINFET, the gate electrode G1 is formed so as to cross over the surface of the fin FIN1 via a gate insulating film (not shown) in a region that extends in the X direction intersecting the Y direction and intersects the fin FIN1. At this time, in the fin FIN1, a region covered by the gate electrode G1 functions as a channel region. In particular, the side surface of the fin FIN1 covered by the gate electrode G1 functions as the channel region. That is, the FINFET in Example 1 has a tri-gate structure that uses both side surfaces and the upper surface of the rectangular parallelepiped constituting the fin FIN1 as the channel region. Over the gate electrode G1, a hard mask film HM1 is constituted, for example, by a silicon oxide film is formed, and, on side walls on both sides of the gate electrode G1, a sidewall SW is formed. Here, the fin FIN1 includes a region that is covered by the gate electrode G1, and a region that is not covered by the gate electrode G1 or the sidewall SW, wherein the region that is covered by the gate electrode G1 works as the channel region, and the region that is not covered by the gate electrode G1 or the sidewall SW works as a part of the source region SR1 or the drain region DR1. Describing it in detail, for the fin FIN1, a low concentration n-type impurity diffusion region (not shown) is formed aligned with the gate electrode G1, and, further, the high concentration n-type impurity diffusion region NR1 is formed so as to be aligned with the sidewall SW.

In the FINFET in Example 1, the sidewall SW is formed of a laminated film. Specifically, the sidewall SW is constituted by a silicon oxide film OX1, a silicon nitride film SN1 formed over the silicon oxide film OX1, and a silicon oxide film OX2 formed over the silicon nitride film SN1. On the other hand, on the side wall of the fin FIN1, no sidewall SW is formed. As described above, Example 1 is characterized in that the sidewall SW is formed on the side wall of the gate electrode G1, but that the sidewall SW is not formed on the side wall of the fin FIN1. In particular, in Example 1, in order to form the sidewall SW on the side wall of the gate electrode G1 but in order not to form the sidewall SW on the side wall of the fin FIN1 in the FINFET of the tri-gate structure that uses both side surfaces and the upper surface of the fin FIN1 as the channel, it is devised to form the sidewall SW from the laminated film of the silicon oxide film OX1, the silicon nitride film SN1 and the silicon oxide film OX2. As the result of forming the sidewall SW from the laminated film constituted by films having different film properties, it becomes possible to constitute so that the sidewall SW is formed only on the side wall of the gate electrode G1, but that the sidewall SW is not formed on the side wall of the fin FIN1. This characteristic point will be described in the manufacturing method described later.

An inter-contact layer insulating film CIL is formed so as to cover the n-channel type FINFET constituted as described above, and, passing through the inter-contact layer insulating film CIL, a plug PLG1 connected to the source region SR1 or the drain region DR1 of the n-channel type FINFET is formed. Further, over the inter-contact layer insulating film CIL in which the plug PLG1 is formed, a first layer wiring L1 is formed.

Figure 3:
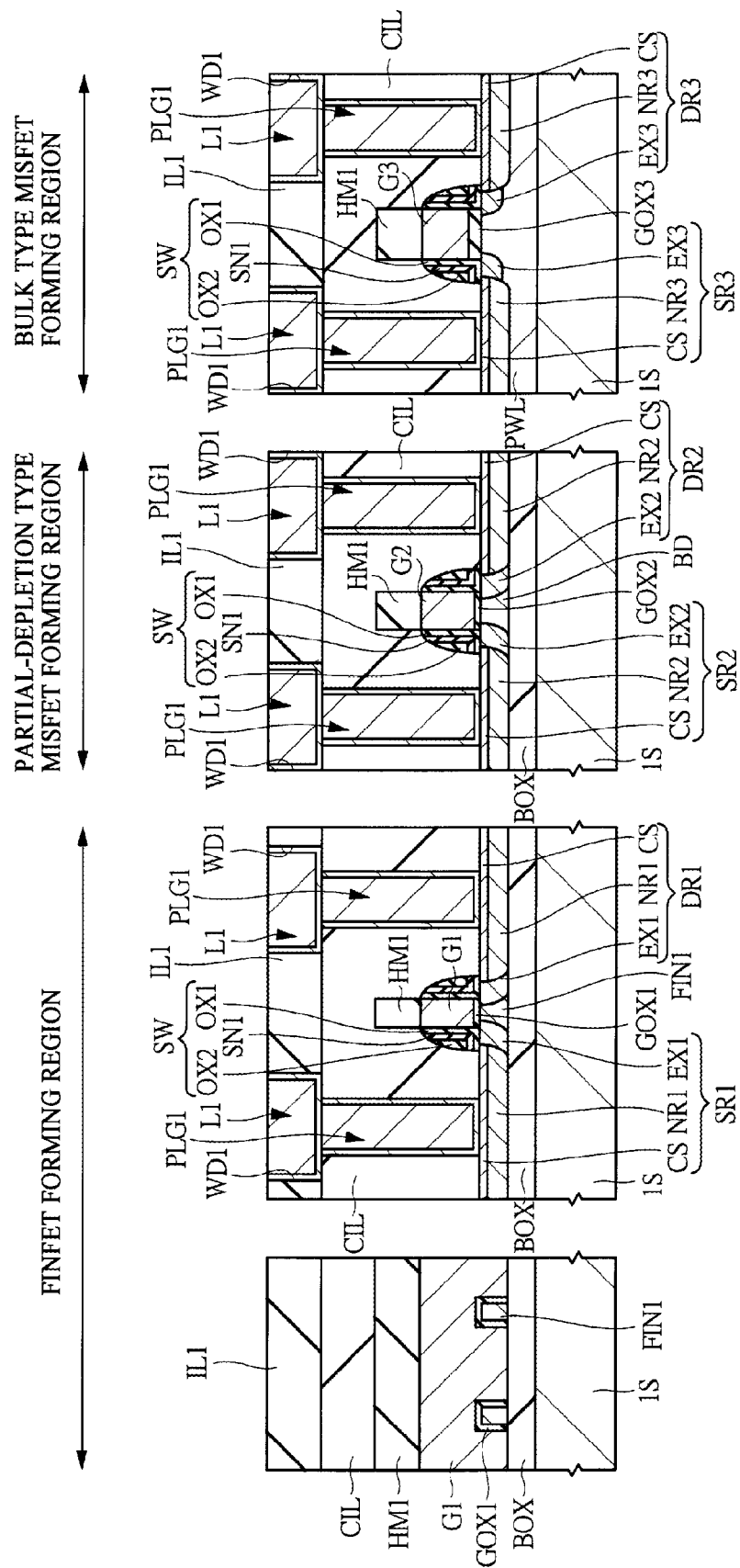
FIG. 3 is a cross-sectional view showing the cross-sectional structure of the FINFET in Example 1, a partial-depletion type MISFET and a bulk-type MISFET.

Next, the structure of the FINFET in Example 1 is described with reference to FIG. 3, which is a cross-sectional view. FIG. 3 diagrammatically shows a FINFET forming region, a partial-depletion type MISFET forming region, and a bulk type MISFET forming region, wherein the cross-sectional structure of the FINFET is shown in the FINFET forming region, and the cross-sectional structure of the partial-depletion type MISFET is shown in the partial-depletion type MISFET forming region. Further, the cross-sectional structure of the bulk type MISFET is shown in the bulk type MISFET forming region.

Meanwhile, in FIG. 3, the FINFET, the partial-depletion type MISFET and the bulk type MISFET are shown as the n-channel type MISFET, but the FINFET, the partial-depletion type MISFET and the bulk type MISFET also include a p-channel type MISFET.

In FIG. 3, in the FINFET forming region, two cross-sectional views are represented, wherein the cross-sectional view on the left side shows a cross-section cut along the A-A line in FIG. 2, and the cross-sectional view on the right side shows a cross-section cut along the B-B line in FIG. 2.

Firstly, with reference to the cross-sectional view on the left side shown in the FINFET forming region in FIG. 3, the cross-sectional structure of the FINFET is explained. Over the substrate layer 1S, the buried insulating layer BOX is formed, and, over the buried insulating layer, a silicon layer is formed. The SOI substrate is constituted by the substrate layer 1S, the buried insulating layer BOX and the silicon layer. By processing the silicon layer of the SOI substrate, the fin FIN1 is formed over the buried insulating layer BOX. Further, so as to cover both side surfaces and the upper surface of the fin FIN1, the gate insulating film GOX1 is formed. Via the gate insulating film GOX1, the gate electrode G1 is formed so as to cover the fin FIN1. Over the gate electrode G1, a hard mask HM1 is formed, and, over the hard mask HM1, the inter-contact layer insulating film CIL is formed. In addition, over the inter-contact layer insulating film CIL, an interlayer insulating film IL1 is formed.

Next, with reference to the cross-sectional view on the right side shown in the FINFET forming region in FIG. 3, the cross-sectional structure of the FINFET is explained. Over the substrate layer 1S, the buried insulating layer BOX is formed, and, over the buried insulating layer BOX, the fin FIN1 is formed. That is, it means that the fin FIN1 is formed of the silicon layer, which is formed over the buried insulating layer BOX, of the SOI substrate. Over the fin FIN1, the gate insulating film GOX1 is formed, and, over the gate insulating film GOX1, the gate electrode G1 is formed. Over the gate electrode G1, the hard mask HM1 is formed. On side walls on both sides of the gate electrode G1, the sidewall SW is formed. In Example 1, the sidewall SW formed on side walls on both sides of the gate electrode G1 is constituted by the laminated film of the silicon oxide film OX1, the silicon nitride film SN1 and the silicon oxide film OX2.

Within the fin FIN1 formed in the under layer of the gate electrode G1, a low concentration n-type impurity diffusion region (an extension region) EX1 is formed, and, within the fin FIN1 outside the low concentration n-type impurity diffusion region EX1, the high concentration n-type impurity diffusion region NR1 is formed. Over the surface of the high concentration n-type impurity diffusion region NR1, the cobalt silicide film CS is formed. At this time, the low concentration n-type impurity diffusion region EX1, the high concentration n-type impurity diffusion region NR1 and the cobalt silicide film CS form the source region SR1 and the drain region DR1. The cobalt silicide film CS is a film formed for lowering the sheet resistance of the source region SR1 and the drain region DR1, wherein, in place of the cobalt silicide film CS, such a silicide film as a titanium silicide film, a nickel silicide film, or a platinum silicide film may be used.

So as to cover the FINFET constituted as described above, the inter-contact layer insulating film CIL is formed, and, passing through the inter-contact layer insulating film CIL, the plug PLG1 connected to the source region SR1 or the drain region DR1 of the FINFET is formed. In addition, over the inter-contact layer insulating film CIL in which the plug PLG1 is formed, the first layer wiring L1 is formed.

In Example 1, the semiconductor element of an internal circuit constituting an SRAM is formed from the FINFET, and advantages obtained by constituting the internal circuit from the FINFET are explained. In these years, the miniaturization of semiconductor chips is advanced, and the miniaturization of the dimension of MISFETs formed for semiconductor chips, in particular, of the gate length of the gate electrode is advanced. The miniaturization of MISFETs has been advanced so as to conform to the scaling law. Along with the advance of the miniaturization of MISFETs, however, it becomes difficult to satisfy both the suppression of the short channel effect and the securement of a high-current driving capability of MISFETs. Accordingly, a new structure device that replaces conventional planar type MISFETs is desired.

The FINFET is one of aforementioned new structure devices, and is a three dimensional structure MISFET differing from the planar type MISFET. The FINFET has the fin formed by processing the semiconductor layer, as described above. The fin is a region having a thin strip shape (a rectangular parallelepiped shape), wherein both side surface portions of the fin are used as the channel of the FINFET. The gate electrode of the FINFET is formed over both side surface portions and upper surface portion of the fin so as to cross over the fin, having the so-called tri-gate structure. The FINFET constituted as described above represents better potential controllability for the channel region by the gate electrode, as compared with the conventional planar type MISFET. Consequently, the FINFET gives such an advantage as high punch-through resistance between the source region and the drain region to make it possible to suppress the short channel effect in a smaller gate length. In addition, since the FINFET uses both side surface portions and the upper surface portion of the fin as the channel, it enables the area of the channel region for flowing current to be enlarged, and a high-current driving capability to be obtained. That is, the FINFET is a device having such an advantage as satisfying both the suppression of the short channel effect and the securement of a high-current driving capability. Accordingly, the FINFET is appropriate to be applied to SRAMs that use a microfabricated MISFET.

Furthermore, for example, in conventional planar type MISFETs, the threshold voltage is controlled by adjusting the impurity concentration in the channel region. In this case, along with the advance of the miniaturization of planar type MISFETs, from the scaling law, the concentration of an impurity to be introduced into the channel region becomes high. That is, in conventional planar type MISFETs, particularly, the miniaturization thereof leads to the proximity between the source region and the drain region to generate easily the punch-through, and hence the impurity concentration of the channel formed between the source region and the drain region is raised to suppress the punch-through. But, when the impurity concentration of the channel is raised, the variation in the impurity concentration among elements also becomes large to lead to a large variation in properties of planar type MISFETs. Moreover, there occurs the increase in the scattering of carriers passing through the channel caused by the impurity, to generate the mobility deterioration of carriers.

In particular, in SRAMs, the microfabrication of MISFETs advances, and, when a microfabricated planar type MISFET is used for an SRAM, such a problem as shown below occurs. That is, along with the microfabrication, the concentration of an impurity to be introduced in the channel region rises, which means that the variation among elements becomes large. For example, there is such an anxiety that, in the case of SRAMs for which pair capability is required, the variation in the threshold voltage among elements may result in abnormal operation. Accordingly, it is considered that the use of a microfabricated planar type MISFET in the SRAM involves limitations.

In contrast, since the FINFET is based on the same operation principle as a full-depletion type MISFET, it is considered that the reduction of the impurity concentration in the channel is possible, and that the reduction of the variation in electric properties of MISFETs caused by a high impurity concentration is possible. That is, in FINFETs, the threshold voltage of the FINFET is controlled by appropriately selecting the work function of the gate electrode, instead of controlling the threshold voltage by adjusting the concentration of an impurity to be introduced into the channel. Accordingly, in the FINFET, it is possible to lower the concentration of an impurity to be introduced into the channel region (the fin), and to suppress the variation in electric properties caused by a high concentration of an impurity to be introduced into the channel region. Consequently, the FINFET is particularly appropriate for the application to SRAMs. As described above, it is considered that the application of the FINFET to microfabricated semiconductor elements will be advanced, because the FINFET has such an advantage that the suppression of the short channel effect and the securement of the high-current driving capability may be achieved, and may reduce the impurity concentration in the channel region even when it is microfabricated, as compared with the planar type MISFET.

As aforementioned, FINFETs are based on the same operation principle as the full-depletion type MISFET, and, as the result, they also have advantages of the full-depletion type MISFET. That is, in full-depletion type MISFETs, it is possible to lower the S value that shows the sub-threshold property to around 60 to 70 mV/dec. Here, the S value shows the gate voltage value in the sub-threshold region, which changes drain current by one order of magnitude while maintaining the drain voltage to be constant. Accordingly, a smaller S value may lead to a smaller gate voltage value for increasing the drain current. As the result, the threshold voltage may be set to be low without increasing an off-leak current. Consequently, FINFETs have such an advantage that a low voltage operation is made possible.

Moreover, since a PN junction, which is formed between the source or drain region and the substrate or well in bulk type MISFETs, does not exist in full-depletion type MISFETs, the junction capacitance becomes very small in full-depletion type MISFETs. Consequently, in FINFETs, too, it is possible to make the junction capacitance very small, and to reduce the load capacitance of FINFETs. As the result, FINFETs have such an advantage that the development of semiconductor elements with high speed and low-power consumption becomes easy.

Furthermore, the FINFET in Example 1 is formed over the SOI substrate and semiconductor elements are completely separated, and thus it also has an advantage of making it possible to prevent false operations including a latch-up phenomenon. As described above, FINFETs have aforementioned various advantages, but there exist problems, too.

For example, in the FINFET, as shown in FIG. 2, current flows between the source region SR1 and the drain region DR1 via the fin FIN1. At this time, there is such a problem that the parasitic resistance becomes large, because the fin FIN1 has a narrow width (the width in the X direction in FIG. 2). Accordingly, it is conceivable to implant a conductive impurity in a high concentration into the fin FIN1 that is mainly made of silicon, or to form a silicide film with a low resistance over the surface of the fin FIN1. In this case, when the sidewall SW is formed on the side wall of the fin FIN1, the sidewall SW works as an obstacle to make it hard to implant the impurity with uniform and high concentration. Furthermore, it works as an inhibition factor when siliciding the surface of the fin FIN1. Consequently, there occurs such a problem that the improvement of the parasitic resistance at the side surface of the fin FIN1 can not be achieved.

This problem is caused by the formation of the sidewall SW also on the side wall of the fin FIN1. According to ordinary processes of forming the sidewall, however, the formation of the sidewall SW on the side wall of the gate electrode G1 results in the formation of the sidewall SW also on the side wall of the fin FIN1. This is because in order to form the sidewall SW on the side wall of the gate electrode G1, firstly, a silicon oxide film is formed so as to cover the gate electrode G1, and, at this time, the silicon oxide film is also formed so as to cover the fin FIN1. Further, by subjecting the silicon oxide film formed so as to cover the gate electrode G1 to anisotropic etching, the sidewall SW is formed on the side wall of the gate electrode G1. When subjecting the silicon oxide film to the anisotropic etching, however, the silicon oxide film formed so as to cover the fin FIN1, too, is anisotropically etched. Consequently, this results in the formation of the sidewall SW also on the side wall of the fin FIN1.

Hence, in the FINFET in Example 1, for example, as shown in FIG. 2, the sidewall SW is formed on the side wall of the gate electrode G1, and, at the same time, the sidewall SW formed on the side wall of the fin FIN1 is removed. Consequently, when a conductive impurity is implanted in a high concentration from the side wall of the fin FIN1, the sidewall SW does not work as an obstacle to make it possible to perform the uniform and high concentration implantation of the impurity. Furthermore, a silicide film having a low resistance may be formed over the surface of the fin FIN1 without the inhibition of the sidewall SW. As the result, in the FINFET in Example 1, it is possible to achieve the improvement of the parasitic resistance at the side surface of the fin FIN1. That is, the characteristic of the Example 1 lies in that the implantation of an impurity in a high concentration and the formation of the silicide film are made possible in a state where the surface (the side wall and the upper surface) of the fin FIN1 is exposed, by forming the sidewall SW on the side wall of the gate electrode G1 to make the source region SR1 and the drain region DR1 have an LDD (Lightly Doped Drain) structure, while removing the sidewall SW formed on the side wall of the fin FIN1. Hence, according to Example 1, such a significant effect may be obtained that the reduction of the parasitic resistance in the fin FIN1 is achieved.

The FINFET in Example 1 is constituted as described above, and, next, the structure of the partial-depletion type MISFET constituting, for example, the CPU 1 will be described. In FIG. 3, the partial-depletion type MISFET is formed in the partial-depletion type MISFET forming region. Specifically, the partial-depletion type MISFET is formed over the SOI substrate including the substrate layer 1S, the buried insulating layer BOX formed over the substrate layer 1S, and the semiconductor layer formed over the buried insulating layer BOX. The semiconductor layer of the SOI substrate works as a body region BD of the partial-depletion type MISFET, and, over the body region BD, a gate insulating film GOX2 is formed. Further, over the gate insulating film GOX2, a gate electrode G2 is formed, and, over the gate electrode G2, a hard mask HM1 is formed. On side walls on both sides of the gate electrode G2, the sidewall SW is formed, and the sidewall SW is constituted by a laminated film including the silicon oxide film OX1, the silicon nitride film SN1 formed over the silicon oxide film OX1, and the silicon oxide film OX2 formed over the silicon nitride film SN1.

Within the semiconductor layer of the SOI substrate, as a semiconductor region aligned with the gate electrode G2, a low concentration n-type impurity diffusion region EX2 is formed. Further, on the outside of the low concentration n-type impurity diffusion region EX2, a high concentration n-type impurity diffusion region NR2 is formed, and, over the high concentration n-type impurity diffusion region NR2, a cobalt silicide film CS is formed.

The sidewall SW is formed for making the source region SR2 and the drain region DR2 being the semiconductor regions of the partial-depletion type MISFET have the LDD structure. That is, the source region SR2 and the drain region DR2 of the partial-depletion type MISFET are constituted by the low concentration n-type impurity diffusion region EX2, the high concentration n-type impurity diffusion region NR2 and the cobalt silicide film CS. At this time, the impurity concentration in the low concentration n-type impurity diffusion region EX2 is lower than that in the high concentration n-type impurity diffusion region NR2. Accordingly, by constituting the source region SR2 and the drain region DR2 under the sidewall SW by the low concentration n-type impurity diffusion region EX2, the electric field concentration under the end portion of the gate electrode G2 may be suppressed.

So as to cover the partial-depletion type MISFET constituted as described above, the inter-contact layer insulating film CIL is formed, and, passing through the inter-contact layer insulating film CIL, the plug PLG1 connected to the source region SR2 or the drain region DR2 of the partial-depletion type MISFET is formed. In addition, over the inter-contact layer insulating film CIL in which the plug PLG1 is formed, the first layer wiring L1 is formed.

Among MISFETs formed over the SOI substrate, one in which all the body regions under the channel are depleted is referred to as the full-depletion type MISFET, and one having a region that is not depleted at the bottom portion of the body region is referred to as the partial-depletion type MISFET. Accordingly, since partial-depletion type MISFETs have the PN junction at the bottom portion of the body region, they have a larger junction capacitance than the full-depletion type MISFETs, but may have a smaller junction capacitance as compared with bulk type MISFETs. That is, partial-depletion type MISFETs may be considered to be MISFETs lying between full-depletion type MISFETs and bulk type MISFETs. Consequently, partial-depletion type MISFETs may be operated at a high speed with low power consumption, as compared with bulk type MISFETs. Furthermore, the partial-depletion type MISFET is formed over the SOI substrate, and the semiconductor elements are completely separated, it also has such an advantage that the prevention of a false operation including a latch-up phenomenon is possible.

Next, the structure of the bulk type MISFET constituting the I/O circuit 6 is explained. In FIG. 3, the bulk type MISFET is formed in the bulk type MISFET forming region. Specifically, in the I/O circuit region, from the SOI substrate constituted by the substrate layer 1S constituted by silicon, the buried insulating layer BOX formed over the substrate layer 1S, and the silicon layer formed over the buried insulating layer BOX, the silicon layer and the buried insulating layer BOX have been removed and only the substrate layer 1S is left. Over the substrate layer 1S thus constituted, the bulk type MISFET is formed.

In the substrate layer 1S, an element isolation region (not shown) for separating elements is formed, and, in an active region divided by the element isolation region, a p-type well PWL constituted by a p-type semiconductor region is formed.

The bulk type MISFET has a gate insulating film GOX3 over the p-type well PWL formed within the substrate layer 1S, and, over the gate insulating film GOX3, a gate electrode G3 is formed. The gate insulating film GOX3 is formed, for example, from a silicon oxide film, and the gate electrode G3 is formed, for example, from a polysilicon film. Further, over the gate electrode G3, for example, a hard mask HM1 constituted by a silicon oxide film is formed.

On side walls on both sides of the gate electrode G3, the sidewall SW is formed, wherein the sidewall SW is constituted by a laminated film including the silicon oxide film OX1, the silicon nitride film SN1 formed over the silicon oxide film OX1, and the silicon oxide film OX2 formed over the silicon nitride film SN1.

Within the substrate layer 1S under the sidewall SW, a shallow n-type impurity diffusion region EX3 is formed as a semiconductor region. Further, outside the shallow n-type impurity diffusion region EX3, a deep n-type impurity diffusion region NR3 is formed, and, over the surface of the deep n-type impurity diffusion region NR3, a cobalt silicide film CS is formed.

The sidewall SW is formed in order to make the source region SR3 and the drain region DR3 being the semiconductor regions of the bulk type MISFET have the LDD structure. That is, the source region SR3 and the drain region DR3 of the bulk type MISFET are constituted by the shallow n-type impurity diffusion region EX3, the deep n-type impurity diffusion region NR3 and the cobalt silicide film CS. At this time, the shallow n-type impurity diffusion region EX3 has a lower impurity concentration than the deep n-type impurity diffusion region NR3. Accordingly, by constituting the source region SR3 and the drain region DR3 under the sidewall SW by the shallow n-type impurity diffusion region EX3, the electric field concentration under the end portion of the gate electrode G3 may be suppressed.

So as to cover the bulk type MISFET that is constituted as described above, the inter-contact layer insulating film CIL is formed, and, passing through the inter-contact layer insulating film CIL, the plug PLG1 connected to the source region SR3 or the drain region DR3 of the bulk type MISFET is formed. In addition, over the inter-contact layer insulating film CIL in which the plug PLG1 is formed, the first layer wiring L1 is formed.

In Example 1, the partial-depletion type MISFET is used for a logic circuit such as the CPU 1, and the bulk type MISFET is used for the I/O circuit 6. The logic circuit such as the CPU 1 constitutes an internal circuit, and is designed so as to operate at a low voltage. In contrast, the I/O circuit 6 constitutes an input/output circuit, and is designed so as to operate at a comparatively high voltage. That is, the partial-depletion type MISFET constituting the logic circuit such as the CPU 1 is constituted as a low voltage-resistant MISFET with large current driving capability, and the bulk type MISFET constituting the I/O circuit 6 is constituted as a high voltage-resistant MISFET having a high withstanding voltage. Accordingly, the gate insulating film GOX2 of the partial-depletion type MISFET has a thinner thickness than the gate insulating film GOX3 of the bulk type MISFET, and gate electrode G2 of the partial-depletion type MISFET has a shorter gate length than the gate electrode G3 of the bulk type MISFET.

The semiconductor device in Example 1 is constituted as described above, and, hereinafter, the method of manufacturing the same will be described. The Example 1 is characterized in that, in the FINFET having the tri-gate structure, the sidewall SW is formed on the side wall of the gate electrode G1, and that, at the same time, the sidewall SW formed on the side wall of the fin FIN1 is removed, for example, as shown in FIG. 2. As a method of manufacturing such a structure, the method shown below is conceivable. That is, over the SOI substrate, an insulating film constituted by a single layer film is formed so as to cover the gate electrode G1 and the fin FIN1, and the insulating film is anisotropically etched. Thereby, the sidewall SW is formed on the side wall of the gate electrode G1, and the sidewall SW is also formed on the side wall of the fin FIN1. Furthermore, in order to remove the sidewall SW formed on the side wall of the fin FIN1, the anisotropic etching is advanced to perform over-etching. In this case, since the fin FIN1 has a sufficiently low height as compared with the gate electrode G1, even when the over-etching is performed, it is possible to remove the sidewall SW formed on the side wall of the fin FIN1, while leaving the sidewall SW on the side wall of the gate electrode G1.

There is however such an anxiety that the above-described over-etching also etches the fin FIN1 itself to cause the disappearance of the fin FIN1. That is, the fin FIN1 is constituted by silicon, and the insulating film constituting the sidewall SW is constituted, for example, by a silicon oxide film, and hence it is considered that the fin FIN1 itself is not to be etched by the over-etching for removing the sidewall SW. Since the over-etching (anisotropic etching) is performed as dry etching and the fin FIN1 itself is small, however, there is such an anxiety that the fin FIN1 itself is etched slightly and the small fin FIN1 disappears.

Hereinafter, the problem is explained in more detail with reference to the drawings, and, after that, the method of manufacturing a semiconductor device in Example 1, to which a contrivance is applied to solve the problem, is explained. In the explanation here, a cross-section obtained by cutting the FINFET formed in the FINFET forming region along the C-C line in FIG. 2, and a cross-section cut along the D-D line in FIG. 2 are used. For example, in FIGS. 4 to 7 for explaining the above problem, the cross-sectional view cut along the C-C line in FIG. 2 is shown on the left side, and the cross-sectional view cut along the D-D line in FIG. 2 is shown on the right side.

Figure 4:
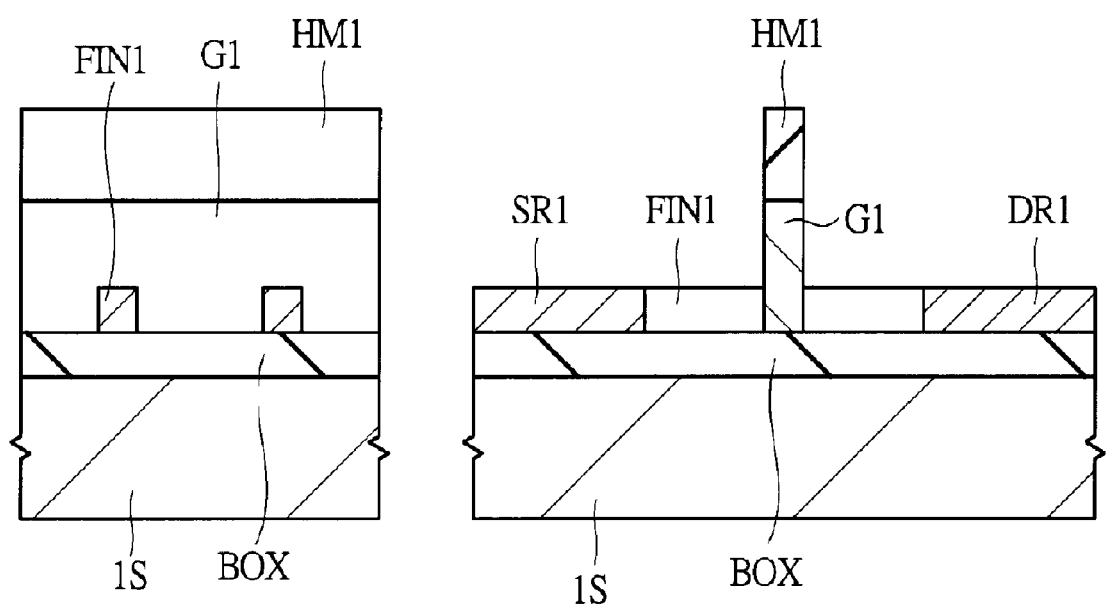
FIG. 4 is a drawing for explaining the subject of the present invention, which is a cross-sectional view showing the process of manufacturing the FINFET.

Firstly, as shown in FIG. 4, the SOI substrate having the substrate layer 1S, the buried insulating layer BOX and a semiconductor layer is prepared, and the semiconductor layer formed over the buried insulating layer BOX of the SOI substrate is processed to form the fin FIN1, the source region SR1 and the drain region DR1. After that, the gate electrode G1, which extends in the direction intersecting the fin FIN1 and crosses over the fin FIN1 in the region that intersects the fin FIN1, is formed. At this time, over the gate electrode G1, the hard mask HM1 is formed.

Figure 5:
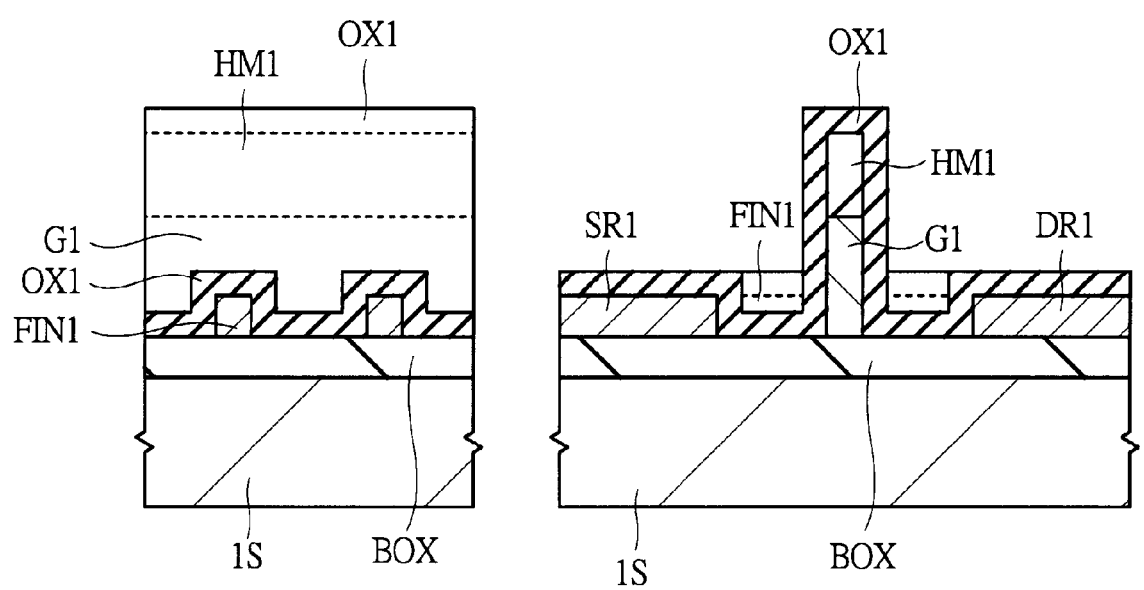
FIG. 5 is a cross-sectional view showing the process of manufacturing the FINFET subsequent to FIG. 4.
Figure 6:
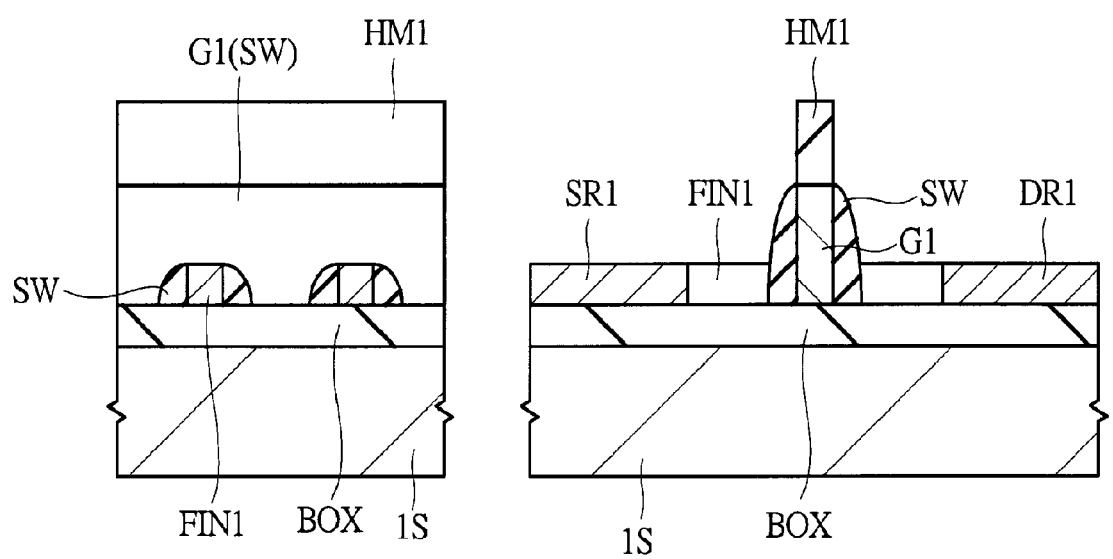
FIG. 6 is a cross-sectional view showing the process of manufacturing the FINFET subsequent to FIG. 5.

Subsequently, as shown in FIG. 5, the silicon oxide film OX1 is formed over the SOI substrate so as to cover the fin FIN1 and the gate electrode G1. After that, as shown in FIG. 6, the silicon oxide film OX1 is subjected to anisotropic etching to form the sidewall SW on side walls on both sides of the gate electrode G1. At this time, the sidewall SW is also formed on the side wall of the fin FIN1. Furthermore, the anisotropic etching is advanced to perform over-etching.

Figure 7:
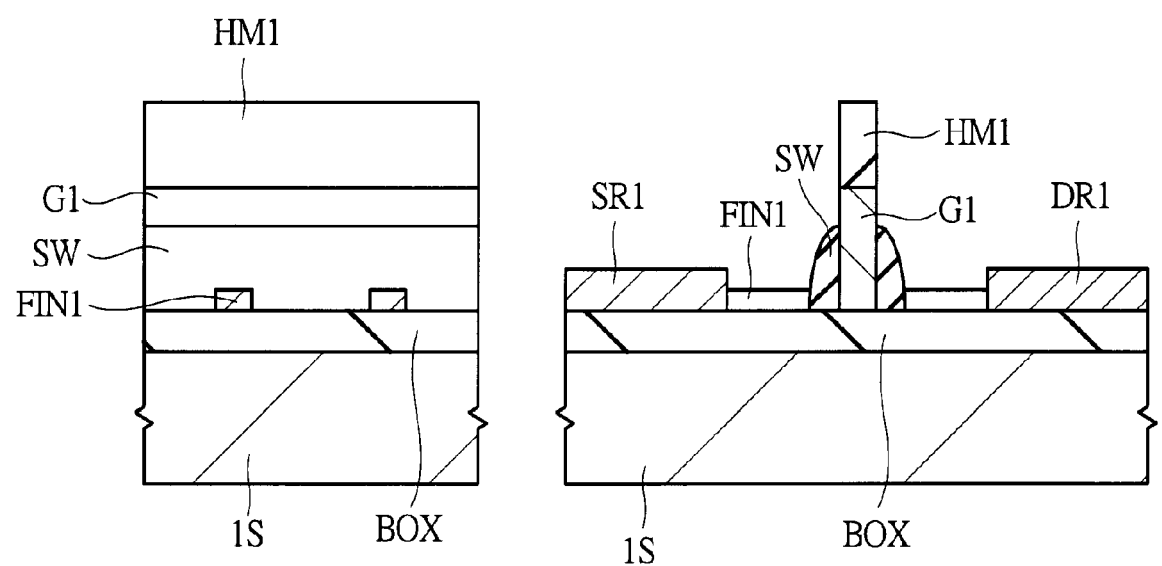
FIG. 7 is a cross-sectional view showing the process of manufacturing the FINFET subsequent to FIG. 6.

Consequently, as shown in FIG. 7, the sidewall SW formed on the side wall of the gate electrode G1 becomes smaller, and, at the same time, the sidewall SW formed on the side wall of the fin FIN1 is removed. That is, since the fin FIN1 has a sufficiently low height as compared with the gate electrode G1, even when the aforementioned over-etching is performed, the sidewall SW formed on the side wall of the fin FIN1 may be removed while leaving the sidewall SW on the side wall of the gate electrode G1. At this time, since the over-etching (anisotropic etching) is performed with dry etching and the fin FIN1 itself is small, there is such an anxiety that the fin FIN1 itself is slightly etched to reduce the thickness or cause the disappearance of the small fin FIN1. That is, according to the aforementioned method, the over-etching for removing the sidewall SW formed on the side wall of the fin FIN1 also etches the fin FIN1 itself. Accordingly, there is such an anxiety that the fin FIN1 itself becomes smaller to raise the parasitic resistance of the fin FIN1. Furthermore, there is also such an anxiety that, in an extreme case, the fin FIN1 itself disappears not to allow the FINFET to function.

Hence, in the FINFET in Example 1, the sidewall SW is formed on the side wall of the gate electrode G1, and, at the same time, a contrivance is applied to the method of forming a structure in which the sidewall SW formed on the side wall of the fin FIN1 is removed. Hereinafter, the method of manufacturing the FINFET in Example 1 is explained with reference to the drawings.

The method of manufacturing a semiconductor device in Example 1 is explained while diagrammatically representing, simultaneously, the FINFET forming region in which the FINFET is formed, the partial-depletion type MISFET forming region in which the partial-depletion type MISFET is formed, and the bulk type MISFET forming region in which the bulk type MISFET is formed. At this time, the FINFET forming region is explained while showing a cross-sectional view cut along the C-C line in FIG. 2 (left side) and a cross-sectional view cut along the D-D line in FIG. 2 (right side).

Figure 8:
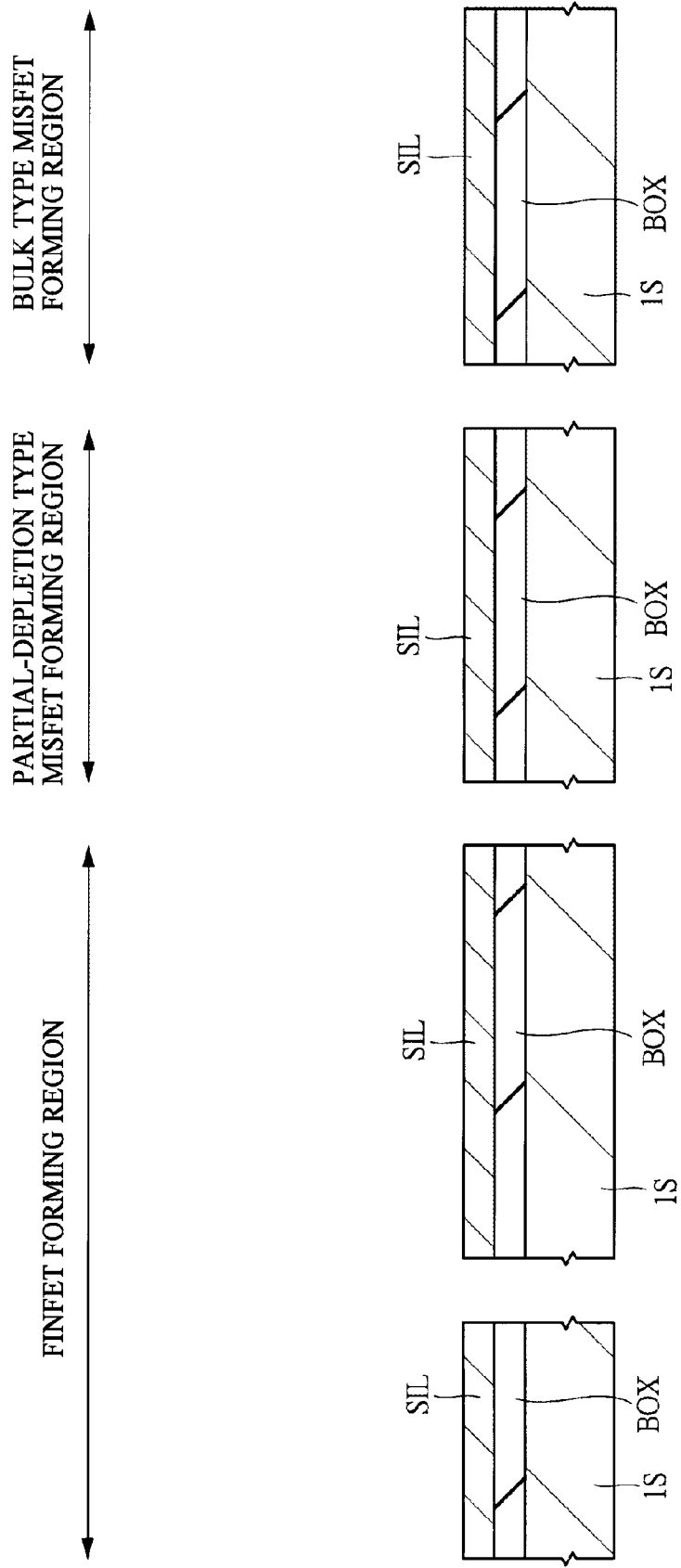
FIG. 8 is a cross-sectional view showing the process of manufacturing a semiconductor device in Example 1.

Firstly, as shown in FIG. 8, an SOI substrate constituted by the substrate layer 1S, the buried insulating layer BOX formed over the substrate layer 1S, and the silicon layer SIL formed over the buried insulating layer BOX is prepared. The SOI substrate may be formed, for example, by sticking a semiconductor substrate (a semiconductor wafer) having a silicon oxide film formed over the surface with another sheet of semiconductor substrate by thermal compression, and, after that, by grinding or removing partway the semiconductor substrate on one side. Alternatively, the SOI substrate may also be formed by a method of ion implanting oxygen into a semiconductor substrate with a high energy (~180 keV) and in a high concentration (~$1 \times 10^{18}$ atoms/$cm^2$), and, after that, subjecting the semiconductor substrate to a heat treatment at a high temperature to form the buried insulating layer inside the semiconductor substrate.

Figure 9:
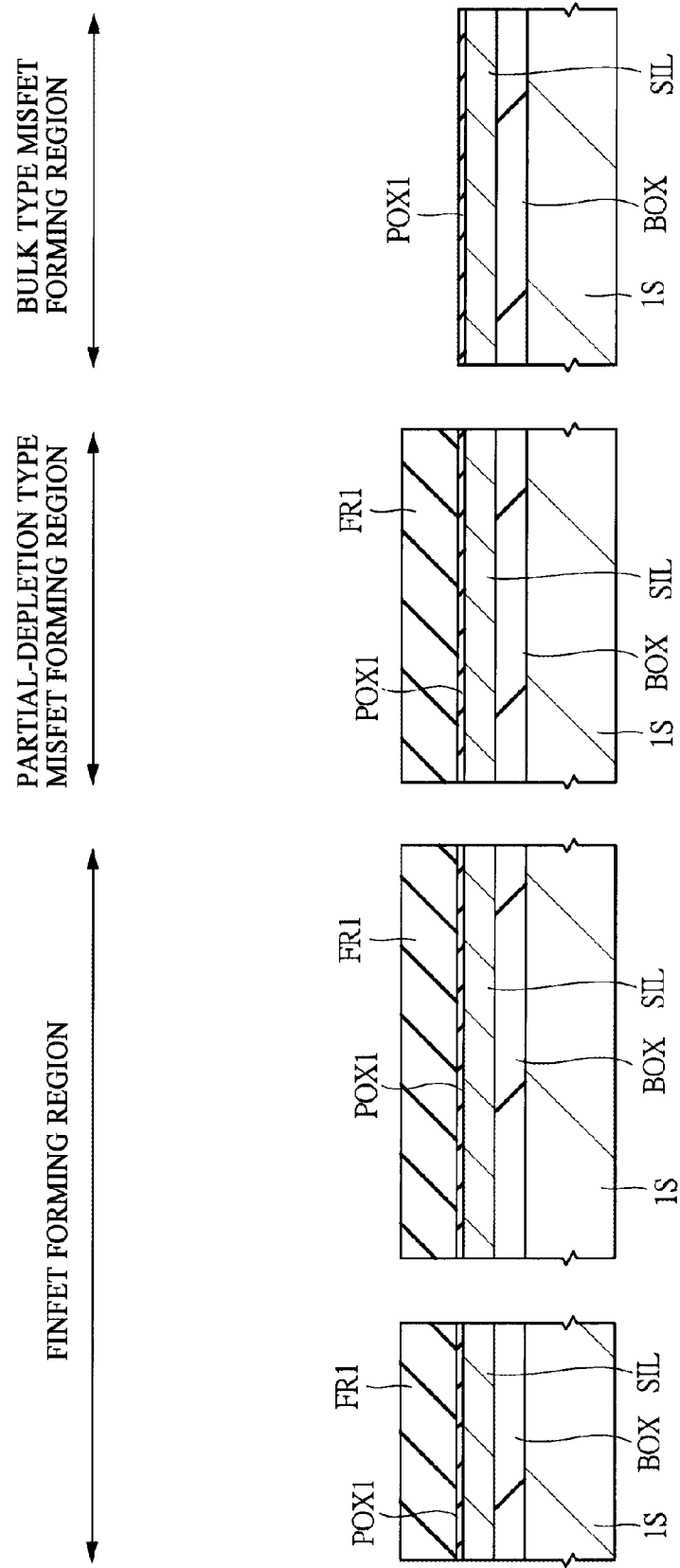
FIG. 9 is a cross-sectional view showing a process of manufacturing the semiconductor device subsequent to FIG. 8.

Next, as shown in FIG. 9, over the surface of silicon layer SIL, a pad oxide film (a pad silicon oxide film) POX1 is formed, and, over the pad oxide film POX1, a resist film FR1 is coated. The pad oxide film POX1 may be formed, for example, by a thermal oxidation method or the like. Then, the resist film FR1 formed over the pad oxide film POX1 is patterned. The resist film FR1 is patterned so that the resist film FR1 remains in the FINFET forming region and the partial-depletion type MISFET forming region, but that the resist film FR1 is not to be left in the bulk type MISFET forming region. That is, the FINFET forming region and the partial-depletion type MISFET forming region are covered by the resist film FR1, but, in the bulk type MISFET forming region, the pad oxide film POX1 is exposed.

Figure 10:
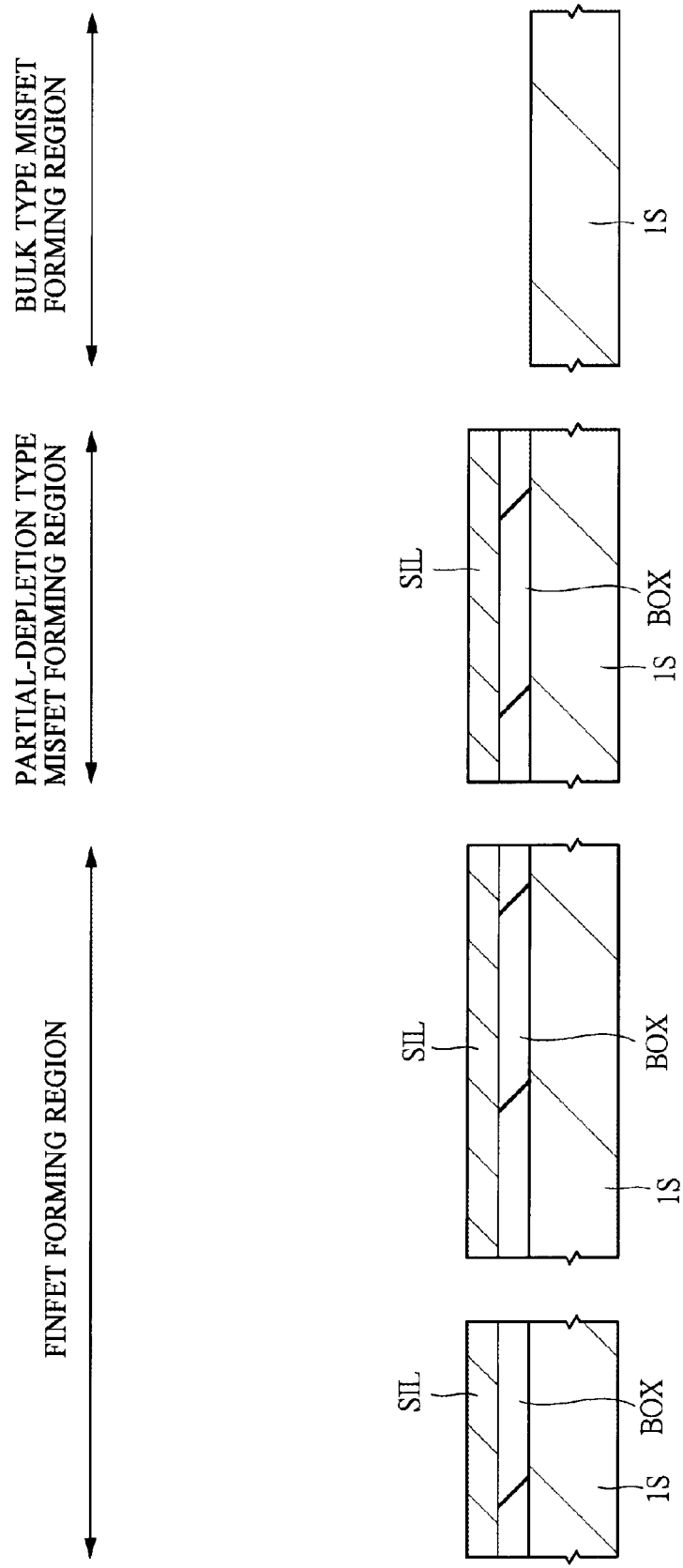
FIG. 10 is a cross-sectional view showing the process of manufacturing the semiconductor device subsequent to FIG. 9.

Subsequently, as shown in FIG. 10, by the etching using the patterned resist film FR1 as a mask, the pad oxide film POX1, the silicon layer SIL and the buried insulating layer BOX formed in the bulk type MISFET forming region are sequentially removed. After that, the patterned resist film FR1 is removed, and the pad oxide film POX1 formed in the FINFET forming region and the partial-depletion type MISFET forming region are also removed.

Figure 11:
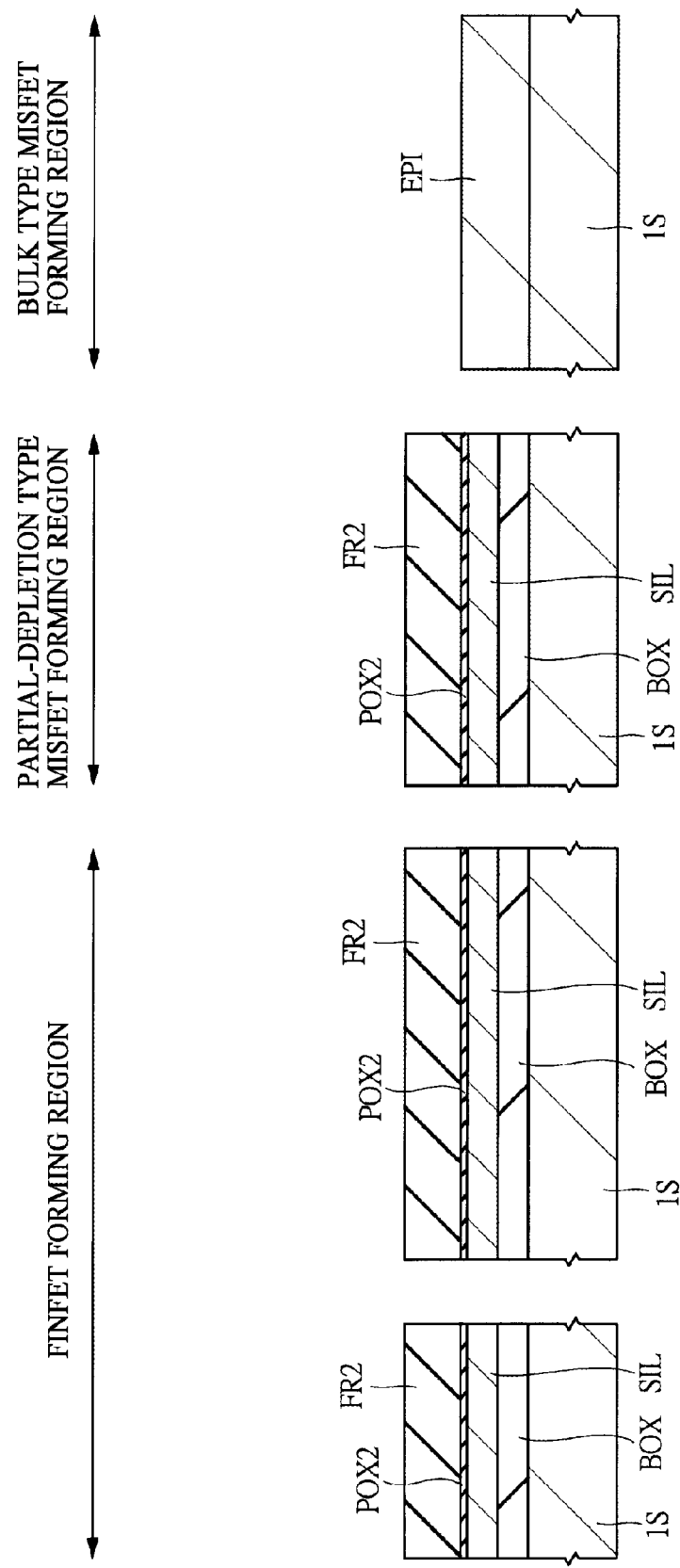
FIG. 11 is a cross-sectional view showing the process of manufacturing the semiconductor device subsequent to FIG. 10.

After that, as shown in FIG. 11, over the FINFET forming region, the partial-depletion type MISFET forming region and the bulk type MISFET forming region, a pad oxide film POX2 is formed, and, after that, over the pad oxide film POX2, a resist film FR2 is formed. Then, the resist film FR2 is patterned. The resist film FR2 is patterned so as to cover the FINFET forming region and the partial-depletion type MISFET forming region, and to expose the bulk type MISFET forming region. Subsequently, after removing the pad oxide film POX2 exposed in the bulk type MISFET forming region, over the substrate layer 1S exposed in the bulk type MISFET forming region, an epitaxial layer EPI is formed. The epitaxial layer EPI is constituted by a silicon layer, and is selectively formed in the bulk type MISFET forming region. The epitaxial layer EPI is formed up to a height that is approximately the same as that of the silicon layer SIL formed in the FINFET forming region and the partial-depletion type MISFET forming region.

Figure 12:
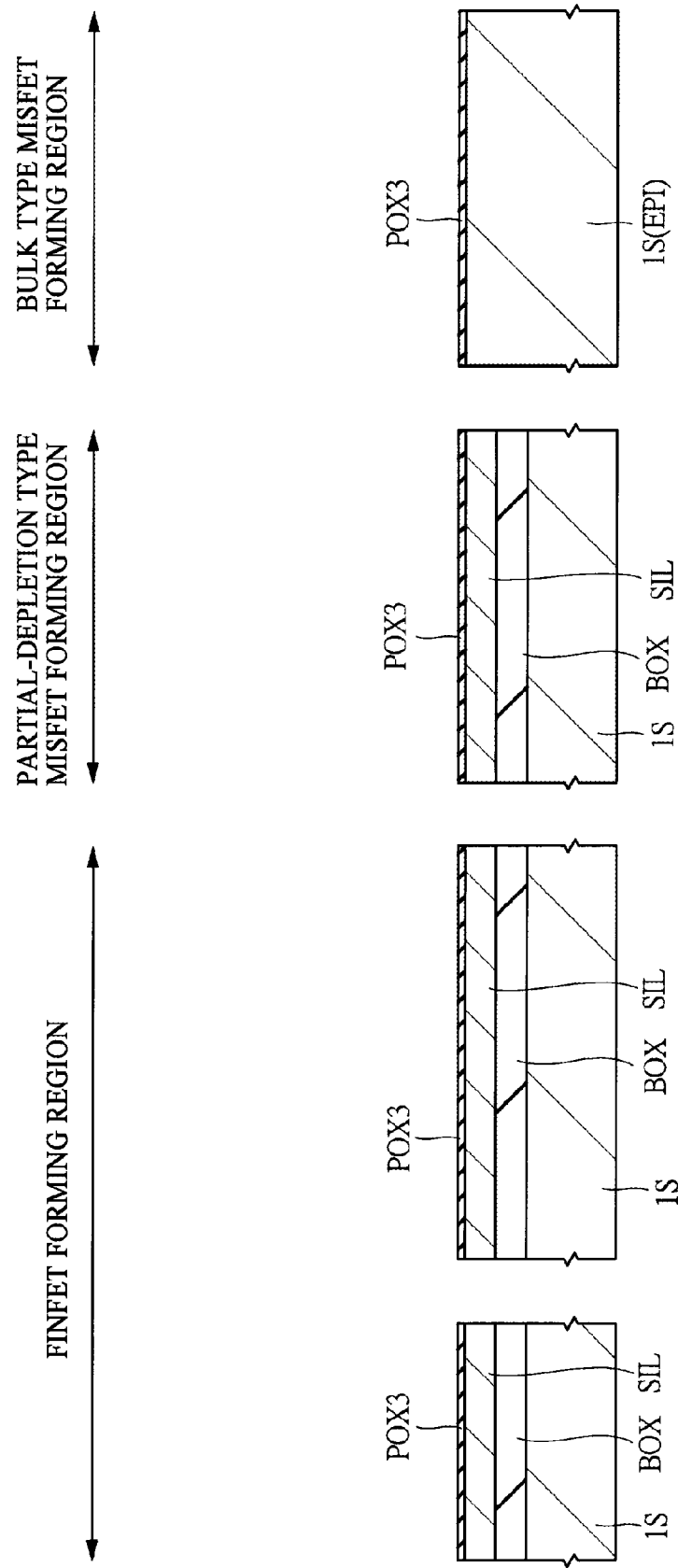
FIG. 12 is a cross-sectional view showing the process of manufacturing the semiconductor device subsequent to FIG. 11.

Next, as shown in FIG. 12, the patterned resist film FR2 and the pad oxide film POX2 formed under the resist film FR2 are removed, and, after that, over the FINFET forming region, the partial-depletion type MISFET forming region and the bulk type MISFET forming region, a pad oxide film POX3 is formed again. Then, although diagrammatic representation is omitted, a trench is formed in the SOI substrate using a photolithographic technique and an etching technique. The trench is formed, for example, in the partial-depletion type MISFET forming region and the bulk type MISFET forming region. The trench may be formed so as to reach the buried insulating layer BOX in the partial-depletion type MISFET forming region. This may completely separate the active region in which the element is to be formed in the partial-depletion type MISFET forming region.

Then, over the SOI substrate in which the trench is formed, a silicon oxide film is formed to be buried inside the trench. Then, by removing the unnecessary silicon oxide film formed over the SOI substrate, for example, by a CMP (Chemical Mechanical Polishing) method to leave the silicon oxide film only inside the trench, it is possible to form an element isolation region (not shown) in which the silicon oxide film is buried inside the trench.

Figure 13:
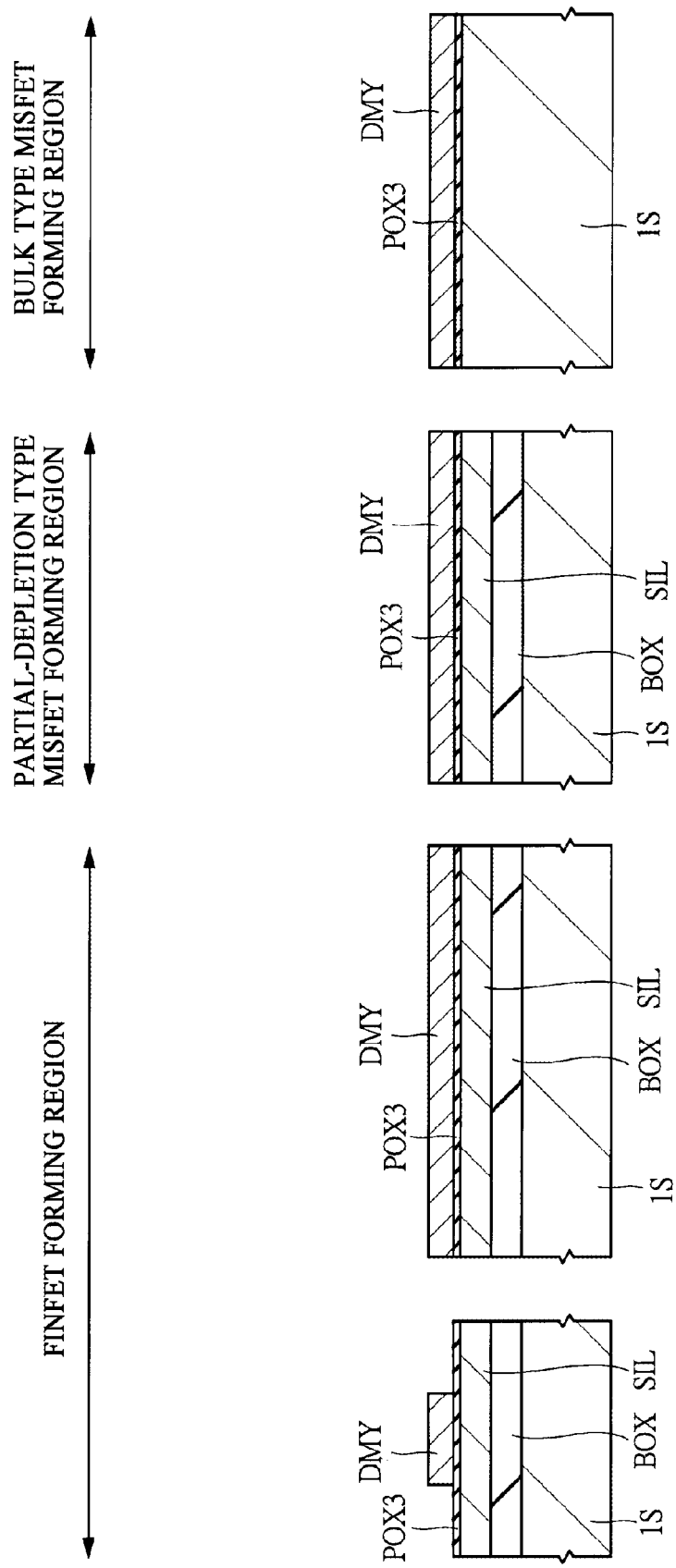
FIG. 13 is a cross-sectional view showing the process of manufacturing the semiconductor device subsequent to FIG. 12.

Subsequently, as shown in FIG. 13, over the pad oxide film POX3, a dummy film DMY is formed. The dummy film may be formed, for example, from an amorphous silicon film. Into the amorphous silicon film, fluorine (F) is implanted so that polycrystalline growth hardly occurs. This may suppress the roughness of a fin pattern caused by polycrystalline grains (crystalline grains). Meanwhile, as an atom to be introduced into the amorphous silicon film, carbon or an inert gas such as argon may be used in addition to fluorine.

After that, the photolithographic technique and etching technique are used to pattern the dummy film DMY. The dummy film DMY is patterned so as to form a dummy pattern for forming the fin in the FINFET forming region, and, at the same time, to cover the whole surface of the partial-depletion type MISFET forming region and the bulk type MISFET forming region.

Figure 14:
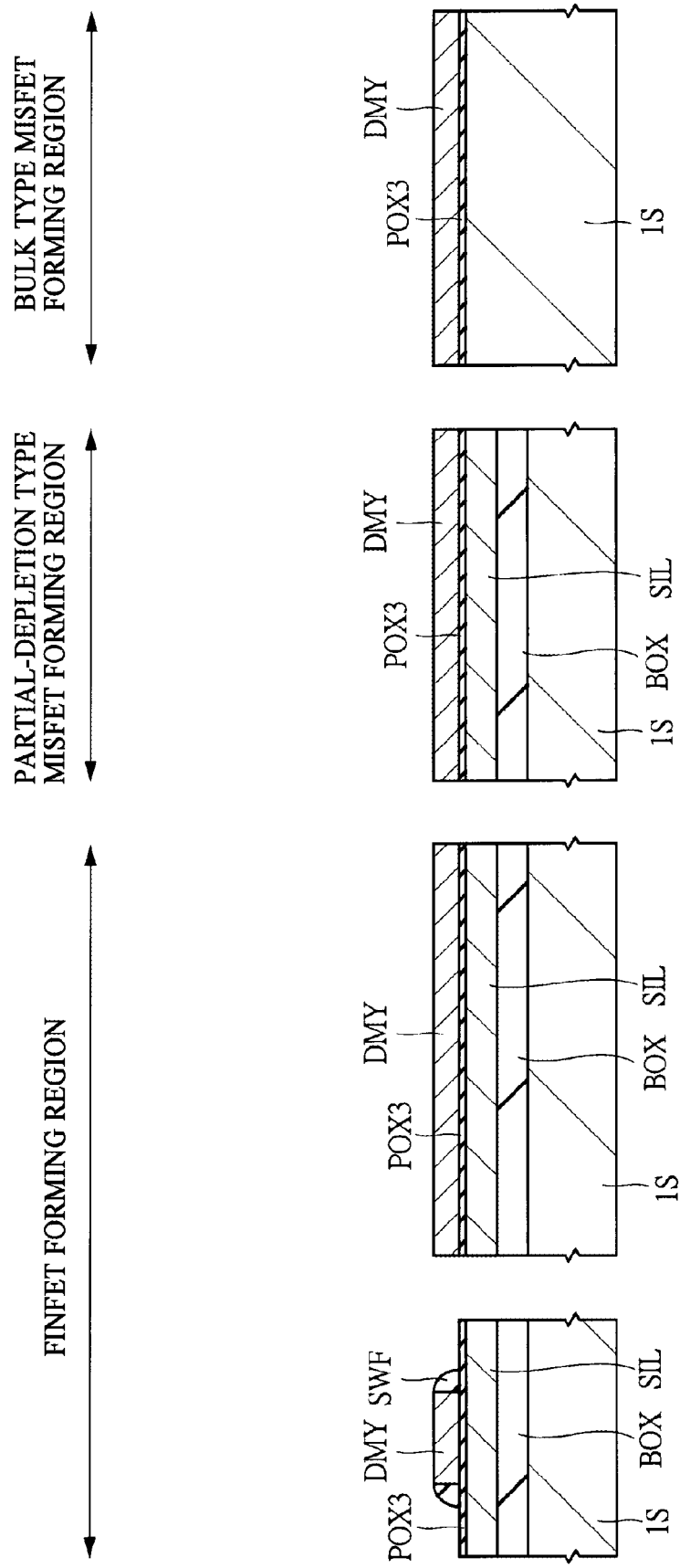
FIG. 14 is a cross-sectional view showing the process of manufacturing the semiconductor device subsequent to FIG. 13.

Then, as shown in FIG. 14, so as to cover the dummy film DMY, a silicon oxide film is formed over the FINFET forming region, the partial-depletion type MISFET forming region and the bulk type MISFET forming region. The silicon oxide film may be formed, for example, by a CVD method. Subsequently, the silicon oxide film is subjected to anisotropic etching to form the sidewall SWF constituted by the silicon oxide film on the side wall of the dummy film DMY (the dummy pattern), in the FINFET forming region. On the other hand, in the partial-depletion type MISFET forming region and the bulk type MISFET forming region, all the silicon oxide film is removed to expose the dummy film DMY.

Figure 15:
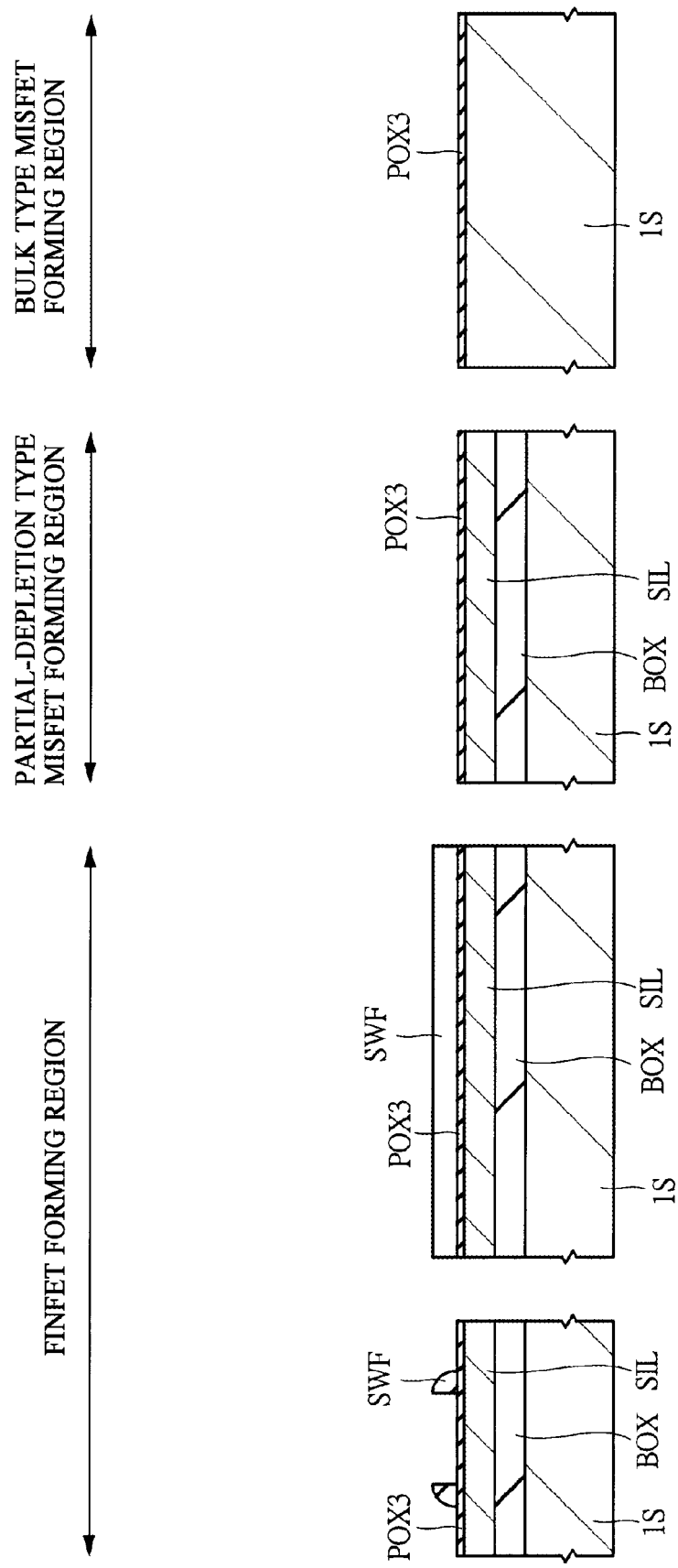
FIG. 15 is a cross-sectional view showing the process of manufacturing the semiconductor device subsequent to FIG. 14.

Next, as shown in FIG. 15, the exposed dummy film DMY is removed. The dummy film DMY may be removed, for example, by wet etching. As the result, in the FINFET forming region, the dummy film DMY formed in a state of being inserted between sidewalls SWF is removed, and, in the partial-depletion type MISFET forming region and the bulk type MISFET forming region, all the dummy film DMY is removed to expose the pad oxide film POX3. The sidewall SWF works so as to determine the fin width of the FINFET. In Example 1, since the width of the sidewall SWF determining the fin width of the FINFET is determined by the thickness of the deposited silicon oxide film, not by photolithography, the sidewall SWF has a uniform line width. Accordingly, processing the fin using the sidewall SWF as a mask enables forming the fin with a fin width of thin and uniform line width.

Figure 16:
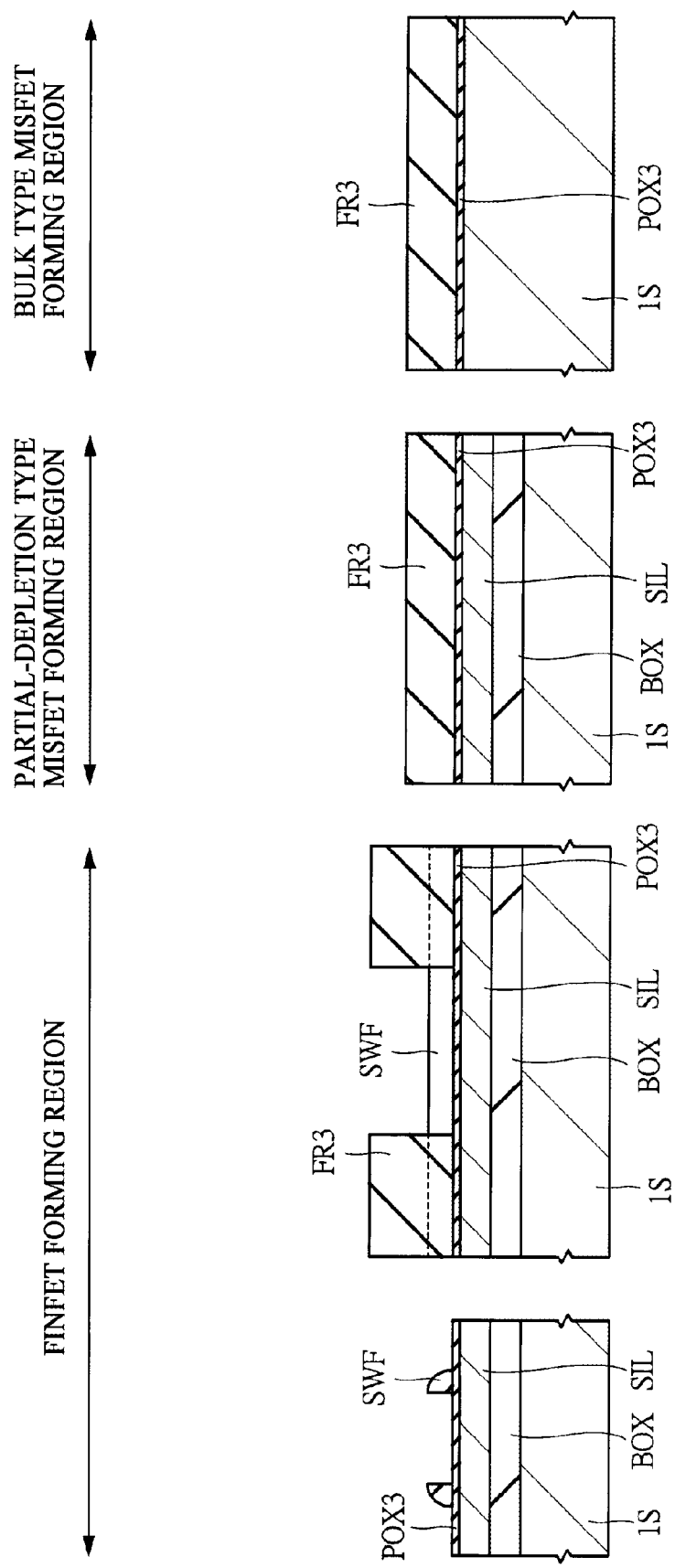
FIG. 16 is a cross-sectional view showing the process of manufacturing the semiconductor device subsequent to FIG. 15.

Subsequently, as shown in FIG. 16, in the FINFET forming region, a resist film FR3 is formed over the pad oxide film POX3 in which the sidewall SWF is formed. Further, in the partial-depletion type MISFET forming region and the bulk type MISFET forming region, too, the resist film FR3 is formed over the pad oxide film POX3. After that, the resist film FR3 is patterned using the photolithographic technique. The resist film FR3 is patterned so that the resist film FR3 remains in a region in which the source region or the drain region is to be formed in the FINFET forming region, and that the resist film FR3 remains in the whole surface in the partial-depletion type MISFET forming region and the bulk type MISFET forming region.

Figure 17:
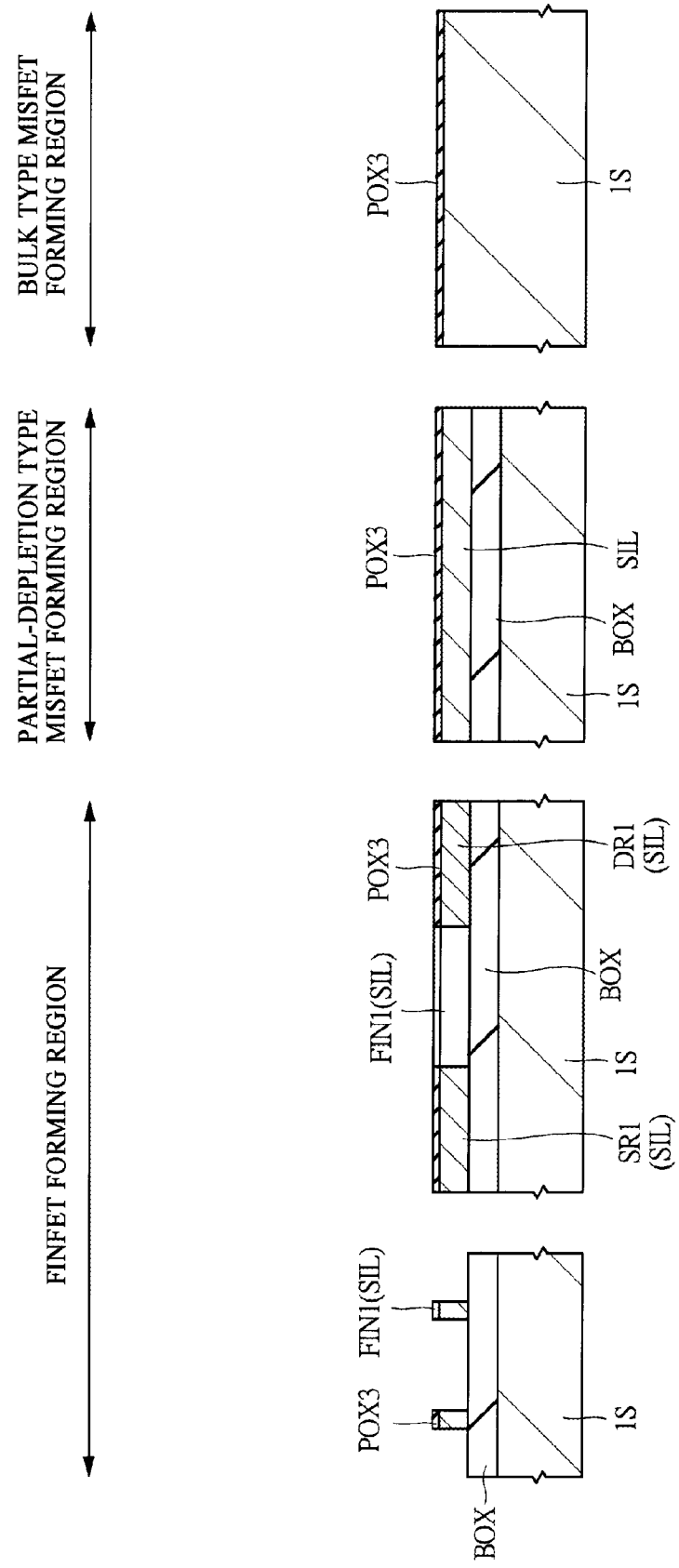
FIG. 17 is a cross-sectional view showing the process of manufacturing the semiconductor device subsequent to FIG. 16.

Next, as shown in FIG. 17, using the patterned resist film FR3 as a mask, the silicon layer SIL of the SOI substrate is patterned. At this time, in the patterning of the silicon layer SIL, not only the resist film. FR3, but also the sidewall SWF formed from the silicon oxide film also works as a mask. As the result, the patterning of the silicon layer SIL processes the silicon layer SIL into the fin FIN1 in a rectangular parallelepiped shape, the source region SR1 connected to one end of the fin FIN1, and the drain region DR1 connected to the other end of the fin FIN1. After that, the resist film FR3 is removed. In this manner, in the FINFET forming region, the fin FIN1 in a rectangular parallelepiped shape, the source region SR1 and the drain region DR1 are formed, and, on the other hand, in the partial-depletion type MISFET forming region and the bulk type MISFET forming region, the pad oxide film POX3 is exposed.

Figure 18:
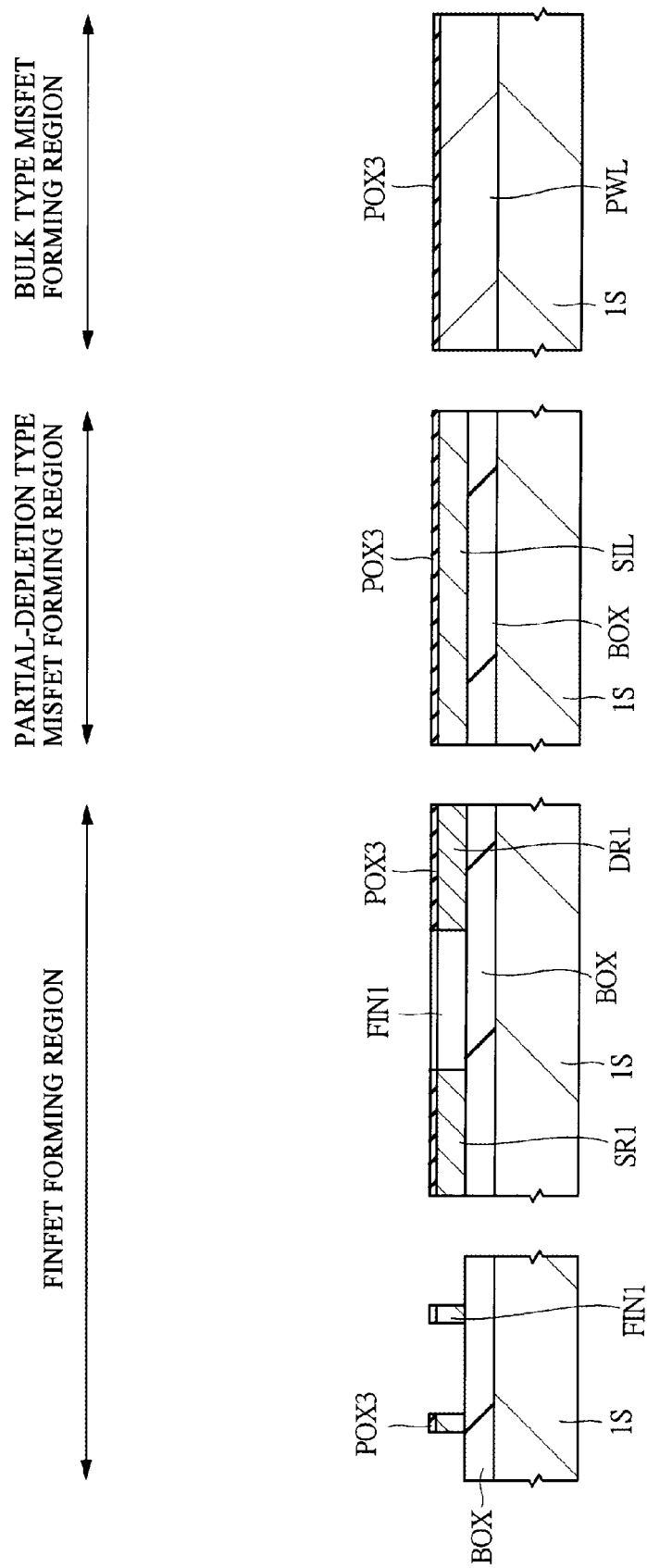
FIG. 18 is a cross-sectional view showing the process of manufacturing the semiconductor device subsequent to FIG. 17.

Then, as shown in FIG. 18, the p-type well PWL is formed in the bulk type MISFET forming region by using the photolithographic technique and ion implantation method. The p-type well PWL may be formed by introducing a p-type impurity such as boron (B) into the substrate layer 1S. After that, an impurity is introduced in order to adjust a threshold value.

Figure 19:
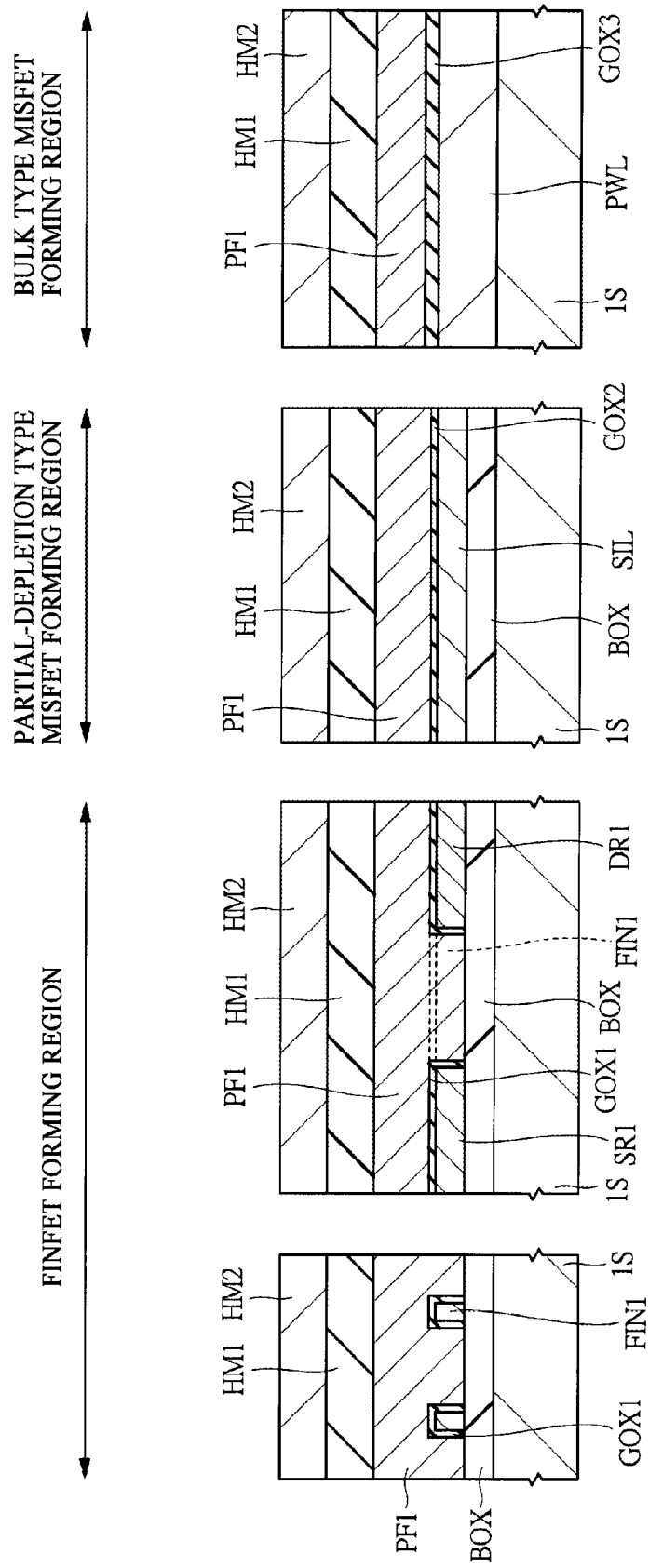
FIG. 19 is a cross-sectional view showing the process of manufacturing the semiconductor device subsequent to FIG. 18.

Subsequently, as shown in FIG. 19, in the FINFET forming region, the gate insulating film GOX1 is formed over the surface of the fin FIN1, and, in the partial-depletion type MISFET forming region, the gate insulating film GOX2 is formed over the silicon layer SIL. Further, in the bulk type MISFET forming region, the gate insulating film GOX3 is formed over the p-type well PWL. On this occasion, the gate insulating film GOX1 is formed so as to be thinner than the gate insulating film GOX2, and the gate insulating film GOX2 is formed so as to be thinner than the gate insulating film GOX3. The gate insulating film GOX1, the gate insulating film GOX2 and the gate insulating film GOX3 are formed, for example, from a silicon oxide film.

The gate insulating films GOX1 to GOX3 are however not limited to the silicon oxide film, but are variously changeable. For example, the gate insulating films GOX1 to GOX3 may be formed from a silicon oxynitride film (SiON). The silicon oxynitride film has a higher effect of suppressing the occurrence of an interface state and reducing the electron traps in the film, as compared with the silicon oxide film. Accordingly, it is possible to improve the hot-carrier resistance, and to improve the dielectric strength of the gate insulating films GOX1 to GOX3. Moreover, the silicon oxynitride film hardly allows impurities to pass therethrough as compared with the silicon oxide film. Hence, the use of the silicon oxynitride film as the gate insulating films GOX1 to GOX3 may suppress the variation in the threshold voltage caused by the diffusion of the impurities in the gate electrode toward the fin FIN1 side or the substrate layer 1S side.

Moreover, the gate insulating films GOX1 to GOX3 may be formed, for example, from a high dielectric film having a higher dielectric constant than the silicon oxide film. From the standpoint of excellent electric and physical stability of the silicon-silicon oxide interface having a high dielectric strength, conventionally, the silicon oxide film is used as the gate insulating films GOX1 to GOX3. Extremely thin thickness however has been required for the thickness of the gate insulating films GOX1 to GOX3 as the result of the microfabrication of elements. The use of such a thin silicon oxide film as the gate insulating films GOX1 to GOX3 leads to the occurrence of a so-called tunnel current, in which electrons flowing through the channel of the MISFET tunnel the barrier formed by the silicon oxide film to flow to the gate electrode.

Hence, a high dielectric constant film has been used, which may increase a physical film thickness even when the capacitance is equal, by using a material having a higher dielectric constant than the silicon oxide film. The high dielectric constant film may increase the physical film thickness even when the capacitance is kept to the same to reduce the leak current. The silicon nitride film is a film having a higher dielectric constant than the silicon oxide film, and, in Example 1 in particular, the use of a high dielectric constant film having a higher dielectric constant than the silicon nitride film is desirable.

For example, as a high dielectric constant film having a higher dielectric constant than the silicon nitride film, a hafnium oxide film (an $HfO_2$ film) being one of oxides of hafnium is used, and, in place of the hafnium oxide film, another hafnium-based insulating film such as an HfAlO film (a hafnium aluminate film), an HfON film (a hafnium oxynitride film), an HfSiO film (a hafnium silicate film), or an HfSiON film (a hafnium silicon oxynitride film) may also be used. Furthermore, a hafnium-based insulating film formed by introducing an oxide such as tantalum oxide, niobium oxide, titanium oxide, zirconium oxide, lanthanum oxide or yttrium oxide into these hafnium-based insulating films may also be used. The hafnium-based insulating film has a higher dielectric constant than the silicon oxide film or the silicon oxynitride film, the same as the hafnium oxide film, the same effect may be obtained as that in the case where the hafnium oxide film is used.

Next, over the gate insulating films GOX1 to GOX3, a polysilicon film PF1 is formed. The polysilicon film PF1 may be formed, for example, by using a CVD method. At this time, in the FINFET forming region, the polysilicon film PF1 is formed over the step caused by the fin FIN1, the step is also formed at the surface of the polysilicon film PF1. On this occasion, when forming the gate electrode by processing the polysilicon film PF1, the variation in the dimension of gate electrodes occurs. When the variation in the dimension of gate electrodes occurs, there is such an anxiety that the performance of transistors varies not to allow necessary transistor performances to be exerted. Hence, in Example 1, after forming the polysilicon film PF1, the surface of the polysilicon film PF1 is subjected to a flattening treatment. Specifically, for example, by a chemical mechanical polishing (CMP) method, the surface of the polysilicon film PF1 is flattened. As the result, the surface of the polysilicon film PF1 formed over the step caused by the fin FIN1 may be flattened to improve the accuracy of the processing dimension of the gate electrode. That is, the flattening of the surface of the polysilicon film PF1 may suppress the variation in the dimension of gate electrodes to be formed later, thereby achieving the improvement of transistor performances.

After performing the flattening treatment of the polysilicon film PF1, over the flattened polysilicon film PF1, the hard mask HM1 is formed, and, over the hard mask HM1, a hard mask HM2 is formed. Here, the hard mask HM1 is formed so as to have a larger height than the fin FIN1. The hard mask HM1 is formed, for example, from a silicon oxide film such as a TEOS film, a silicon nitride film, or a silicon oxynitride film, and the hard mask HM2 is formed, for example, from a film formed by adding fluorine to an amorphous silicon film. The hard mask HM2 may be formed in such a manner as forming, firstly, an amorphous silicon film over the hard mask HM1 and ion-implanting fluorine into the amorphous silicon film. The reason why fluorine is added to the amorphous silicon film is to suppress the polycrystalline growth of the amorphous silicon film, by a subsequent heat treatment when processing the gate electrodes G1 to G3. Meanwhile, an element to be added to the amorphous silicon film may be carbon or an inert element such as argon (Ar), in addition to fluorine.

Figure 20:
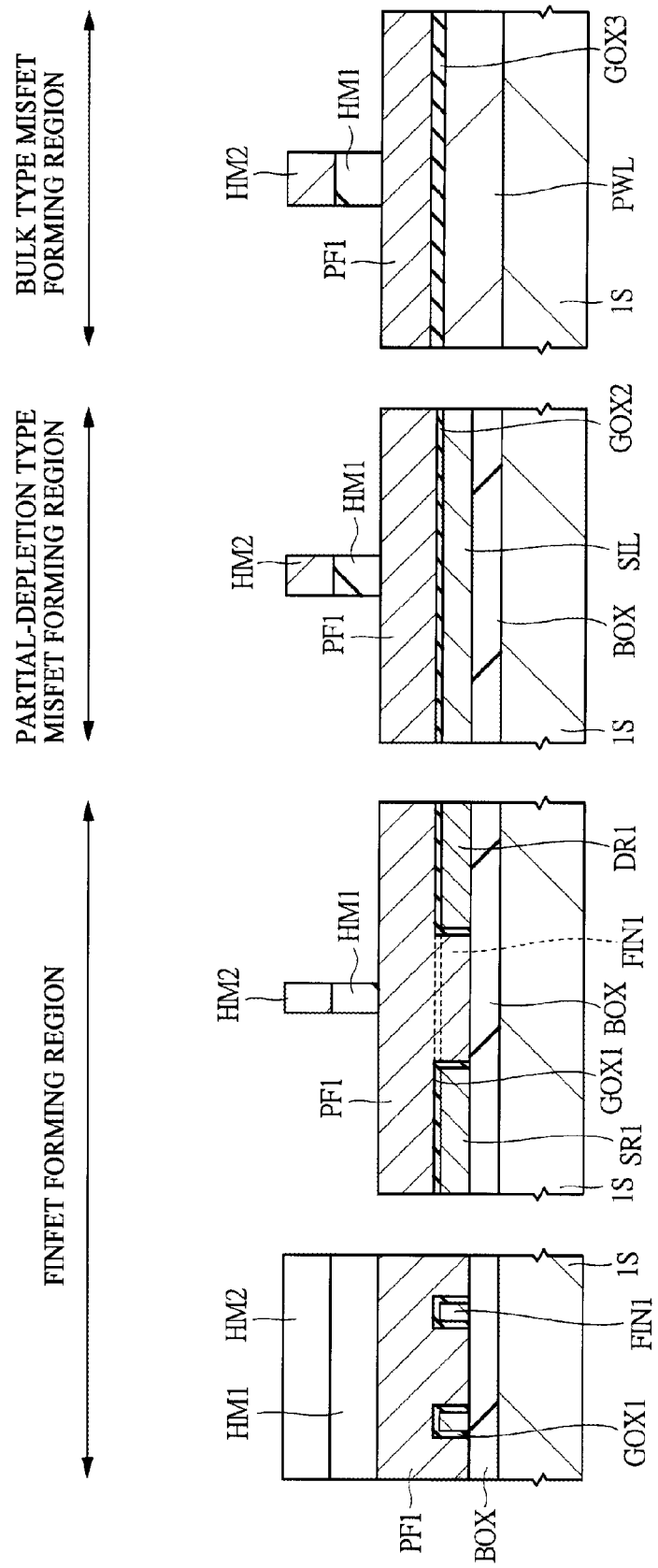
FIG. 20 is a cross-sectional view showing the process of manufacturing the semiconductor device subsequent to FIG. 19.

Subsequently, as shown in FIG. 20, the hard mask HM2 is patterned by using the photolithographic technique and etching technique. The hard mask HM2 is patterned so as to leave the hard mask HM2 in the gate electrode forming region. Specifically, the hard mask HM2 is patterned in accordance with respective gate electrodes to be formed in each of the FINFET forming region, the partial-depletion type MISFET forming region and the bulk type MISFET forming region. At this time, the width of the hard mask HM2 (which corresponds to the gate length of the gate electrode) is formed in the FINFET forming region so as to be thinner than the width of the hard mask HM2 (which corresponds to the gate length of the gate electrode) formed in the partial-depletion type MISFET forming region, and the width of the hard mask HM2 is formed in the partial-depletion type MISFET forming region so as to be thinner than the width of the hard mask HM2 (which corresponds to the gate length of the gate electrode) formed in the bulk type MISFET forming region. Then, by the etching using the patterned hard mask HM2 as a mask, the hard mask HM1 formed under the hard mask HM2 is patterned.

Figure 21:
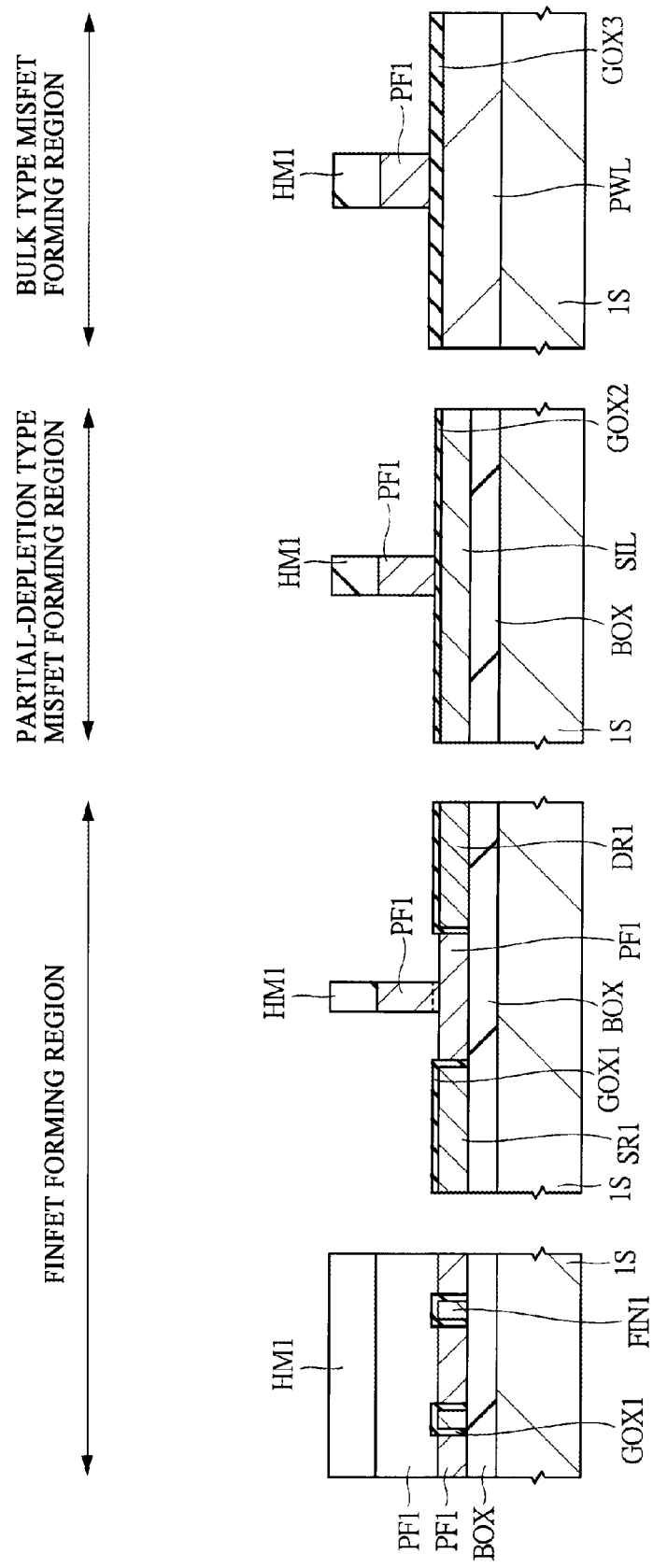
FIG. 21 is a cross-sectional view showing the process of manufacturing the semiconductor device subsequent to FIG. 20.
Figure 22:
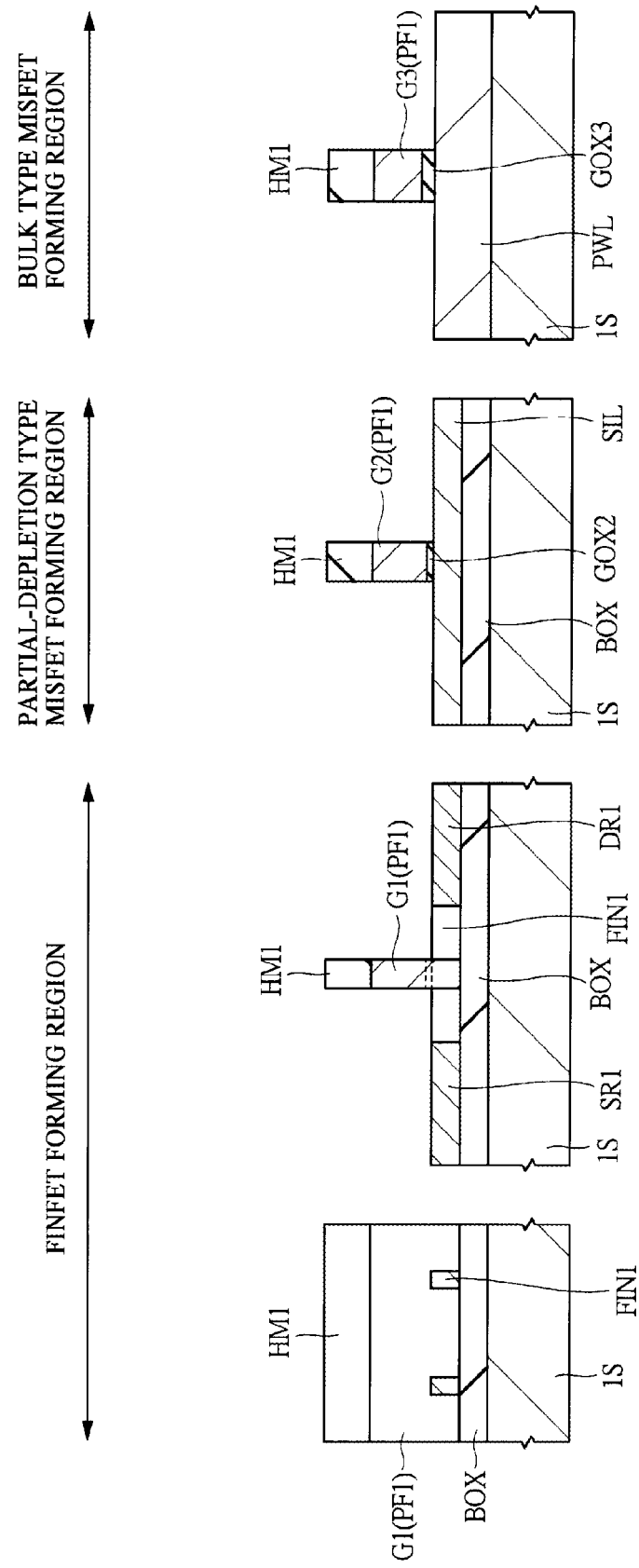
FIG. 22 is a cross-sectional view showing the process of manufacturing the semiconductor device subsequent to FIG. 21.

Next, as shown in FIG. 21, the polysilicon film PF1 is etched up to the exposure of the gate insulating film GOX1 formed in the upper surface of the fin FIN1, using the hard mask HM2 as a mask. At this time, since the hard mask HM2 is formed from an amorphous silicon film containing fluorine, the etching of the polysilicon film PF1 also etches the hard mask HM2. Then, for example, at the stage when the polysilicon film. PF1 is etched up to the exposure of the gate insulating film GOX1 formed in the upper surface of the fin FIN1, the hard mask HM2 disappears. Then, as shown in FIG. 22, the polysilicon film PF1 that is left by the height of the fin FIN1 is etched using the hard mask HM1 as a mask. Consequently, the gate electrode G1 is formed in the FINFET forming region so as to cross over the surface of the fin FIN1 in the region extending in the direction intersecting the extending direction of the fin FIN1 and intersecting the fin FIN1. On the other hand, in the partial-depletion type MISFET forming region, the gate electrode G2 is formed over the gate insulating film GOX2, and, in the bulk type MISFET forming region, the gate electrode G3 is formed over the gate insulating film. GOX3. At this time, they are formed so that the gate length of the gate electrode G1 is shorter than that of the gate electrode G2, and that the gate length of the gate electrode G2 is shorter than that of the gate electrode G3.

Here, the Example 1 is characterized in that the gate electrodes G1 to G3 are formed using the hard mask HM2 and the hard mask HM1. For example, although it is conceivable to form the gate electrodes G1 to G3 by processing the polysilicon film PF1 while using only the hard mask HM1 constituted by a silicon oxide film, in this case, for example, it becomes difficult to form, with a high accuracy, the gate electrode G1 of the FINFET having the smallest gate length. Specifically, the gate length of the gate electrode G1 of the FINFET is, for example, around ten and several nano meters, and the length is smaller than the size of crystal grains of the polysilicon film PF1 constituting the gate electrode G1. When the hard mask HM1 alone constituted by a silicon oxide film is used for processing the microfabricated gate electrode G1, irregularity (roughness) caused by crystal grains constituting the polysilicon film PF1 occurs at the surface of the gate electrode G1. That is, when the polysilicon film PF1 is etched using the hard mask HM1 alone constituted by a silicon oxide film, the etching is performed in a state in which the selection ratio between the silicon oxide film and the polysilicon film is high, and, in the etching with the high selection ratio, chemical etching advances along the grain boundary between crystal grains to form the irregularity along the grain boundary of crystal grains. That is, when the polysilicon film PF1 is etched from the beginning with the hard mask HM1 constituted by a silicon oxide film, the roughness (the irregularity) along the grain boundary between crystal grains is formed at the edge surface of the gate electrode G1 to deteriorate the shape of the microfabricated gate electrode G1.

Hence, in Example 1, the polysilicon film PF1 is etched using the hard mask HM2 constituted by an amorphous silicon film into which fluorine is introduced. The use of an amorphous silicon film into which fluorine is introduced as the hard mask HM2, firstly, makes it possible to prevent the crystallization of the amorphous silicon film to a polysilicon film by a heat treatment performed after the formation of the hard mask HM2. That is, the implantation of an inactive ion such as fluorine into an amorphous silicon film makes it possible to suppress the crystallization of the amorphous silicon film. Consequently, the hard mask HM2 maintains the state of the amorphous silicon film. When etching the polysilicon film PF1 using the hard mask HM2 in this state, the etching of the polysilicon film PF1 advances while consuming the hard mask HM2 constituted by the amorphous silicon film. At this time, a first advantage is that the hard mask HM2 itself does not have crystal grains because the hard mask HM2 is formed from an amorphous silicon film to make it possible to suppress the roughness along the grain boundary of crystal grains. That is, as the result that the roughness of the hard mask HM2 itself may be made small, it is possible to suppress the reflection of the roughness of the hard mask HM2 to the polysilicon film PF1 to be processed, and to improve the processing accuracy of the polysilicon film PF1. Further, a second advantage is that the hard mask HM2 is formed from an amorphous silicon film, and that etching with a high rectangular property becomes possible in relation to the polysilicon film PF1 being a film to be processed. That is, it is assumed that the hard mask HM2 is etched together with the etching of the polysilicon film PF1, and the etching may be performed in a state in which the selectivity between the silicon oxide film and the polysilicon film is low. As described above, in the etching in a state having high selectivity between the silicon oxide film and the polysilicon film, chemical etching of the polysilicon film PF1 along the crystal grain boundary advances easily. In contrast, in Example 1, since etching may be performed in a state with low selectivity between the silicon oxide film and the polysilicon film, the chemical etching of the polysilicon film PF1 along the crystal grain boundary may be suppressed, and, as the result, it is possible to reduce the roughness of the gate electrode G1 and to improve the processing accuracy.

Meanwhile, in Example 1, firstly the etching of the polysilicon film PF1 utilizing the hard mask HM2 is performed, and, then, the etching of the polysilicon film PF1 utilizing the hard mask HM1 is performed. That is, in Example 1, the polysilicon film PF1 is processed by a two-stage etching utilizing hard masks of two layers. This is based on the reason shown below. Firstly, from the standpoint of improving the processing accuracy of the gate electrode G1, it is desirable to totally process the polysilicon film PF1 utilizing the hard mask HM2 constituted by an amorphous silicon film. The etching utilizing the hard mask HM2 as a mask is however performed in such a state that the selectivity between the silicon oxide film and the polysilicon film PF1 is lowered, and, therefore, when all the polysilicon film PF1 is etched utilizing the hard mask HM1, the fin FIN1 itself constituted by silicon is also etched. Hence, until the exposure of the fin FIN1 itself, the etching utilizing the hard mask HM2 is performed while securing the processing accuracy of the gate electrode G1, and, after the exposure of the gate insulating film GOX1 formed in the upper surface of the fin FIN1, the etching is changed over to the etching utilizing the hard mask HM1. Thus, the polysilicon film PF1 is processed without etching the fin FIN1 itself covered by the gate insulating film GOX1. As described above, according to Example 1, the processing accuracy of the microfabricated gate electrode G1 may be improved.

Figure 23:
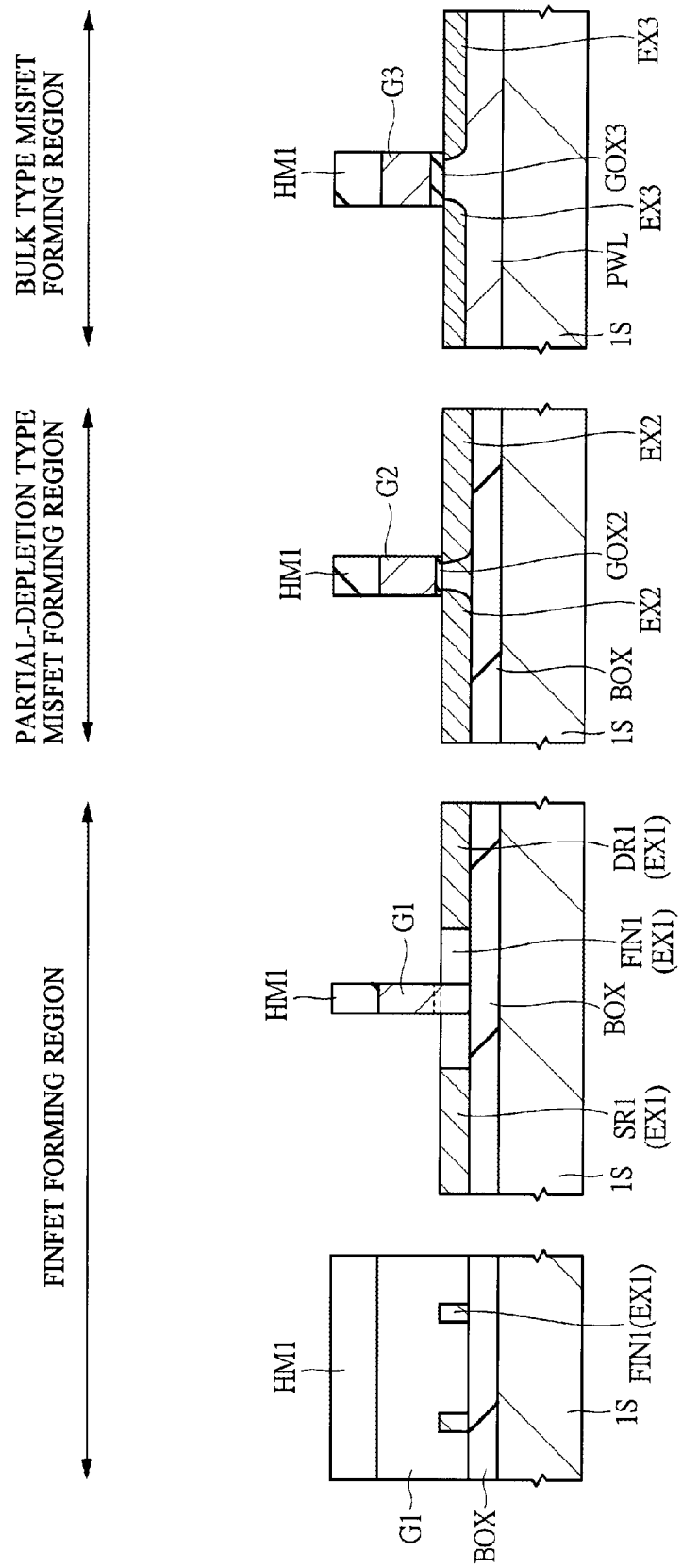
FIG. 23 is a cross-sectional view showing the process of manufacturing the semiconductor device subsequent to FIG. 22.

Subsequently, as shown in FIG. 23, the low concentration n-type impurity diffusion region (an extension region) EX1 is formed by introducing an n-type impurity such as phosphorous (P) or arsenic (As) into the source region SR1 and the drain region DR1 (including a part of the fin FIN1 not covered by the gate electrode G1) formed in the FINFET forming region, by using the photolithographic technique and oblique ion implantation method. At this time, the oblique ion implantation is performed from both side surfaces for the fin FIN1.

Next, the n-type impurity such as phosphorous (P) or arsenic (As) is introduced into a silicon layer aligned with the gate electrode G2 formed in the partial-depletion type MISFET forming region using the photolithographic technique and ion implantation method. This forms the low concentration n-type impurity diffusion region EX2. Further, the n-type impurity such as phosphorous (P) or arsenic (As) is introduced into the p-type well PWL aligned with the gate electrode G3 formed in the bulk type MISFET forming region using the photolithographic technique and ion implantation method. This forms the shallow n-type impurity diffusion region EX3. After that, an activation annealing (a heat treatment) is performed in order to activate the introduced impurity.

Here, as the method of forming the low concentration n-type impurity diffusion regions EX1 and EX2, and the shallow n-type impurity diffusion region EX3, a gas cluster ion beam (GCIB) may be used in place of the ion implantation method. The gas cluster ion beam is a charged beam of a cluster mainly singly charged and including hundreds to tens of thousands of molecules. The gas cluster ion beam has such characteristics that the damage given to a solid surface is small when it collides against the solid surface because the energy per one molecule is very small as compared with usual ion beams (a single charge per one molecule), and that it may flatten the solid surface caused by the effect of spattering in the lateral direction (lateral sputtering) upon the collision or of the lateral movement of the material. In this case, in the p-channel type MISFET, a decaboron cluster may be used, but, in the n-channel type MISFET, since no cluster ion exists, a neutral carbon cluster is used. That is, in the n-channel type MISFET, the carbon cluster is pre-implanted, and, after that, the n-type impurity such as phosphorous (P) or arsenic (As) is implanted to enable the profile equalization.

Meanwhile, it is also possible to perform ion implantation for forming a halo region in order to suppress the punchthrough, although not diagrammatically represented in FIG. 23. Further, although not diagrammatically represented in FIG. 23, it is also possible to grow selectively silicon (Si) or silicon germanium (SiGe) over the source region SR1 or the drain region DR1. This may increase the volume of silicon constituting the source region SR1 or the drain region DR1 to enable the effect of reducing the parasitic resistance to be obtained. Further, by increasing the volume of single-crystalline silicon in the source region SR1 or the drain region DR1, the seed of crystallization remains even after the ion implantation to enable the recrystallization after the annealing. That is, since the single-crystalline silicon region remains abundantly in the source region SR1 or the drain region DR1 after the annealing, the parasitic resistance may be reduced as compared with the case of an amorphous structure or polycrystalline structure.

Figure 24:
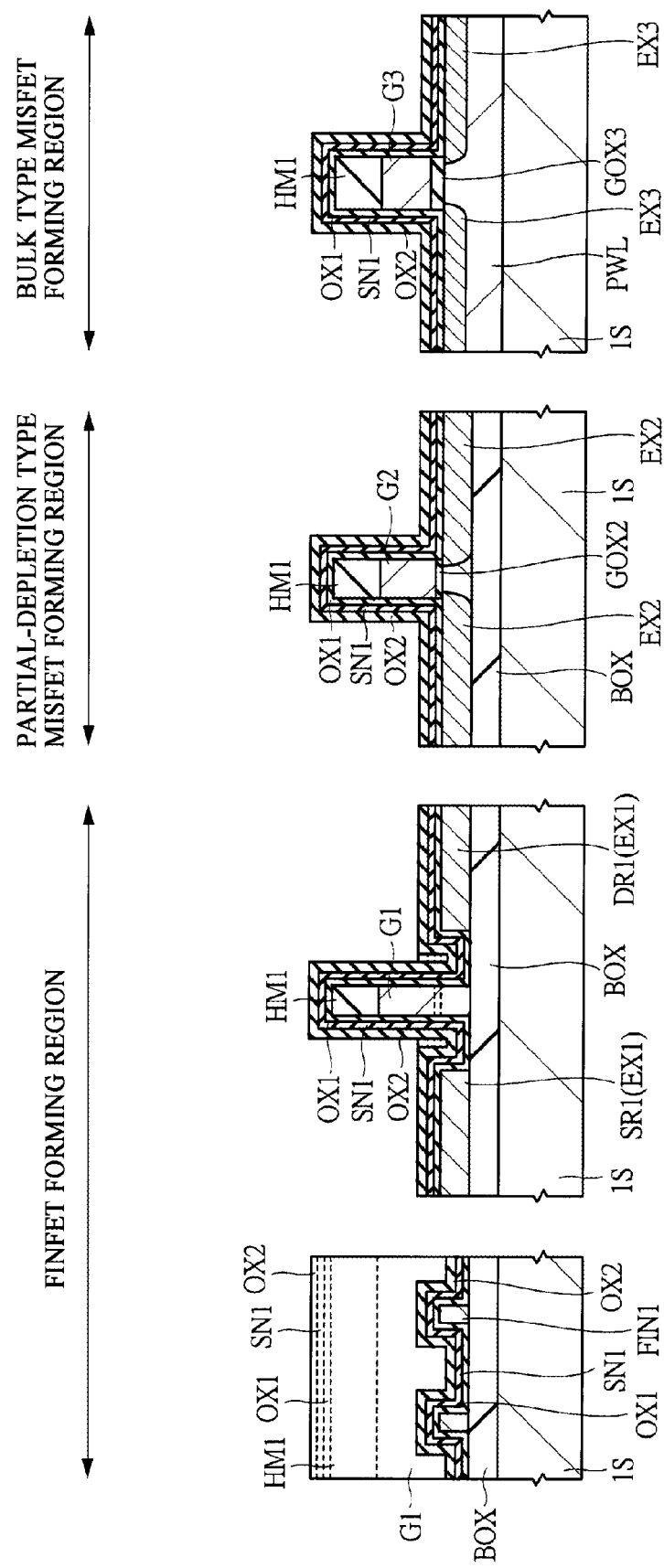
FIG. 24 is a cross-sectional view showing the process of manufacturing the semiconductor device subsequent to FIG. 23.

Subsequently, as shown in FIG. 24, the laminated film including the silicon oxide film OX1, the silicon nitride film SN1 and the silicon oxide film OX2 is formed over the whole main surface of the SOI substrate. At this time, in the FINFET forming region, the laminated film is formed so as to cover the fin FIN1 and the gate electrode G1 (including the hard mask HM1, too). In the same manner, in the partial-depletion type MISFET forming region, the laminated film is formed so as to cover the gate electrode G2 (including the hard mask HM1), and, in the bulk type MISFET forming region, the laminated film is formed so as to cover the gate electrode G3 (including the hard mask HM1).

Figure 25:
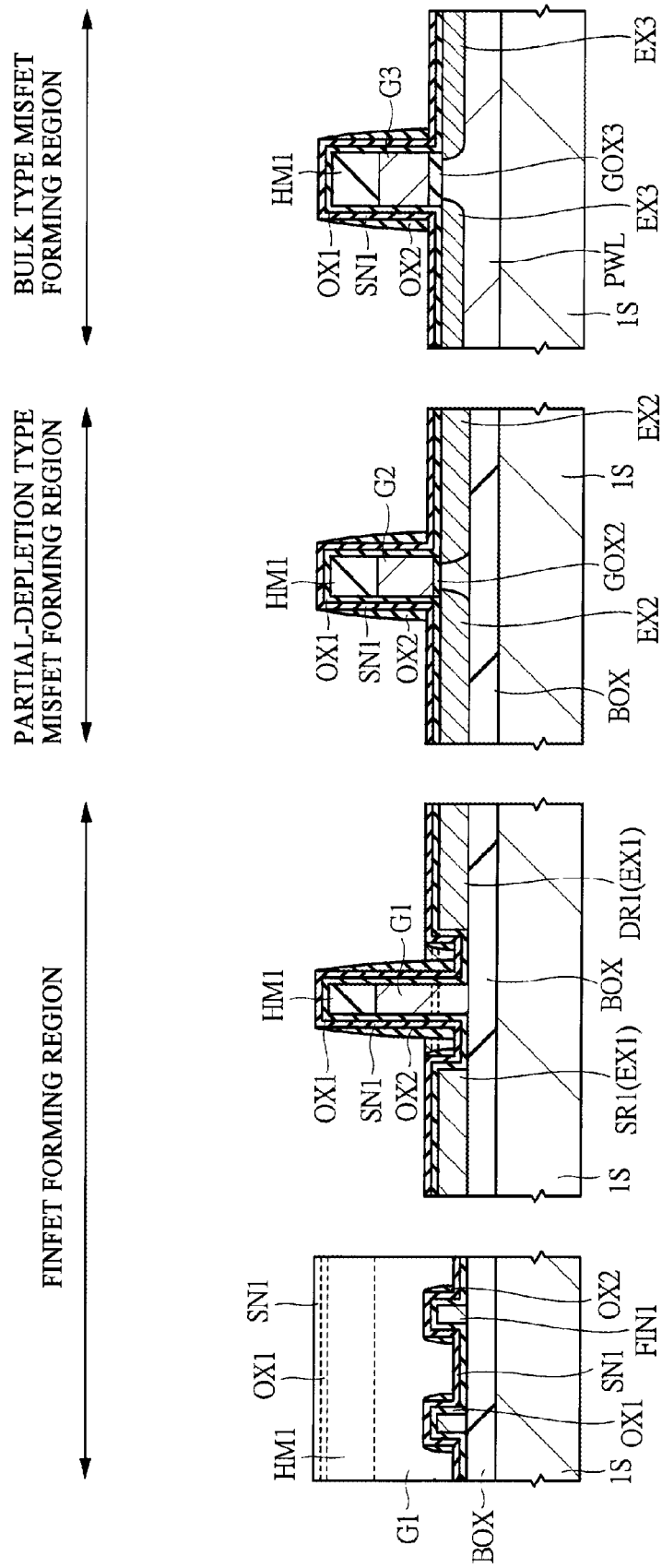
FIG. 25 is a cross-sectional view showing the process of manufacturing the semiconductor device subsequent to FIG. 24.

Next, as shown in FIG. 25, the silicon oxide film OX2 is subjected to anisotropic etching (dry etching). This enables the silicon oxide film OX2 in the sidewall state to be formed on the side wall of the fin FIN1 and the side wall of the gate electrode G1 (including the hard mask HM1, too) in the FINFET forming region. In the same manner, in the partial-depletion type MISFET forming region, the silicon oxide film OX2 in the sidewall state is formed on the side wall of the gate electrode G2 (including the hard mask HM1, too), and, in the bulk type MISFET forming region, silicon oxide film OX2 in the sidewall state is formed on the side wall of the gate electrode G3 (including the hard mask HM1, too).

Figure 26:
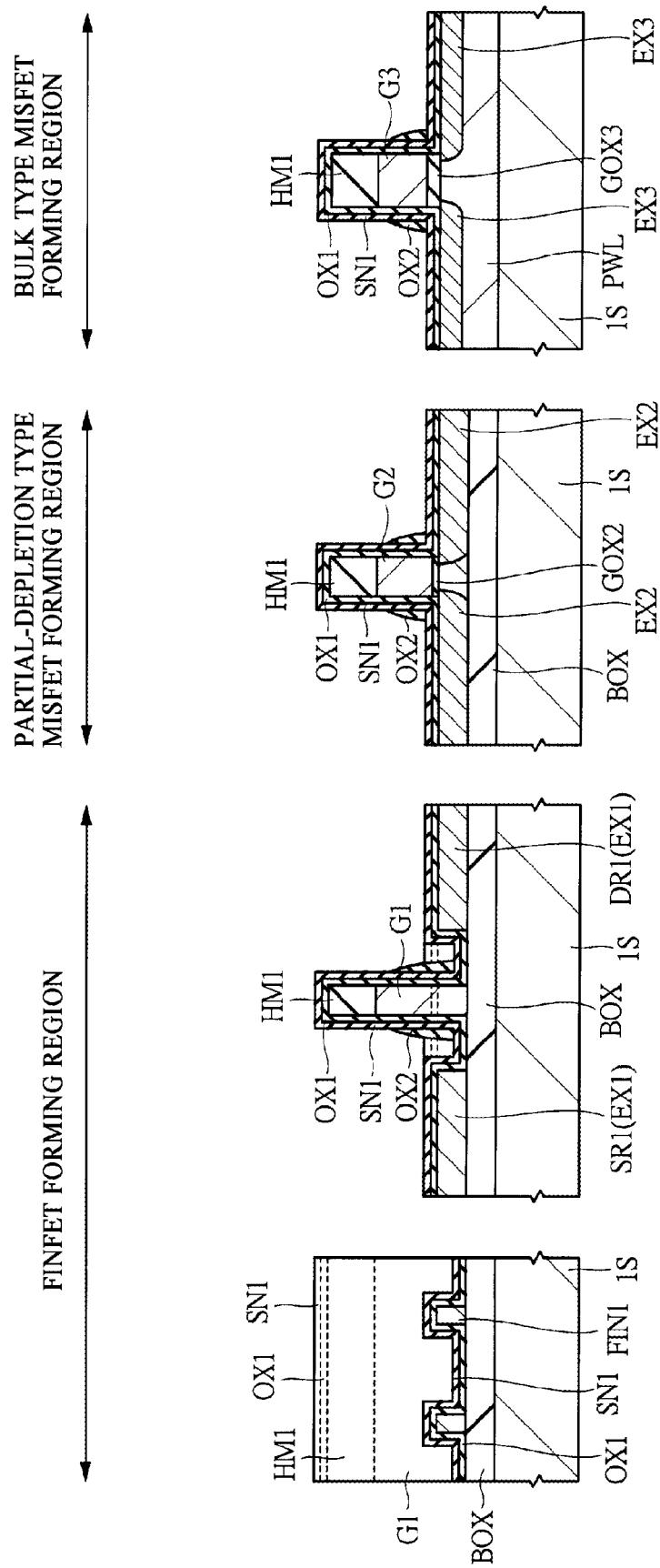
FIG. 26 is a cross-sectional view showing the process of manufacturing the semiconductor device subsequent to FIG. 25.

After that, as shown in FIG. 26, furthermore, the silicon oxide film OX2 is subjected to the over-etching. This removes the silicon oxide film OX2 in the sidewall state formed on the side wall of the fin FIN1 in the FINFET forming region. Then, the silicon oxide film OX2 in the sidewall state formed on the side wall of the gate electrode G1 and the hard mask HM1 also recedes, and the silicon oxide film OX2 in the sidewall state is formed only on the side wall of the gate electrode G1. This phenomenon occurs because the summed height of the gate electrode G1 and the hard mask HM1 is sufficiently high as compared with the height of the fin FIN1. That is, even when the silicon oxide film OX2 formed on the side wall of the fin FIN1 is sufficiently removed, since the summed height of the gate electrode G1 and the hard mask HM1 is formed so as to give a sufficiently large height as compared with the height of the fin FIN1, the operation of the over-etching for removing the silicon oxide film OX2 formed on the side wall of the fin FIN1 leaves the silicon oxide film OX2 in the sidewall state on the side wall of the gate electrode G1. In the same manner, the operation of the over-etching leaves the silicon oxide film OX2 in the sidewall state on the side wall of the gate electrode G2 in the partial-depletion type MISFET forming region, and the silicon oxide film OX2 in the sidewall state remains on the side wall of the gate electrode G3 also in the bulk type MISFET forming region.

Figure 27:
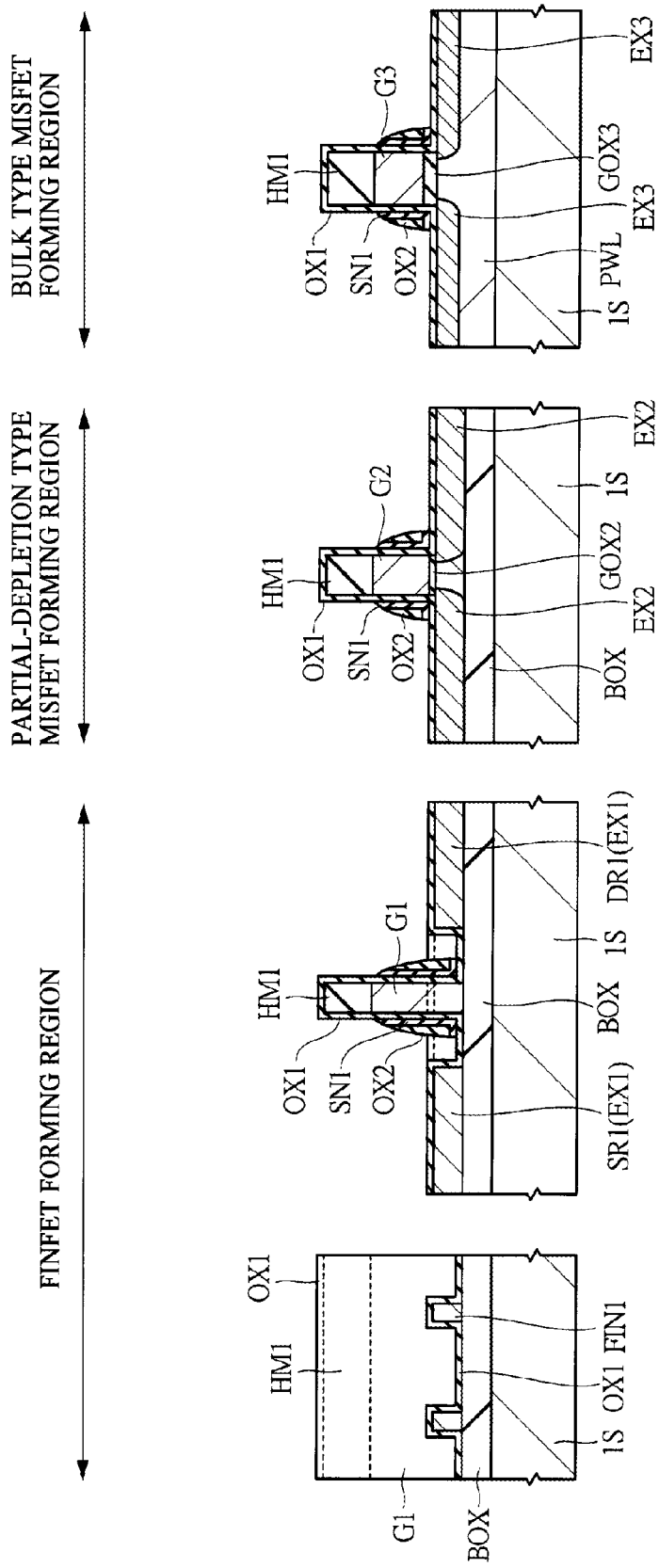
FIG. 27 is a cross-sectional view showing the process of manufacturing the semiconductor device subsequent to FIG. 26.

Next, as shown in FIG. 27, by the etching utilizing the silicon oxide film OX2 left in the sidewall state as a mask, the silicon nitride film SN1 is removed. For removing the silicon nitride film SN1, dry etching (anisotropic etching) or wet etching (isotropic etching) may be used. Consequently, in the FINFET forming region, all the silicon nitride film SN1 formed so as to cover the fin FIN1 is removed. On the other hand, on the side wall of the gate electrode G1, the silicon oxide film OX2 is formed in the sidewall state, and thus the silicon oxide film OX2 works as a mask to leave the silicon nitride film SN1 on the side wall of the gate electrode G1. In the same manner, the silicon oxide film OX2 formed in the sidewall state works as a mask, in the partial-depletion type MISFET forming region, the silicon nitride film SN1 is left on the side wall of the gate electrode G2, and in the bulk type MISFET forming region the silicon nitride film SN1 is left on the side wall of the gate electrode G3.

Figure 28:
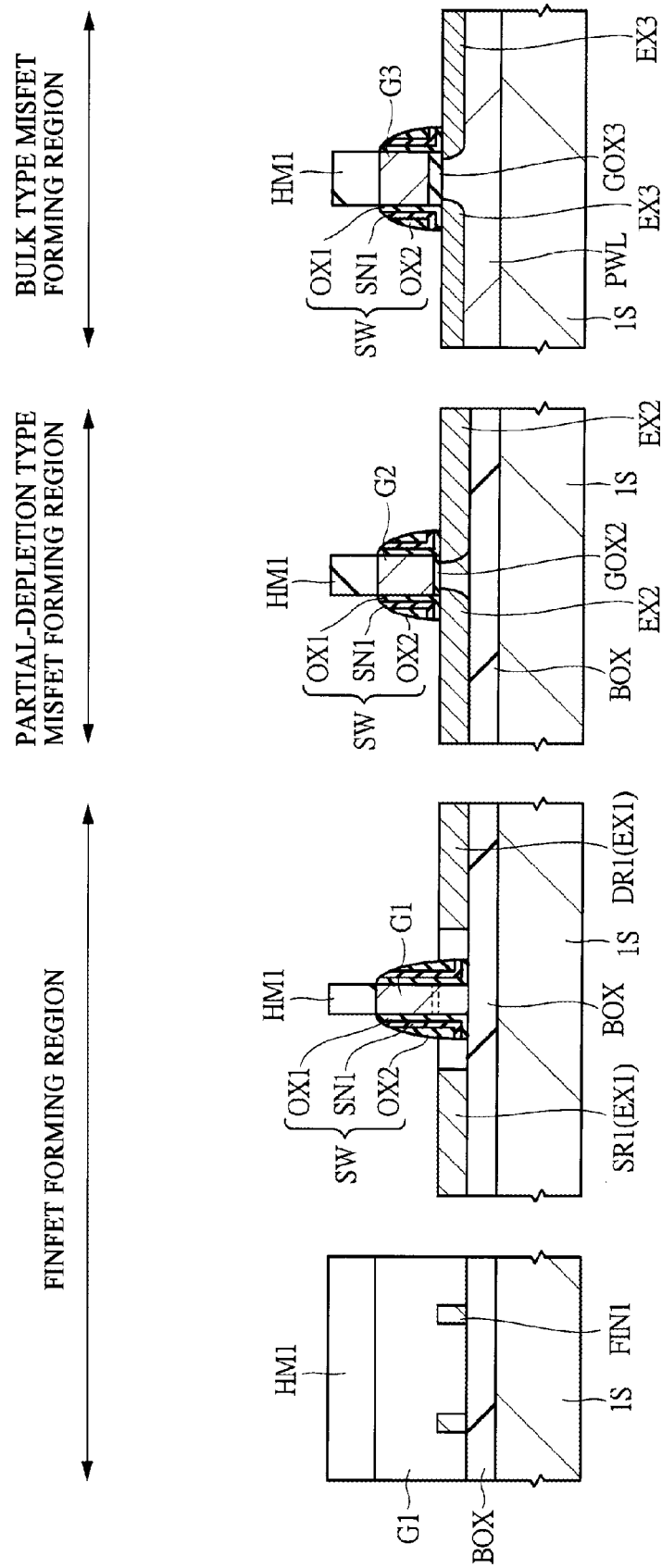
FIG. 28 is a cross-sectional view showing the process of manufacturing the semiconductor device subsequent to FIG. 27.

Subsequently, as shown in FIG. 28, by the etching using the remaining silicon oxide film OX2 and silicon nitride film SN1 as a mask, the silicon oxide film OX1 is removed. In the FINFET forming region, all the silicon oxide film OX1 formed so as to cover the fin FIN1 is removed, and, on the side wall of the gate electrode G1, the silicon oxide film OX2 and the silicon nitride film SN1 formed in the sidewall state work as a mask to leave the silicon oxide film OX1. In the same manner, in the partial-depletion type MISFET forming region, the silicon oxide film OX1 remains on the side wall of the gate electrode G2, and, in the bulk type MISFET forming region, the silicon oxide film OX1 remains on the side wall of the gate electrode G3. At this time, the etching of the silicon oxide film OX1 is performed by wet etching. Accordingly, even when the silicon oxide film OX1 formed so as to cover the fin FIN1 is removed, damage given to the fin FIN1 may be suppressed, and, at the same time, the etching of the fin FIN1 itself may be suppressed. As described above, in Example 1, without etching the fin FIN1 itself, it is possible to remove the laminated film formed on the side wall of the fin FIN1, and to form the sidewall SW constituted by the silicon oxide film OX1, the silicon nitride film SN1 and the silicon oxide film OX2 on the side wall of the gate electrodes G1 to G3.

Here, the Example 1 is characterized in that the laminated film including the silicon oxide film OX1, the silicon nitride film SN1 and the silicon oxide film OX2 is used in order to actualize such a characteristic constitution that no sidewall is formed on the side wall of the fin FIN1, but that the sidewall SW is formed on side walls of the gate electrodes G1 to G3. This may lead to the formation of the sidewall SW on side walls of the gate electrodes G1 to G3 without the disappearance of the fin FIN1 itself.

The advantage obtained by forming the sidewall SW from the silicon oxide film OX1, the silicon nitride film SN1 and the silicon oxide film OX2, as described above, is explained. A first advantage is that, since the silicon oxide film OX1 formed so as to directly cover the fin FIN1 may be removed by wet etching, etching with a high selectivity may be actualized between the silicon oxide film OX1 and silicon to enable the formation of the sidewall SW on side walls of the gate electrodes G1 to G3 without the disappearance of the fin FIN1 itself.

A second advantage is that, since an intermediate layer constituted by the silicon nitride film SN1 works as an etching stopper when etching the uppermost layer constituted by the silicon oxide film OX2, the active region represented by the fin FIN1 may be protected even when over-etching is preformed in order to remove the silicon oxide film OX2 formed in portions having a high step.

Further, a third advantage is that, since the lowermost layer constituted by the silicon oxide film OX1 is formed under the intermediate layer constituted by the silicon nitride film SN1, the direct contact of the silicon nitride film SN1 to the active region represented by the fin FIN1 may be prevented to suppress stress or damage due to the silicon nitride film SN1, and to prevent the lowering of transistor performances.

Moreover, a fourth advantage is that a rough sidewall shape may be formed by the etching of the uppermost layer constituted by the silicon oxide film OX2 utilizing an existing etching technique. In Example 1, for example, the lowermost silicon oxide film OX1 has a thickness of 10 nm or less, and the silicon nitride film SN1 constituting the intermediate layer has a thickness of 10 to 30 nm. In addition, since the uppermost silicon oxide film OX2 has a thickness of several tens nm to several hundred nm, the anisotropic etching of the uppermost silicon oxide film OX2 having the largest thickness may approximately determine the shape of the sidewall SW constituted by the laminated film.

A fifth advantage is that the height of the hard mask HM1 is set to be greater than that of the fin FIN1. As the result, even when the silicon oxide film OX2 formed on the side wall of the fin FIN1 is removed by the over-etching, the silicon oxide film OX2 in the sidewall state may be left on side walls of the gate electrodes G1 to G3. That is, by setting the height of the hard mask HM1 formed in upper portions of the gate electrodes G1 to G3 to be greater than that of the fin FIN1, it is possible to actualize such a characteristic constitution in Example 1 as forming the sidewall SW on side walls of the gate electrodes G1 to G3, but forming no sidewall SW on the side wall of the fin FIN1.

Figure 29:
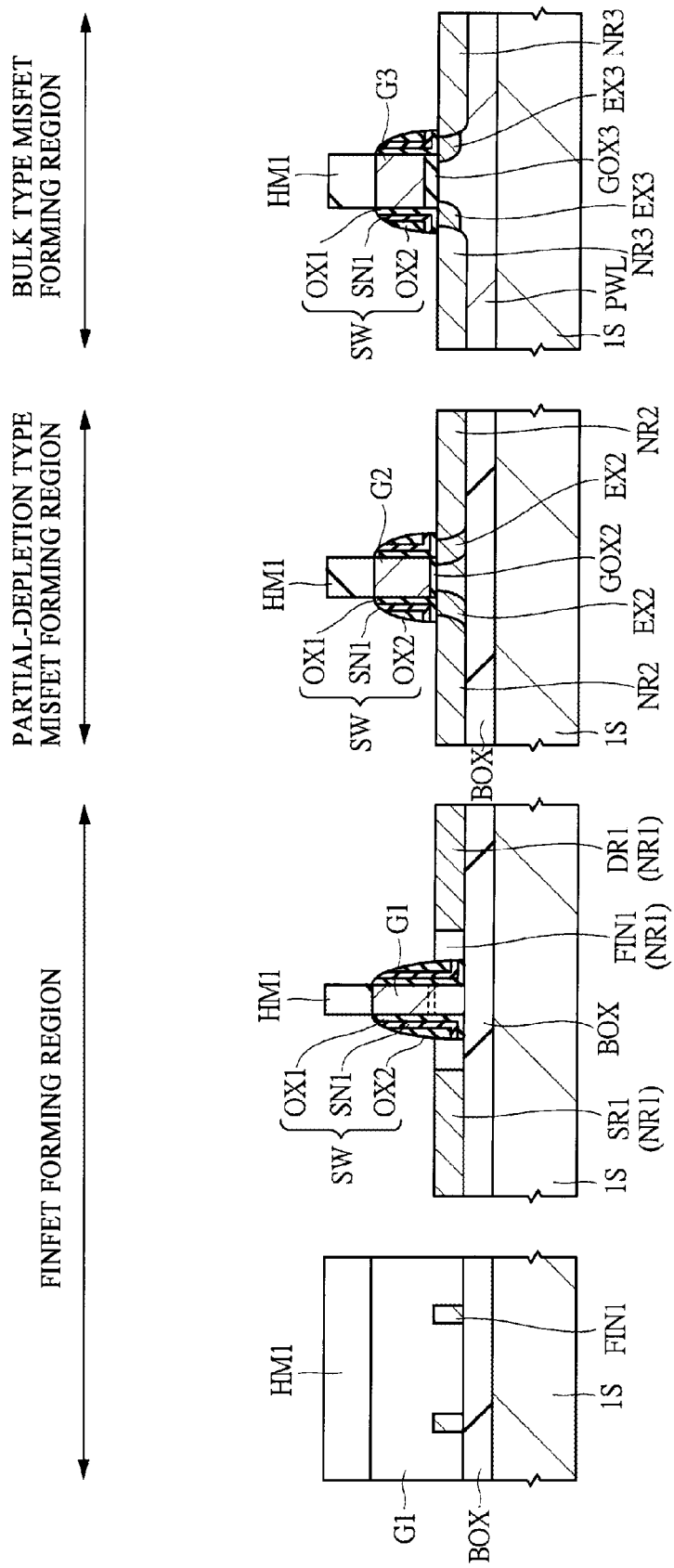
FIG. 29 is a cross-sectional view showing the process of manufacturing the semiconductor device subsequent to FIG. 28.

Next, as shown in FIG. 29, the high concentration n-type impurity diffusion region NR1 is formed by introducing the n-type impurity such as phosphorous (P) or arsenic (As) into the source region SR1 and the drain region DR1 (including a part of the fin FIN1 not covered by the gate electrode G1) formed in the FINFET forming region, by using the photolithographic technique and oblique ion implantation method. On this occasion, the oblique ion implantation is performed for the fin FIN1 from both side surfaces.

Next, the n-type impurity such as phosphorous (P) or arsenic (As) is introduced into the silicon layer aligned with the sidewall SW formed in the partial-depletion type MISFET forming region by using the photolithographic technique and ion implantation method. This forms the high concentration n-type impurity diffusion region NR2. Further, the n-type impurity such as phosphorous (P) or arsenic (As) is introduced into the p-type well PWL aligned with the sidewall SW formed in the bulk type MISFET forming region by using the photolithographic technique and ion implantation method.

This forms the deep n-type impurity diffusion region NR3. After that, the activation annealing (the heat treatment) is performed for activating the introduced impurity.

Here, as the method of forming the high concentration n-type impurity diffusion regions NR1 and NR2 and the deep n-type impurity diffusion region NR3, the gas cluster ion beam (GCIB) may be used in place of the ion implantation method.

In Example 1, in the FINFET forming region, the sidewall SW is formed on the side wall of the gate electrode G1, but, on the other hand, the sidewall SW formed on the side wall of the fin FIN1 is removed. Consequently, the sidewall SW is not obstructive when implanting the conductive impurity in a high concentration from the side wall of the fin FIN1, thus making it possible to practice the uniform and high concentration implantation of the impurity. As the result, according to the FINFET in Example 1, it is possible to achieve the improvement of the parasitic resistance at the side surface of the fin FIN1. That is, Example 1 is characterized in that the source region SR1 and the drain region DR1 are made to have the LDD (Lightly Doped Drain) structure by forming the sidewall SW on the side wall of the gate electrode G1, and that, on the other hand, the implantation of an impurity in a high concentration is made possible in such a state that the surface (the side wall and the upper face) of the fin FIN1 is exposed by removing the sidewall SW formed on the side wall of the fin FIN1. Consequently, according to Example 1, such a remarkable effect may be obtained that the reduction of the parasitic resistance in the fin FIN1 may be achieved.

Figure 30:
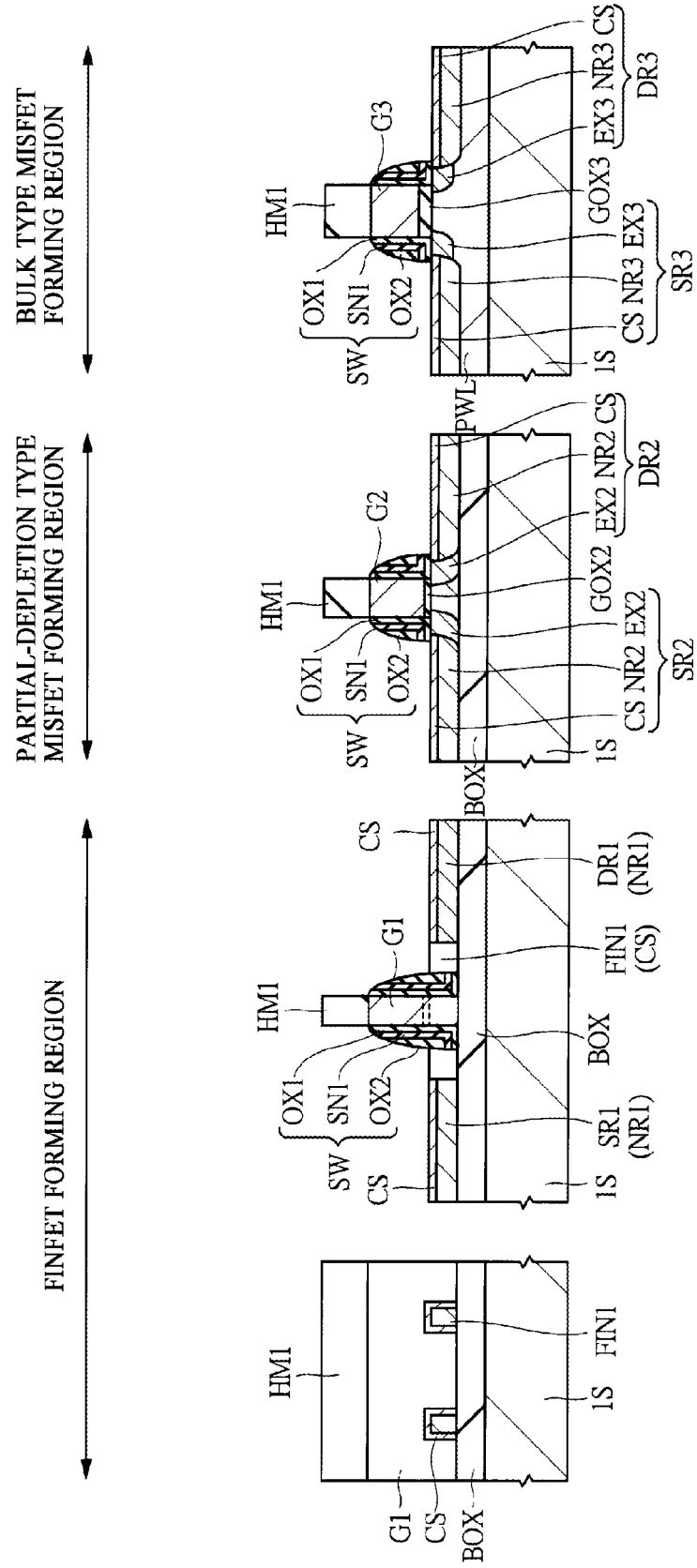
FIG. 30 is a cross-sectional view showing the process of manufacturing the semiconductor device subsequent to FIG. 29.

Subsequently, as shown in FIG. 30, over the whole surface including the FINFET forming region, the partial-depletion type MISFET forming region and the bulk type MISFET forming region, a cobalt film is formed, which is then subjected to a heat treatment. This forms the cobalt silicide film CS over the surface of the source region SR1, the drain region DR1, and the exposed fin FIN1 in the FINFET forming region. On the other hand, in the partial-depletion type MISFET forming region, the cobalt silicide film CS is formed over the surface of the high concentration n-type impurity diffusion region NR2. Furthermore, in the bulk type MISFET forming region, the cobalt silicide film CS is formed over the surface of the deep n-type impurity diffusion region NR3.

Meanwhile, Example 1 is constituted so that the cobalt silicide film CS is formed. A nickel silicide film, titanium silicide film or a platinum silicide film however may be formed in place of the cobalt silicide film CS, for example. As described above, it is possible to form the FINFET in the FINFET forming region, and to form the partial-depletion type MISFET in the partial-depletion type MISFET forming region. Furthermore, the bulk type MISFET may be formed in the bulk type MISFET forming region.

In the FINFET in Example 1, the sidewall SW is formed on the side wall of the gate electrode G1 in the FINFET forming region, but the sidewall SW formed on the side wall of the fin FIN1 is removed. This makes it possible to form a silicide film with low resistance over the surface of the fin FIN1, without receiving the inhibition from the sidewall SW. As the result, according to the FINFET in Example 1, it is possible to achieve the improvement of the parasitic resistance at the side surface of the fin FIN1. That is, the Example 1 is characterized in that, by forming the sidewall SW on the side wall of the gate electrode G1, the source region SR1 and the drain region DR1 are made to have the LDD (Lightly Doped Drain) structure, but that, by removing the sidewall SW formed on the side wall of the fin FIN1, it is possible to form the silicide film in a state where the surface (the side wall and upper face) of the fin FIN1 is exposed. Consequently, according to Example 1, it is possible to obtain such a remarkable effect that the reduction of the parasitic resistance at the fin FIN1 may be achieved.

Figure 31:
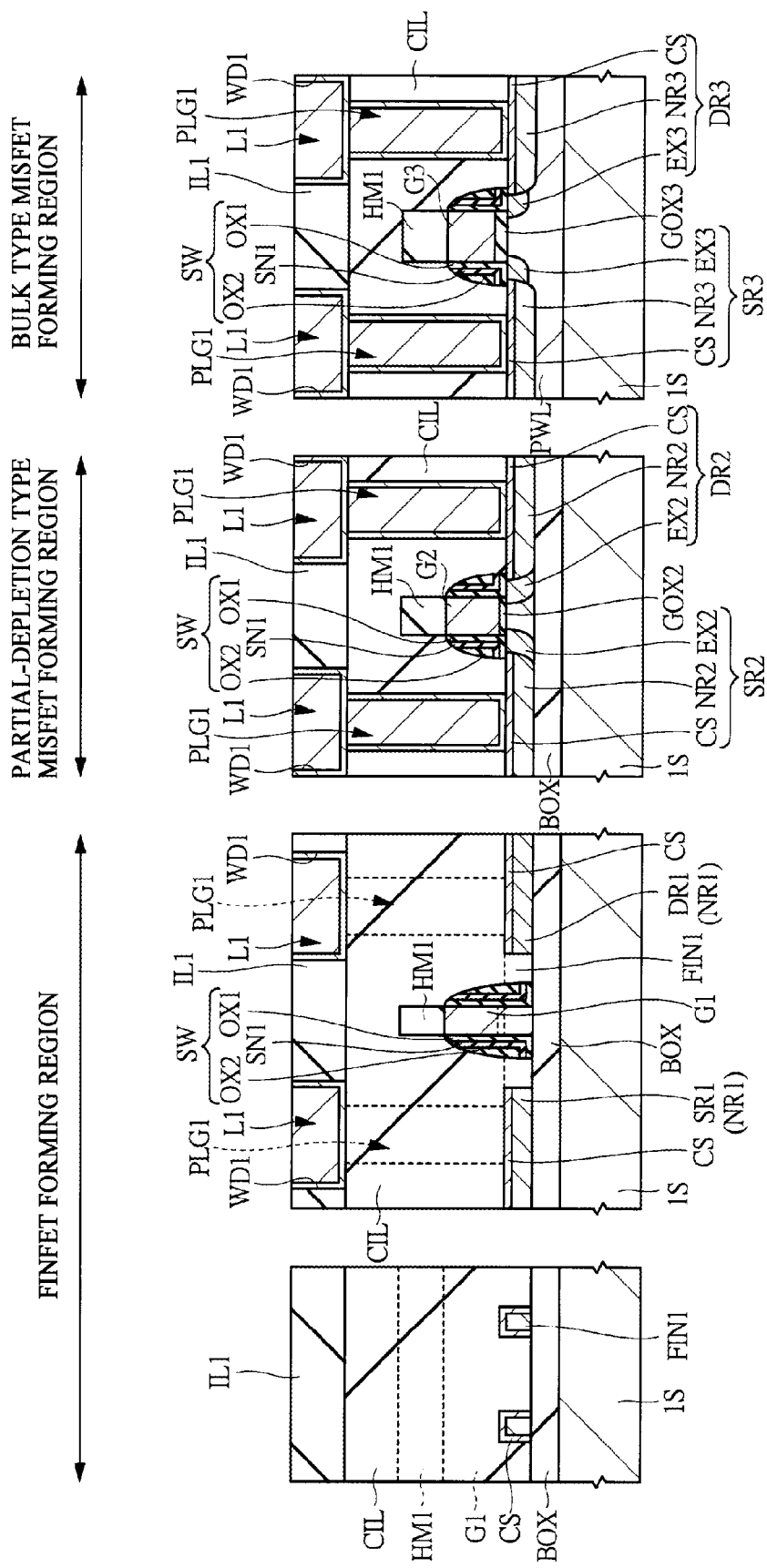
FIG. 31 is a cross-sectional view showing the process of manufacturing the semiconductor device subsequent to FIG. 30.

Subsequently, as shown in FIG. 31, the inter-contact layer insulating film CIL is formed over the semiconductor substrate (the substrate layer 1S) in which the FINFET, the partial-depletion type MISFET and the bulk type MISFET are formed. The inter-contact layer insulating film CIL is formed so as to cover the FINFET, the partial-depletion type MISFET and the bulk type MISFET. Specifically, the inter-contact layer insulating film CIL is formed from a laminated film including an ozone TEOS film formed by a thermal CVD method using ozone and TEOS as raw materials, and a plasma TEOS film formed by a plasma CVD method using TEOS as a raw material. Meanwhile, as the under layer of the ozone TEOS film, an etching stopper film constituted, for example, by a silicon nitride film may be formed.

The reason why the inter-contact layer insulating film CIL is formed from the TEOS film is that the TEOS film is a film having good covering properties for the step of a foundation. The foundation for forming the inter-contact layer insulating film CIL is in a state having an irregularity caused by the formation of the FINFET, the partial-depletion type MISFET and the bulk type MISFET over the semiconductor substrate (the substrate layer 1S). That is, since the FINFET, the partial-depletion type MISFET and the bulk type MISFET are formed over the semiconductor substrate (the substrate layer 1S), over the surface of the semiconductor substrate (the substrate layer 1S), the gate electrodes G1 to G3 are formed to be the foundation having an irregularity. Accordingly, if a film with a good covering property for a step having an irregularity is not used, it may not be buried in the minute irregularity to cause the occurrence of a void or the like. Hence, as the inter-contact layer insulating film CIL, the TEOS film is used. This is because it uses TEOS as a raw material, and this material forms an intermediate before the formation of a silicon oxide film and is movable easily at the surface of formed film to improve the covering property for the step of the foundation.

Next, by using the photolithographic technique and etching technique, a contact hole is formed in the inter-contact layer insulating film CIL. The contact hole is processed so as to pass through the inter-contact layer insulating film CIL and to reach the source region or the drain region of the FINFET, the partial-depletion type MISFET and the bulk type MISFET formed in the semiconductor substrate (the substrate layer 1S).

Subsequently, into the contact hole formed in the inter-contact layer insulating film CIL, a metal film is buried to form the plug PLG1. Specifically, over the inter-contact layer insulating film CIL in which the contact hole is formed a titanium/titanium nitride film (a titanium film and a titanium nitride film formed over the titanium film) to be a barrier conductor film is formed, for example, using sputtering. The titanium/titanium nitride film is provided in order to prevent the diffusion of tungsten constituting a tungsten film into silicon, that is, to prevent the damage of the inter-contact layer insulating film CIL or the semiconductor substrate (the substrate layer 1S) given by fluorine attack in a CVD method used for subjecting $WF_6$ (tungsten fluoride) to a reduction treatment when the tungsten film is to be constituted.

Then, over the titanium/titanium nitride film, a tungsten film is formed. This forms the titanium/titanium nitride film on the inner wall (the side wall and bottom surface) of the contact hole, and, over the titanium/titanium nitride film, the tungsten film is formed so as to be buried into the contact hole. After that, the unnecessary titanium/titanium nitride film and the tungsten film formed over the inter-contact layer insulating film CIL are removed by the CMP (Chemical Mechanical Polishing) method. This enables the formation of plug PLG1 constituted by burying the titanium/titanium nitride film and the tungsten film only into the contact hole.

Next, the process of forming a copper wiring using a single damascene method is explained. As shown in FIG. 31, over the inter-contact layer insulating film CIL in which the plug PLG1 is formed, the interlayer insulating film IL1 is formed. The interlayer insulating film IL1 is formed, for example, by a silicon oxide film, and the silicon oxide film may be formed, for example, by using the CVD method.

Then, by using the photolithographic technique and etching technique, a trench (a wiring trench) WD1 is formed in the interlayer insulating film IL1. The trench WD1 is formed so that it passes through the interlayer insulating film IL1 constituted by a silicon oxide film and the bottom surface thereof reaches the inter-contact layer insulating film CIL. This exposes the surface of the plug PLG1 at the bottom portion of the trench WD1.

After that, over the interlayer insulating film IL1 in which the trench WD1 is formed, the barrier conductor film is formed. Specifically, the barrier conductor film is constituted by tantalum (Ta), titanium (Ti), ruthenium (Ru), tungsten (W) or manganese (Mn), or a nitride or nitride silicide thereof, or a laminated film thereof, and may be formed, for example, by using the sputtering method. In other words, the barrier conductor film may be formed from either a metal material film constituted by any metal material of tantalum, titanium, ruthenium and manganese, or a compound film of the metal material and any element of Si, N, O and C.

Subsequently, over the barrier conductor film formed inside the trench WD1 and over the interlayer insulating film IL1, a seed film constituted, for example, by a thin copper film is formed by the sputtering method. Then, by an electrolytic plating method using the seed film as an electrode, a copper film is formed. The copper film is formed so as to be buried into the trench WD1. The copper film is formed, for example, from a film including copper as the main constituent. Specifically, it is formed from copper (Cu) or a copper alloy (an alloy of copper (Cu) with aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), lanthanoid-based metal, or actinoid-based metal).

Next, the unnecessary barrier conductor film and copper film formed over the interlayer insulating film IL1 are removed by the CMP method. This may form a wiring L1 constituted by burying the barrier conductor film and copper film into the trench WD1. As described above, the semiconductor device in Example 1 may be manufactured.

Example 2

In the Example 1, the example, in which the sidewall SW is formed from the laminated film including the silicon oxide film OX1, the silicon nitride film SN1 and the silicon oxide film OX2, is explained, but, in Example 2, an example, in which the sidewall SW is formed from the silicon nitride film, silicon oxide film and silicon nitride film, is explained.

Figure 32:
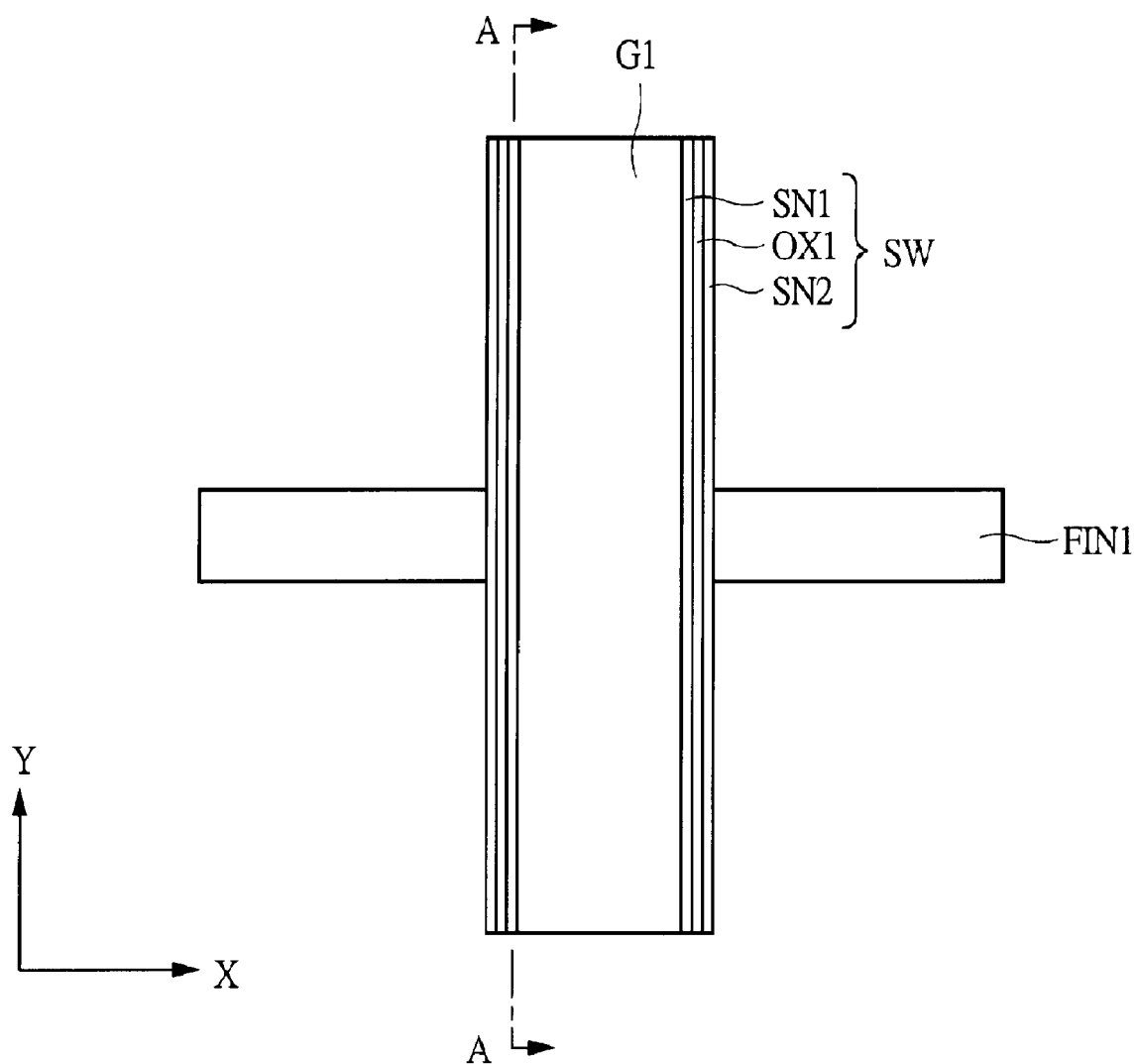
FIG. 32 is a drawing showing an outline constitution of a FINFET in Example 2.

FIG. 32 is a drawing showing the positional relation between the fin FIN1 and the gate electrode G1 constituting the FINFET. As shown in FIG. 32, the fin FIN1 extends in the X direction, but, on the other hand, the gate electrode G1 extends in the Y direction. In addition, the gate electrode G1 is disposed in a region intersecting the fin FIN1 so as to cross over the fin FIN1. On side walls on both sides of the gate electrode G1 extending in the Y direction, the sidewall SW is formed. In Example 2, the sidewall SW is constituted by the silicon nitride film SN1 formed over the side wall of the gate electrode G1, the silicon oxide film OX1 formed over the silicon nitride film SN1, and the silicon nitride film SN2 formed over the silicon oxide film OX1. As described above, in Example 2, too, the sidewall SW is constituted by the laminated film including the silicon nitride films SN1 and SN2 having different etching properties, and the silicon oxide film OX1, thus making it possible to form the sidewall SW on the side wall of the gate electrode G1, while not leaving the sidewall SW on the side wall of the fin FIN1. As the result, in Example 2, too, when the conductive impurity is implanted in a high concentration from the side wall of the fin FIN1, the sidewall SW does not work as an obstruction and the practice of the uniform and high concentration implantation of the impurity is made possible. Further, without the inhibition by the sidewall SW, a silicide film with low resistance may be formed over the surface of the fin FIN1. That is, according to the FINFET in Example 2, it is possible to achieve the improvement of the parasitic resistance at the side surface of the fin FIN1. The Example 2, in which the sidewall SW is formed from the silicon nitride film SN1, the silicon oxide film OX1 and the silicon nitride film SN2, may also give the same effect as that in Example 1, in which the sidewall SW is formed from the silicon oxide film OX1, the silicon nitride film SN1 and the silicon oxide film OX2.

Here, in the above Example 1, since the lowermost layer constituted by the silicon oxide film OX1 is formed under the intermediate layer constituted by the silicon nitride film SN1, there is such advantages as preventing the direct contact of the silicon nitride film SN1 to the active region represented by the fin FIN1, suppressing stress and damage caused by the silicon nitride film SN1, and preventing the lowering of transistor performances. That is, in Example 1, the active region is protected by having such a constitution as inhibiting the silicon nitride film SN1 from the direct contact to the active region.

In contrast, in Example 2, the silicon nitride film SN1 is used as the lowermost layer of the sidewall SW. Consequently, in Example 2, the silicon nitride film SN1 directly contacts the side wall of the gate electrode G1. As described above, Example 2 is characterized in that the silicon nitride film SN1 directly contacts the gate electrode G1.

In these years, as a technique for achieving high performances of MISFETs, there is a strained silicon technique. The strained silicon technique is a technique for improving the mobility of carriers (electrons or holes) flowing through the channel by giving stress caused by the strain to the channel forming region of MISFETs. The strained silicon technique may improve the mobility of carries flowing through the channel to actualize high performances of MISFETs.

In the strained silicon technique, the stress is generated for the gate electrode G1, wherein the aforementioned silicon nitride film SN1 has the function of generating the stress. That is, the difference between the lattice spacing of the silicon nitride film SN1 and that of the silicon constituting the gate electrode G1 generates strain, and the strain generates the stress for the fin FIN1 (a channel forming region) arranged so as to cross over the gate electrode G1.

Figure 33:
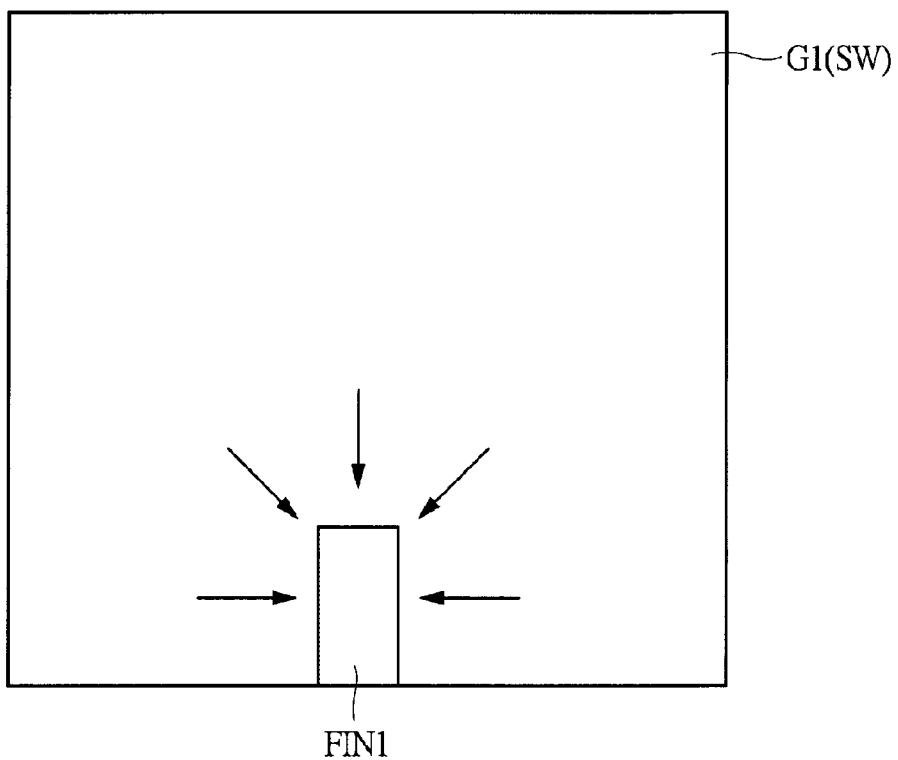
FIG. 33 is a cross-sectional view cut along the A-A line in FIG. 32.

FIG. 33 is a cross-sectional view cut along the A-A line in FIG. 32, which shows the appearance when the stress is applied to the fin FIN1. As shown in FIG. 33, when the silicon nitride film directly contacts the gate electrode G1, the strain generates at the interface between the silicon nitride film and silicon based on the difference between the lattice spacing of the silicon nitride film and that of the silicon to generate the stress caused by the strain. Consequently, to the fin FIN1 covered by the gate electrode G1, the stress, for example, in the direction shown by an arrow in FIG. 33 is applied. Since the side surface and the upper surface of the fin FIN1 covered by the gate electrode G1 function as the channel region, the stress generated in the gate electrode G1 gives the strain to the channel region. Consequently, the channel region is strained to improve the mobility of carriers (electrons or holes) passing through the channel region. As the result, according to Example 2, it is possible to achieve the improvement of the density of the current flowing through the channel region.

Example 3

In the above Example 1, as shown in FIGS. 27 to 29, after removing the silicon oxide film OX1 formed in the lowermost layer and forming the sidewall SW, the high concentration n-type impurity diffusion regions NR1 and NR2, and the deep n-type impurity diffusion region NR3 are formed. That is, after removing the silicon oxide film OX1, the ion implantation method is practiced to form the high concentration n-type impurity diffusion regions NR1 and NR2, and the deep n-type impurity diffusion region NR3.

In contrast, in Example 3, an example, in which the silicon oxide film OX1 formed in the lowermost layer is left and the ion implantation method is practiced to form the high concentration n-type impurity diffusion regions NR1 and NR2, and the deep n-type impurity diffusion region NR3, is explained.

As shown in FIG. 27, the silicon oxide film OX1 in the lowermost layer constituting the sidewall SW is not removed but left. After that, via the left silicon oxide film OX1, the ion implantation method is practiced. Consequently, an impurity implanted by the ion implantation method is implanted via the silicon oxide film OX1. After that, the silicon oxide film OX1 is removed. The silicon oxide film OX1 formed in the lowermost layer has a thickness of, for example, around 10 nm, which is a thin film. Accordingly, the silicon oxide film OX1 may be used as a through oxidation film when the impurity is implanted by the ion implantation method. The Example 3 is characterized in that the sidewall SW is constituted by the laminated film including the silicon oxide film OX1, the silicon nitride film SN1 and the silicon oxide film OX2, and that the silicon oxide film OX1 formed in the lowermost layer is used also as the through oxidation film.

Example 4

In the above Example 1, the FINFET of the tri-gate structure, which uses both side surfaces and the upper surface of the fin FIN1 as the channel region, is explained, but the technical idea of the present invention may be applied not only to the FINFET of the tri-gate structure, but also to, for example, the FINFET of a double gate structure. The FINFET of the double gate structure is a FINFET of a type in which both side surfaces of the fin FIN1 are used as the channel region but the upper surface of the fin FIN1 is not used as the channel region.

The FINFET of the double gate structure also may have such a characteristic constitution that the sidewall SW is formed on the side wall of the gate electrode G1 in the FINFET forming region, but that the sidewall SW formed on the side wall of the fin FIN1 is removed. This makes it possible, also in the FINFET of the double gate structure, to practice the uniform and high concentration implantation of an impurity, because the sidewall SW does not works as an obstacle when the conductive impurity is implanted in a high concentration from the side wall of the fin FIN1. Further, without the inhibition by the sidewall SW, the silicide film having a low resistance may be formed over the surface of the fin FIN1. As the result, according to the FINFET in Example 4, the improvement of the parasitic resistance at the side surface of the fin FIN1 may be achieved.

In the FINFET of the double gate structure, too, the sidewall SW of the three-layer structure described in Example 1 may be used in order to actualize such a characteristic constitution as forming the sidewall SW on the side wall of the gate electrode G1 and removing the sidewall SW formed on the side wall of the fin FIN1. That is, in the FINFET of the double gate structure in Example 4, too, the characteristic constitution of the present invention may be actualized by going through the similar manufacturing process as that in Example 1.

Furthermore, in the FINFET of the double gate structure in Example 4, since the upper surface of the fin FIN1 is not used as the channel region, a hard mask working as a protective film may be formed over the fin FIN1. As the result, even in a method of forming a single layer sidewall, it becomes possible to form the sidewall SW on the side wall of the gate electrode G1, and not to leave the sidewall SW on the side wall of the fin FIN1, while protecting the fin FIN1. Hereinafter, the manufacturing method is simply explained with reference to the drawings.

Figure 34:
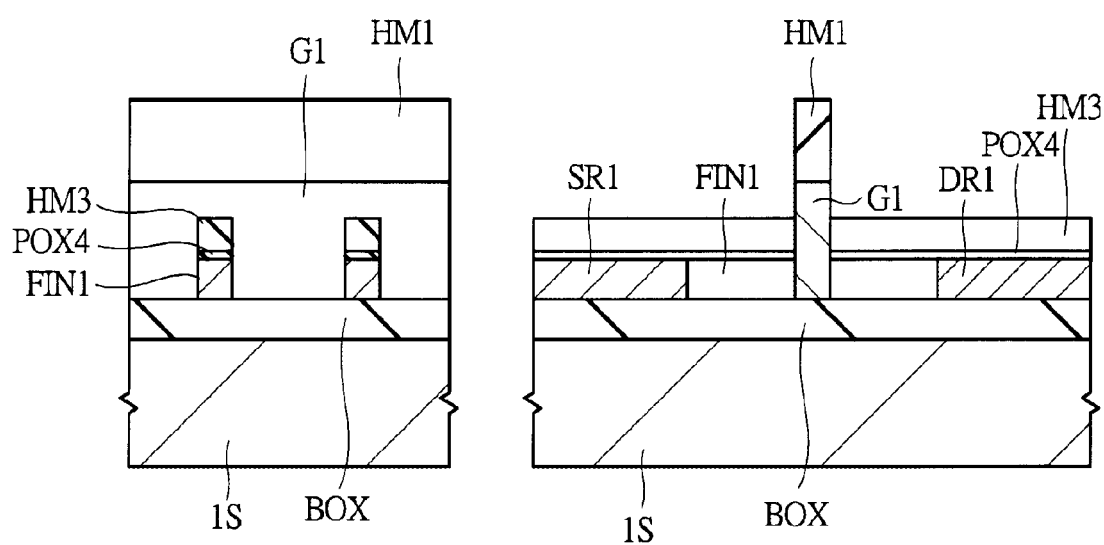
FIG. 34 is a cross-sectional view showing the process of manufacturing a FINFET in Example 4.

As shown in FIG. 34, in the same manner as that in Example 1, the fin FIN1 in a rectangular parallelepiped shape is formed over the buried insulating layer BOX, and, after that, the gate electrode G1 is formed so as to cross over the fin FIN1. At this time, in Example 4, since the upper surface of the fin FIN1 is not used as the channel region, the pad oxide film POX4 is formed over the fin FIN1, and, over the pad oxide film POX4, a hard mask HM3 is formed. The pad oxide film POX4 is formed, for example, from a silicon oxide film, and the hard mask HM3 is formed, for example, from a silicon nitride film.

Figure 35:
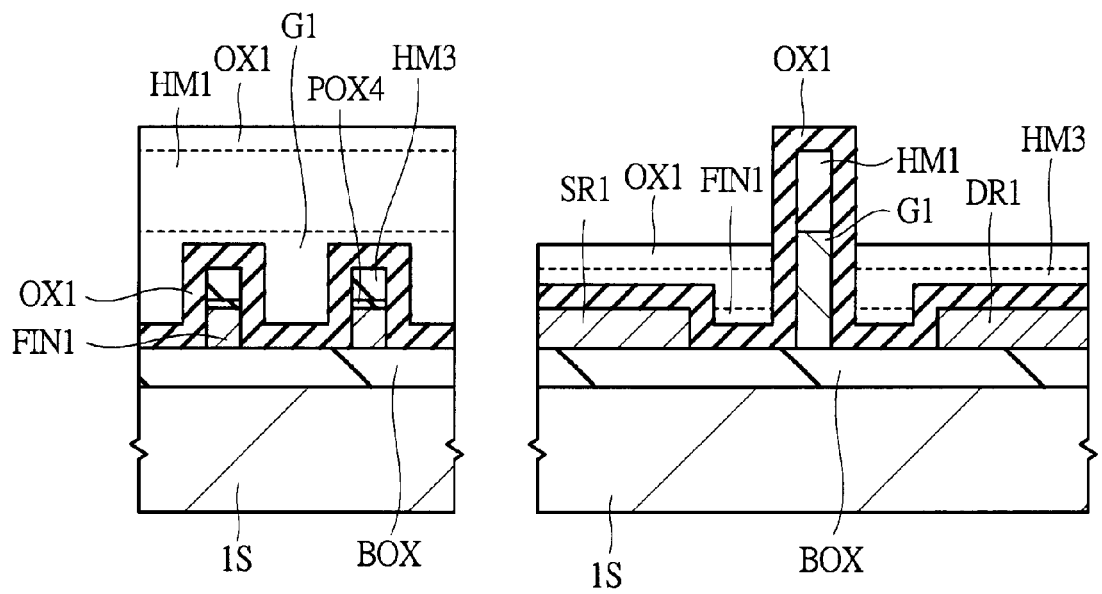
FIG. 35 is a cross-sectional view showing the process of manufacturing the FINFET subsequent to FIG. 34.

Next, as shown in FIG. 35, the silicon oxide film OX1 is formed over the whole main surface of the SOI substrate. Consequently, the fin FIN1 and the gate electrode G1 are covered by the silicon oxide film OX1.

Figure 36:
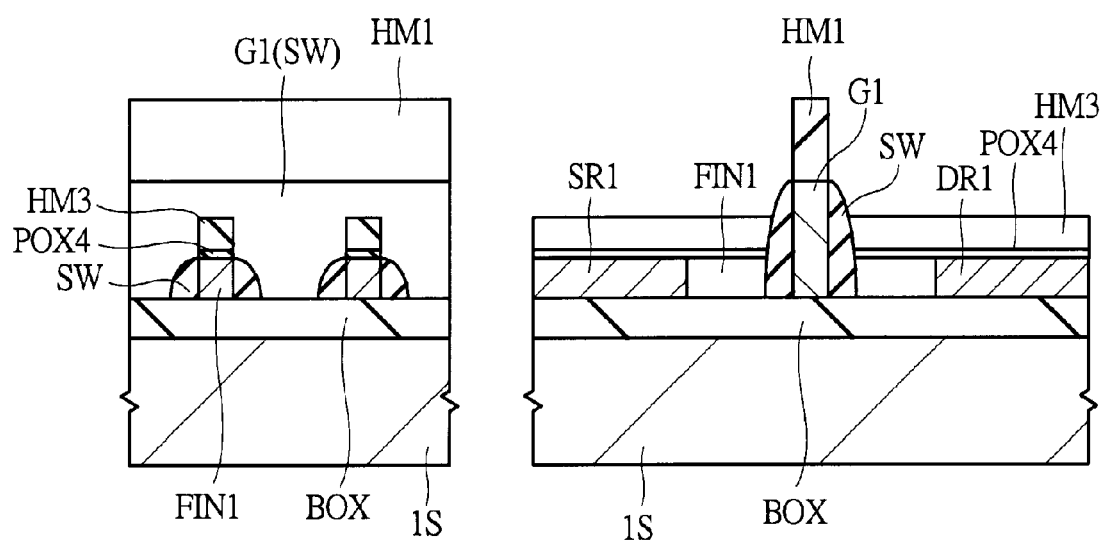
FIG. 36 is a cross-sectional view showing the process of manufacturing the FINFET subsequent to FIG. 35.
Figure 37:
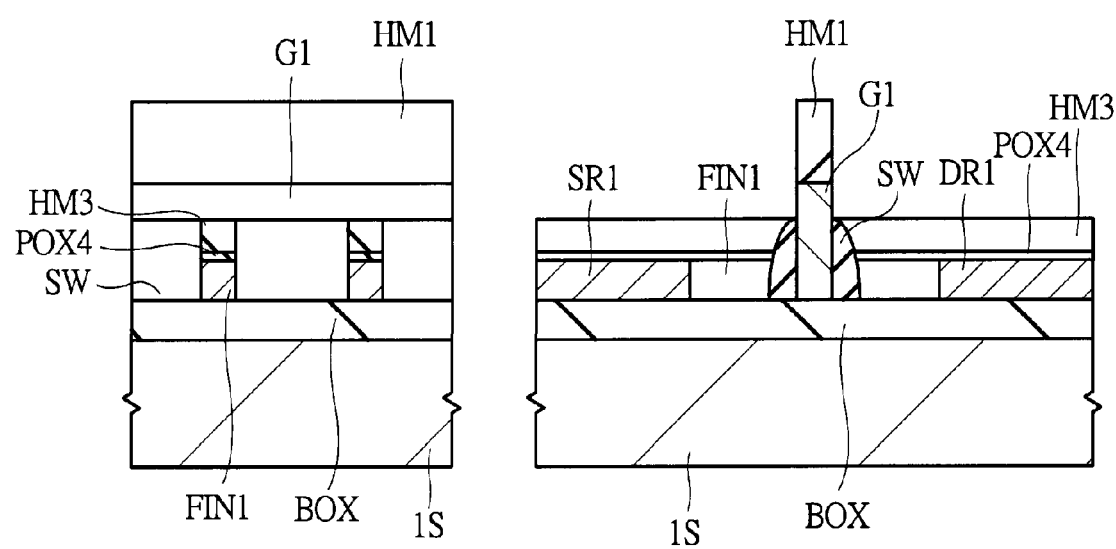
FIG. 37 is a cross-sectional view showing the process of manufacturing the FINFET subsequent to FIG. 36.

Subsequently, as shown in FIG. 36, the silicon oxide film OX1 is subjected to anisotropic etching (dry etching). This forms the sidewall SW on the side wall of the fin FIN1 and the side wall of the gate electrode G1. After that, further, as shown in FIG. 37, the over-etching of the silicon oxide film OX1 is performed. This removes the silicon oxide film OX1 formed on the side wall of the fin FIN1.

Here, in Example 4, the hard mask HM3 is formed at the upper portion of the fin FIN1. Hence, the hard mask HM3 works as the protective film when the silicon oxide film OX1 is over-etched. Accordingly, even when the over-etching of the silicon oxide film OX1 is performed, the fin FIN1 is protected by the hard mask HM3 and is not etched. That is, in Example 4, since the upper surface of the fin FIN1 is not used as the channel region, the hard mask HM3 may be formed over the fin FIN1, and the hard mask HM3 protects the fin FIN1 from the over-etching. Consequently, in the FINFET of the double gate structure as in Example 4, it is possible to form the sidewall SW on the side wall of the gate electrode G1, and not to leave the sidewall SW on the side wall of the fin FIN1, without the disappearance of the fin FIN1 even when the sidewall SW constituted by a single layer film is formed.

As above, the invention achieved by the present inventor is specifically explained based on Examples thereof, but the present invention is not limited to these Examples. Needless to say, it may be variously changeable within the range that does not depart from the gist thereof.

The present invention may be widely utilized in manufacturing industries that manufacture semiconductor devices.

What is claimed is:

1. A method of manufacturing a semiconductor device, comprising the steps of:
   (a) preparing an SOI substrate including a substrate layer, a buried insulating layer formed over the substrate layer and a semiconductor layer formed over the buried insulating layer; and
   (b) forming a first MISFET in a first region of the SOI substrate, wherein the step (b) includes the steps of:
      (b1) forming a fin in a rectangular parallelepiped shape with the long side in a first direction, a first source region connected to one end of the fin, and a first drain region connected to the other end of the fin by processing the semiconductor layer of the SOI substrate;
      (b2) forming a first gate insulating film over the surface of the fin;
      (b3) forming a first conductor film covering the fin, over the SOI substrate in which the fin is formed;
      (b4) forming a hard mask film over the first conductor film;
      (b5) patterning the hard mask film;
      (b6) forming a first gate electrode disposed so as to cross over the surface of the fin is the first gate insulating film in a region that extends in a second direction intersecting the first direction and intersects the fin by processing the first conductor film using the patterned hard mask film as a mask;
      (b7) introducing conductive impurities into the fin exposed from the first gate electrode, the first source region and the second drain region;
      (b8) after the step (b7), forming a first insulating film over the SOI substrate;
      (b9) forming a second insulating film over the first insulating film;
      (b10) forming a third insulating film over the second insulating film;
      (b11) removing the third insulating film formed on the side wall of the fin while leaving the third insulating film on the side wall of the first gate electrode by subjecting the third insulating film to anisotropic etching up to the removal of the third insulating film formed on the side wall of the fin;
      (b12) removing the second insulating film formed on the side wall of the fin while leaving the third insulating film and the second insulating film on the side wall of the first gate electrode by etching the second insulating film using the remaining third insulating film as a mask;
      (b13) removing the first insulating film formed on the side wall of the fin while leaving the first insulating film, the second insulating film and the third insulating film on the side wall of the first gate electrode to form a sidewall including the first insulating film, the second insulating film and the third insulating film by etching the first insulating film using the remaining third insulating film and second insulating film as a mask; and
      (b14) introducing conductive impurities into the fin exposed from the sidewall, the first source region and the first drain region.

2. The method of manufacturing a semiconductor device according to claim 1, wherein
   the etching performed in the step (b11) is dry etching that is anisotropic etching, the etching performed in the step (b12) is dry etching or wet etching, and the etching performed in the step (b13) is wet etching that is isotropic etching.

3. The method of manufacturing a semiconductor device according to claim 1, wherein
   the first insulating film is a silicon oxide film, the second insulating film is a silicon nitride film, and the third insulating film is a silicon oxide film.

4. The method of manufacturing a semiconductor device according to claim 1, wherein
   the first insulating film is a silicon nitride film, the second insulating film is a silicon oxide film, and the third insulating film is a silicon nitride film.

5. The method of manufacturing a semiconductor device according to claim 1, further comprising the step of
   after the step (b14), forming a silicide film over the surface of the fin exposed from the sidewall, the surface of the first source region and the surface of the second drain region.

6. The method of manufacturing a semiconductor device according to claim 1, further comprising the step of
   after the step (b6), flattening the upper surface of the first gate electrode by a chemical mechanical polishing method.

7. The method of manufacturing a semiconductor device according to claim 1, wherein
   the hard mask film formed in the step (b4) is a multilayer film.

8. The method of manufacturing a semiconductor device according to claim 7, wherein
   the semiconductor layer of the SOI substrate is a silicon layer, the first conductor film is a first polysilicon film, and the hard mask film is formed of a silicon oxide film and a second polysilicon film formed over the silicon oxide film, and wherein
   the step (b6) forms the first gate electrode disposed so as to cross over the surface of the fin via the first gate insulating film in a region that extends in a second direction intersecting the first direction and intersects the fin by processing the first conductor film up to the removal of the second polysilicon film and the exposure of the surface of the fin using the patterned second polysilicon film as a mask, and then further processing the first conductor film using the patterned silicon oxide film as a mask.

9. The method of manufacturing a semiconductor device according to claim 7, wherein
   the semiconductor layer of the SOI substrate is a silicon layer, the first conductor film is a first polysilicon film, the hard mask film is formed of a silicon oxide film and a first amorphous silicon film that is formed over the silicon oxide film and added with fluorine, and wherein
   the step (b6) forms the first gate electrode disposed so as to cross over the surface of the fin via the first gate insulating film in a region that extends in a second direction intersecting the first direction and intersects the fin by processing the first conductor film up to the removal of the first amorphous silicon film and the exposure of the surface of the fin using the patterned first amorphous silicon film as a mask, and then further processing the first conductor film using the patterned silicon oxide film as a mask.

10. A method of manufacturing a semiconductor device, comprising the steps of:

(a) preparing an SOI substrate including a substrate layer, a buried insulating layer formed over the substrate layer, and a semiconductor layer formed over the buried insulating layer; and (b) forming a first MISFET in a first region of the SOI substrate, forming a second MISFET in a second region of the SOI substrate, and forming a third MISFET in a third region of the SOI substrate, wherein the step (b) includes the steps of:

(b1) exposing the substrate layer in the third region by removing the semiconductor layer and the buried insulating layer formed in the third region of the SOI substrate;

(b2) forming an epitaxial layer over the substrate layer exposed in the third region to make the surface of the semiconductor layer in the first region, the surface of the semiconductor layer in the second region, and the surface of the epitaxial layer in the third region uniform;

(b3) forming a fin in a rectangular parallelepiped shape with the long side in a first direction, forming a first source region connected to one end of the fin, and forming a first drain region connected to the other end of the fin by processing the semiconductor layer formed in the first region of the SOI substrate;

(b4) forming a first gate insulating film over the surface of the fin in the first region, forming a second gate insulating film over the semiconductor layer in the second region, and forming a third gate insulating film over the substrate layer in the third region;

(b5) forming a first conductor film covering the first region, the second region and the third region;

(b6) forming a hard mask film over the first conductor film;

(b7) patterning the hard mask film;

(b8) forming a first gate electrode disposed so as to cross over the surface of the fin via the first gate insulating film in a region that extends in a second direction intersecting the first direction and intersects the fin in the first region, forming a second gate electrode over the second gate insulating film in the second region, and forming a third gate electrode over the third gate insulating film in the third region by processing the first conductor film using the patterned hard mask film as a mask;

(b9) introducing conductive impurities into the fin exposed from the first gate electrode, the first source region and the first drain region in the first region, introducing conductive impurities into the semiconductor layer while aligning with the second gate electrode in the second region, and introducing conductive impurities into the substrate layer while aligning with the third gate electrode in the third region;

(b10) after the step (b9), forming a first insulating film over the SOI substrate;

(b11) forming a second insulating film over the first insulating film;

(b12) forming a third insulating film over the second insulating film;

(b13) removing the third insulating film formed on the side wall of the fin while leaving the third insulating film on the side wall of the first gate electrode, the side wall of the second gate electrode and the side wall of the third gate electrode by subjecting the third insulating film to anisotropic etching up to the removal of the third insulating film formed on the side wall of the fin;

(b14) removing the second insulating film formed on the side wall of the fin while leaving the third insulating film and the second insulating film on the side wall of the first gate electrode, the side wall of the second gate electrode and the side wall of the third gate electrode by etching the second insulating film using the remaining third insulating film as a mask;

(b15) forming a sidewall formed of the first insulating film, the second insulating film and the third insulating film on the side wall of the first gate electrode, the side wall of the second gate electrode and the side wall of the third gate electrode, respectively, and removing, at the same time, the first insulating film formed on the side wall of the fin, by etching the first insulating film using the remaining second insulating film and third insulating film as a mask to leave the first insulating film, the second insulating film and the third insulating film;

(b16) introducing conductive impurities into the fin exposed from the sidewall formed on the side wall of the first gate electrode, the first source region and the first drain region in the first region;

(b17) forming a second source region and a second drain region by introducing conductive impurities into the semiconductor layer aligned with the sidewall formed on the side wall of the second gate electrode in the second region; and (b18) forming a third source region and a third drain region by introducing conductive impurities into the substrate layer aligned with the sidewall formed on the side wall of the third gate electrode in the third region.

11. A method of manufacturing a semiconductor device, comprising the steps of:

(a) preparing an SOI substrate including a substrate layer, a buried insulating layer formed over the substrate layer, a semiconductor layer formed over the buried insulating layer; and (b) forming a first MISFET in a first region of the SOI substrate, wherein the step (b) includes the steps of:

(b1) forming a fin in a rectangular parallelepiped shape with the long side in a first direction, a first source region connected to one end of the fin, and a first drain region connected to the other end of the fin by processing the semiconductor layer of the SOI substrate;

(b2) forming a first gate insulating film over the surface of the fin;

(b3) forming a first conductor film covering the fin over the SOI substrate in which the fin is formed;

(b4) forming a hard mask film over the first conductor film;

(b5) patterning the hard mask film;

(b6) forming a first gate electrode disposed so as to cross over the surface of the fin via the first gate insulating film in a region that extends in a second direction intersecting the first direction and intersects the fin by processing the first conductor film using the patterned hard mask film as a mask;

(b7) introducing conductive impurities into the fin exposed from the first gate electrode, the first source region and the second drain region;

(b8) after the step (b7), forming a first insulating film over the SOI substrate;

(b9) forming a second insulating film over the first insulating film;

(b10) forming a third insulating film over the second insulating film;

(b11) removing the third insulating film formed on the side wall of the fin while leaving the third insulating film on the side wall of the first gate electrode by subjecting the third insulating film to anisotropic etching up to the removal of the third insulating film formed on the side wall of the fin;

(b12) removing the second insulating film formed on the side wall of the fin while leaving the third insulating film and the second insulating film on the side wall of the first gate electrode by etching the second insulating film using the remaining third insulating film as a mask;

(b13) forming a sidewall formed of the first insulating film, the second insulating film and the third insulating film on the side wall of the first gate electrode and maintaining the state of covering the surface of the fin with the first insulating film by totally leaving the first insulating film formed in the step (b8); and (b14) introducing conductive impurities, via the first insulating film, into the fin not covered with the sidewall, the first source region and the first drain region.

12. A semiconductor device comprising a first MISFET formed in a first region of a semiconductor chip, the first MISFET including:

(a) an SOI substrate including a substrate layer, a buried insulating layer formed over the substrate layer, and a semiconductor layer formed over the buried insulating layer;

(b) a fin that is formed by processing the semiconductor layer and has a rectangular parallelepiped shape with the long side in a first direction;

(c) a first source region formed by processing the semiconductor layer so as to be connected to one end of the fin;

(d) a first drain region formed by processing the semiconductor layer so as to be connected to the other end of the fin;

(e) a first gate insulating film formed over the surface of the fin; and (f) a first gate electrode formed so as to cross over the surface of the fin via the first gate insulating film in a region that extends in a second direction intersecting the first direction and intersects the fin, wherein a sidewall is formed on the side wall of the first gate electrode but the sidewall is not formed on the side wall of the fin, the sidewall formed on the side wall of the first gate electrode is formed of a laminated film, and the laminated film is formed of a first silicon oxide film, a silicon nitride film formed over the first silicon oxide film, and a second silicon oxide film formed over the silicon nitride film.

13. The semiconductor device according to claim 12, wherein a first insulating film is formed over the first gate electrode.

14. The semiconductor device according to claim 13, wherein the height of the first insulating film is greater than that of the fin.

15. A semiconductor device comprising a first MISFET formed in a first region of a semiconductor chip, the first MISFET including:

(a) an SOI substrate including a substrate layer, a buried insulating layer formed over the substrate layer, and a semiconductor layer formed over the buried insulating layer;

(b) a fin that is formed by processing the semiconductor layer and has a rectangular parallelepiped shape with the long side in a first direction;

(c) a first source region formed by processing the semiconductor layer so as to be connected to one end of the fin;

(d) a first drain region formed by processing the semiconductor layer so as to be connected to the other end of the fin;

(e) a first gate insulating film formed over the surface of the fin; and (f) a first gate electrode formed so as to cross over the surface of the fin via the first gate insulating film in a region that extends in a second direction intersecting the first direction and intersects the fin, wherein a sidewall is formed on the side wall of the first gate electrode but the sidewall is not formed on the side wall of the fin, the sidewall formed on the side wall of the first gate electrode is formed of a laminated film, and the laminated film is formed of a first silicon nitride film, a silicon oxide film formed over the first silicon nitride film, and a second silicon nitride film formed over the silicon oxide film.

16. The semiconductor device according to claim 15, wherein a first insulating film is formed over the first gate electrode.

17. The semiconductor device according to claim 16, wherein the height of the first insulating film is greater than that of the fin.

18. A semiconductor device comprising a first MISFET formed in a first region of a semiconductor chip, the first MISFET including:

(a) an SOI substrate including a substrate layer, a buried insulating layer formed over the substrate layer, and a semiconductor layer formed over the buried insulating layer;

(b) a fin that is formed by processing the semiconductor layer and has a rectangular parallelepiped shape with the long side in a first direction;

(c) a first source region formed by processing the semiconductor layer so as to be connected to one end of the fin;

(d) a first drain region formed by processing the semiconductor layer so as to be connected to the other end of the fin;

(e) a first gate insulating film formed over the surface of the fin; and (f) a first gate electrode formed so as to cross over the surface of the fin via the first gate insulating film in a region that extends in a second direction intersecting the first direction and intersects the fin, wherein a sidewall is formed on the side wall of the first gate electrode but the sidewall is not formed on the side wall of the fin;

a second MISFET formed in a second region of the semiconductor chip and a third MISFET formed in a third region of the semiconductor chip, wherein the second MISFET includes:

(g) the SOI substrate including the substrate layer, the buried insulating layer formed over the substrate layer and the semiconductor layer formed over the buried insulating layer;

(h) a second gate insulating film formed over the semiconductor layer of the SOI substrate;

(i) a second gate electrode formed over the second gate insulating film;

(j) a second source region formed in the semiconductor layer; and
(k) a second drain region formed in the semiconductor layer, and wherein the third MISFET includes:
(l) the substrate layer exposed by removing the semiconductor layer and the buried insulating layer;
(m) a third gate insulating film formed over the substrate layer;
(n) a third gate electrode formed over the third gate insulating film;
(o) a third source region formed in the substrate layer; and
(p) a third drain region formed in the substrate layer.

19. The semiconductor device according to claim 18, wherein
the sidewall is formed also on the side wall of the second gate electrode and the side wall of the third gate electrode.

20. The semiconductor device according to claim 18, wherein
the thickness of the second gate insulating film is thinner than that of the third gate insulating film, and the gate length of the second gate electrode is shorter than that of the third gate electrode.

21. The semiconductor device according to claim 20, wherein
the first MISFET is used for an SRAM, the second MISFET is used for a logic circuit, and the third MISFET is used for an input/output circuit.

* * * * *